(12) United States Patent
Bulucea et al.

(10) Patent No.: US 7,595,243 B1
(45) Date of Patent: Sep. 29, 2009

(54) FABRICATION OF SEMICONDUCTOR STRUCTURE HAVING N-CHANNEL CHANNEL-JUNCTION FIELD-EFFECT TRANSISTOR

(75) Inventors: Constantin Bulucea, Milpitas, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 139 days.

(21) Appl. No.: 11/495,225

(22) Filed: Jul. 28, 2006

Related U.S. Application Data

(62) Division of application No. 10/803,203, filed on Mar. 17, 2004, now Pat. No. 7,176,530.

(51) Int. Cl.
*H01L 21/8236* (2006.01)

(52) U.S. Cl. .............. 438/276; 438/200; 438/282; 438/289; 257/E21.618; 257/E21.633

(58) Field of Classification Search ............ 438/276, 438/200, 282, 289, FOR. 187, FOR. 191; 257/E21.618, E21.633
See application file for complete search history.

(56) References Cited

U.S. PATENT DOCUMENTS

| | | | |
|---|---|---|---|
| 3,886,003 A | 5/1975 | Takagi et al. | |
| 4,315,781 A | 2/1982 | Henderson | |
| 5,047,358 A | 9/1991 | Kosiak et al. | |
| 5,536,962 A * | 7/1996 | Pfiester | 257/392 |
| 5,672,521 A | 9/1997 | Barsan et al. | |
| 5,682,051 A | 10/1997 | Harrington, III | |
| 5,942,780 A | 8/1999 | Barsan et al. | |
| 5,952,701 A * | 9/1999 | Bulucea et al. | 257/407 |
| 6,051,482 A | 4/2000 | Yang | |
| 6,100,568 A | 8/2000 | Lage | |

(Continued)

FOREIGN PATENT DOCUMENTS

EP    298421 A2    5/1988

(Continued)

OTHER PUBLICATIONS

Parillo, L.C., et al., "A Fine-Line CMOS Technology That Uses P+—Polysilicon/Silicide Gates for NMOS and PMOS Devies", IEDM 15.6, 1984, pp. 418-422.*

(Continued)

*Primary Examiner*—George Fourson
(74) *Attorney, Agent, or Firm*—Ronald J. Meetin

(57) ABSTRACT

A semiconductor technology combines a normally off n-channel channel-junction insulated-gate field-effect transistor ("IGFET") (104) and an n-channel surface-channel IGFET (100 or 160) to reduce low-frequency 1/f noise. The channel-junction IGFET is normally fabricated to be of materially greater gate dielectric thickness than the surface-channel IGFET so as to operate across a greater voltage range than the surface-channel IGFET. A p-channel surface-channel IGFET (102 or 162), which is typically fabricated to be of approximately the same gate-dielectric thickness as the n-channel surface-channel IGFET, is preferably combined with the two n-channel IGFETs to produce a complementary-IGFET structure. A further p-channel IGFET (106, 180, 184, or 192), which is typically fabricated to be of approximately the same gate dielectric thickness as the n-channel channel-junction IGFET, is also preferably included. The further p-channel IGFET can be a surface-channel or channel-junction device.

66 Claims, 26 Drawing Sheets

U.S. PATENT DOCUMENTS

| | | | |
|---|---|---|---|
| 6,194,293 | B1 | 2/2001 | Krivokapic |
| 6,207,999 | B1 | 3/2001 | Wu |
| 6,359,319 | B1 | 3/2002 | Noda |
| 6,548,842 | B1 | 4/2003 | Bulucea et al. |
| 6,576,966 | B1 | 6/2003 | Bulucea |
| 6,621,125 | B1 * | 9/2003 | Wang .................... 257/355 |
| 6,762,469 | B2 * | 7/2004 | Mocuta et al. ............. 257/407 |
| 6,916,698 | B2 | 7/2005 | Mocuta et al. |
| 7,176,530 | B1 * | 2/2007 | Bulucea et al. ............ 257/369 |

OTHER PUBLICATIONS

Brown, "Trends in Advanced Process Technology-Submicrometer CMOS Device Design and Process Requirements", *Proc. IEEE*, Dec. 1986, pp. 1678-1702.

Bulucea et al., "Threshold Voltage Control in Burried-Channel MOSFETs", *Solid-State Electronics*, vol. 41, No. 9, 1997, pp. 1345-1354.

Chaparala et al., "NBTI in Dual Gate Oxide PMOSFETs", 2003 8th Int'l Symp. on Plasma- and Process-Induced Damage, Apr. 24 and 25, 2003, pp. 138-141.

El-Kareh, *Fundamentals of Semiconductor Processing Technologies* (Kluwer Acad. Pubs.), 1995, pp. 445-466.

Faggin et al., "Silicon Gate Technology", *Solid-State Electronics*, vol. 13, 1970, pp. 1125-1144.

Hillenius et al., "Gate Material Work Function Considerations For 0.5 Micron CMOS", *Procs. IEEE Int'l Conf. Computer Design: VLSI in Computers*, Oct. 7-10, 1985, pp. 147-150.

Hu et al., "Design and Fabrication of P-channel FET for 1-μm CMOS Technology," *IEDM Tech. Dig.*, Dec. 11-15, 1982, pp. 710-713.

King et al., "A Polycrystalline-$Si_{1-x}Ge_x$-Gate CMOS Technology", *IEDM Tech. Dig.*, Dec. 9-12, 1990, pp. 253-256.

Lee et al., "Gate Oxide Thinning Effects at the Edge of Shallow Trench Isolation in the Dual Gate Oxide Process", 6th Int'l Conf. VLSI and CAD, Oct. 26 and 27, 1999, pp. 249-352.

Liu et al., "Multiple Gate Oxide Thickness of 2GHz System-on-A-Chip Technologies", *IEDM Tech. Dig.*, Dec. 6-9, 1998, pp. 589-592.

Meyer et al., "Integrable High Voltage CMOS: Devices, Process Application", *IEDM Tech. Dig.*, Dec. 1-4, 1985, pp. 732-735.

Montree et al., "Comparison of burried and surface channel PMOS devices for low voltage 0.5 μm CMOS", *1993 Int'l Symp. VLSI Tech., Systems, and Appl'ns, Procs. Tech. Paps.*, May 12-14, 1993, pp. 11-14.

Murthy et al., "Threshold-Voltage Anomaly in Sub-0.2μm DRAM Buried-Channel pFET Devices", *2001 Int'l Symp. VLSI Tech., Systems, and Appl'ns, Procs. Tech. Paps.*, Apr. 18-20, 2001, pp. 19-22.

Nakahara et al., "Relief of hot carrier constraint on submicron CMOS devices by use of a buried channel structure", *IEDM Tech. Dig.*, Dec. 1-4, 1985, pp. 238-241.

Nguyen et al, "A Comparison of Buried Channel and Surface Channel MOSFETs for VLSI", *IEEE Trans. Elect. Devs.*, Oct. 1982, pp. 1663 and 1664.

Nishida et al., "SoC CMOS Technology for NBTI/HCI Immune I/O and Analog Circuits Implementing Surface and Buried Channel Structures", *IEDM Tech. Dig.*, Dec. 2-5, 2001, pp. 39.4.1-39.4.4.

Nishiuchi et al., "A Normally-off Type Buried Channel MOSFET for VLSI Circuits", *IEDM Tech. Dig.*, Dec. 1978, pp. 26-29.

O et al., "Integration of Two Different Gate Oxide Thicknesses in 0.6-μm Dual Voltage Mixed Signal CMOS Process", *IEEE Trans. Elec. Devs.*, Jan. 1995, pp. 190-192.

Ohguro et al., "A study of analog characteristics of CMOS with heavily nitrided NO oxynitrides", *2001 Symp. VLSI Techn., Dig. Tech. Paps.*, 2001, 2 pp.

Park et al., "Body Bias Dependence of 1/f Noise in NMOS Transistors from Deep-Subthreshold to Strong Inversion", *IEEE Trans Elec. Devs.*, May 2001, pp. 999-1001.

Parillo et al., "A Fine-Line CMOS Technology That Uses$P^+$—Polysilicon/Silicide Gates For NMOS and PMOS Devices," *IEDM Tech. Dig.*, Dec. 1984, pp. 418-422.

Parillo et al., "Twin-Tub CMOS—A Technology for VLSI Circuits", *IEDM Tech. Dig.*, Dec. 8-10, 1980, pp. 752-755.

Stolk et al., "CMOS Device Optimization for Mixed-Signal Technologies", *IEDM Tech. Dig.*, Dec. 2-5, 2001, 4 pp.

Yeap et al., "A 180nm Copper/Low-k CMOS Technology with Dual Gate Oxide Optimized for Low Power and Low Cost Consumer Wireless Applications", *2000 Symp. VLSI Tech., Dig. Tech. Paps.*, 2000, pp. 150 and 151.

"Piranha/HF clean: View", MEMS Exchange, www.mems-exchange.org/catalog/P2568, undated, 3 pp.

\* cited by examiner

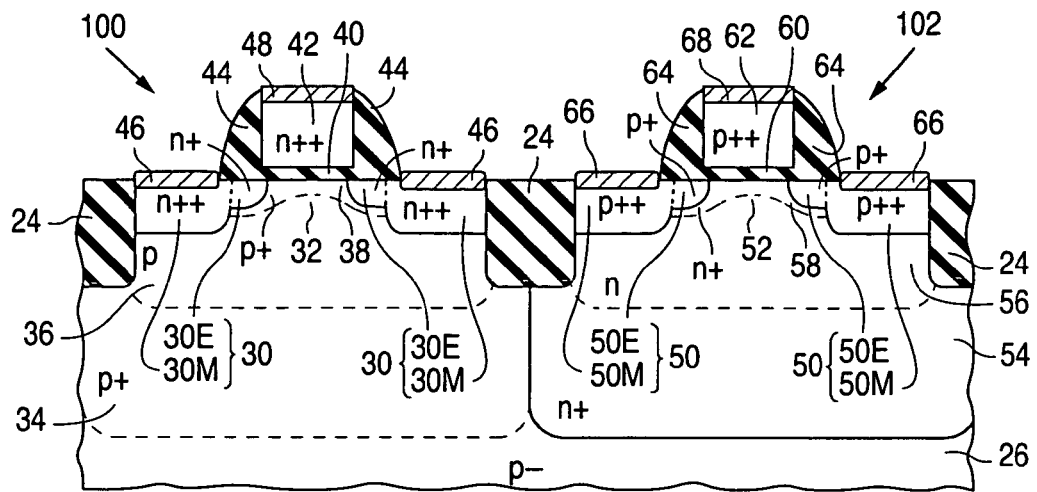
Fig. 3.1
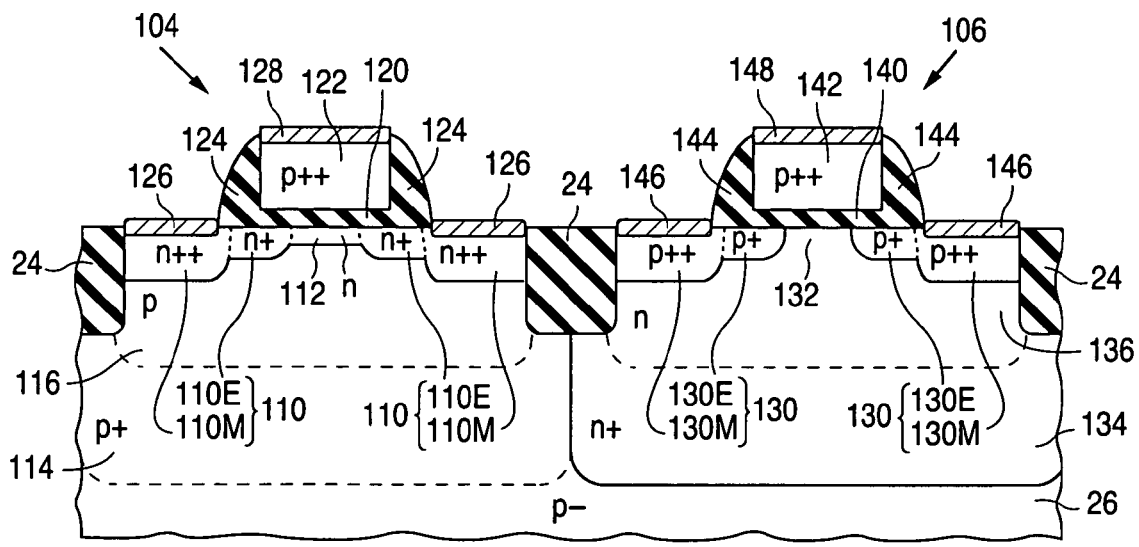
Fig. 3.2

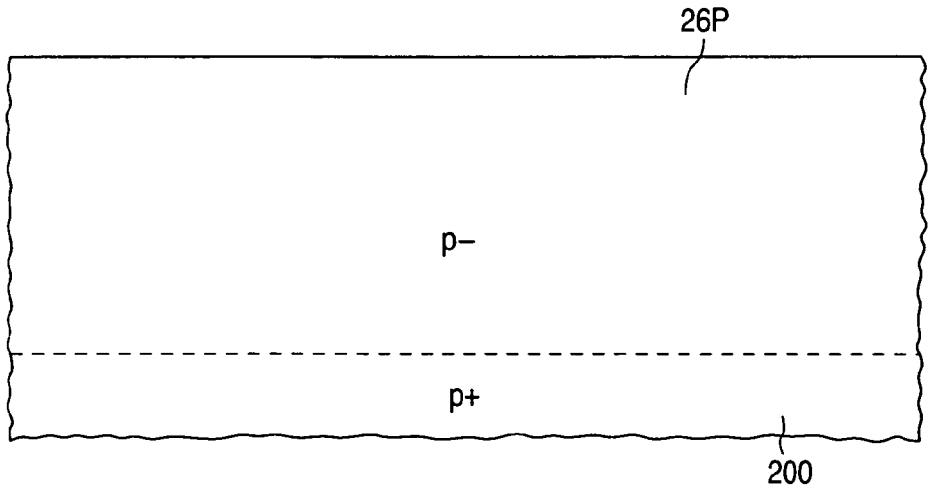
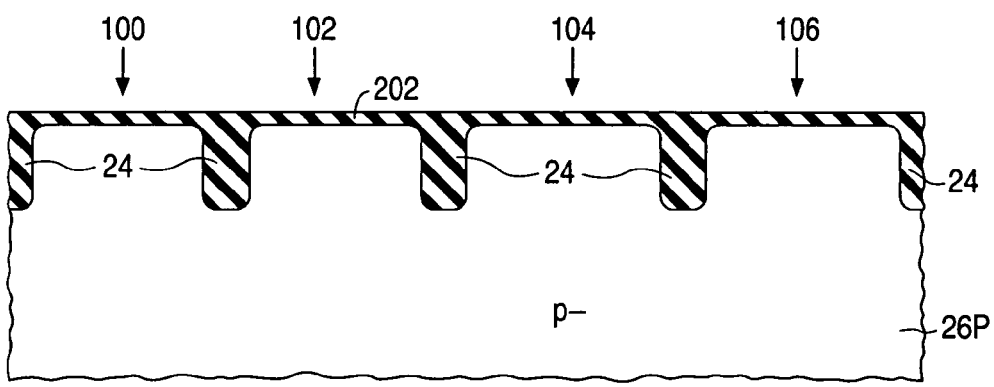
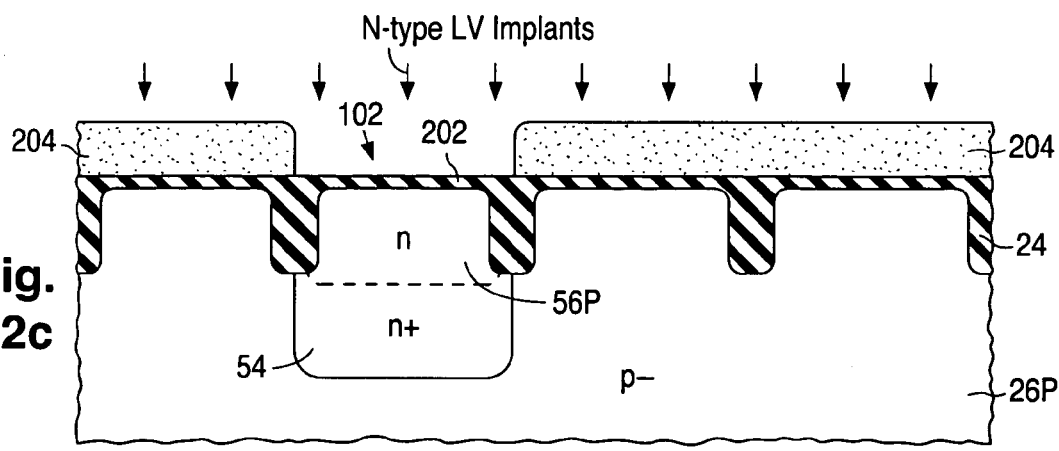

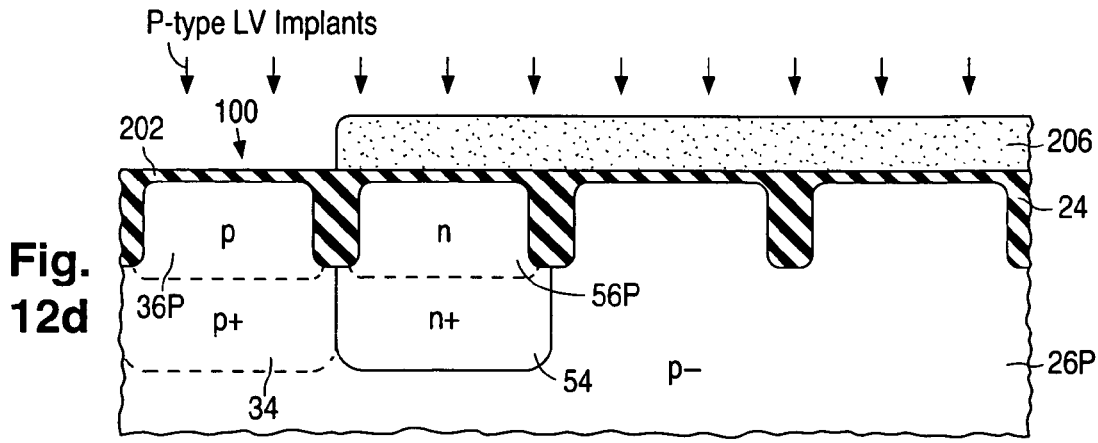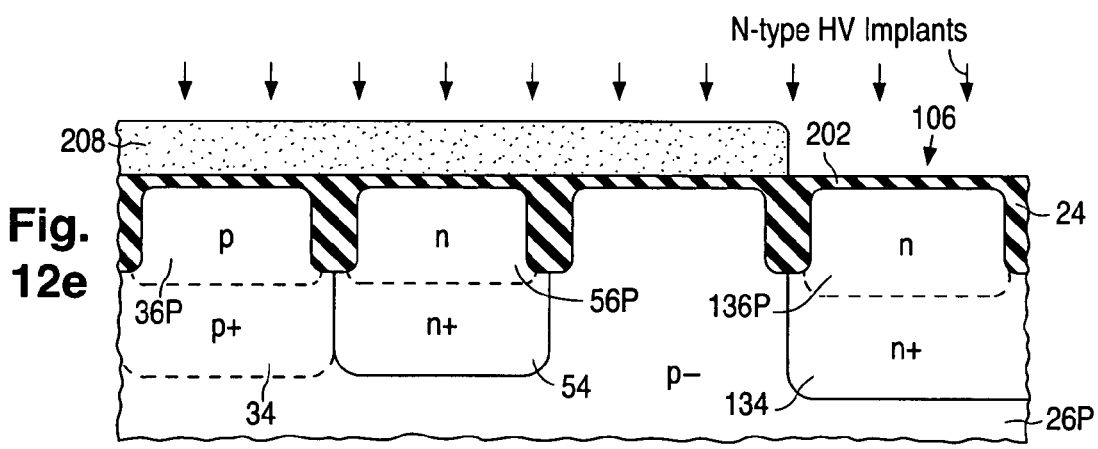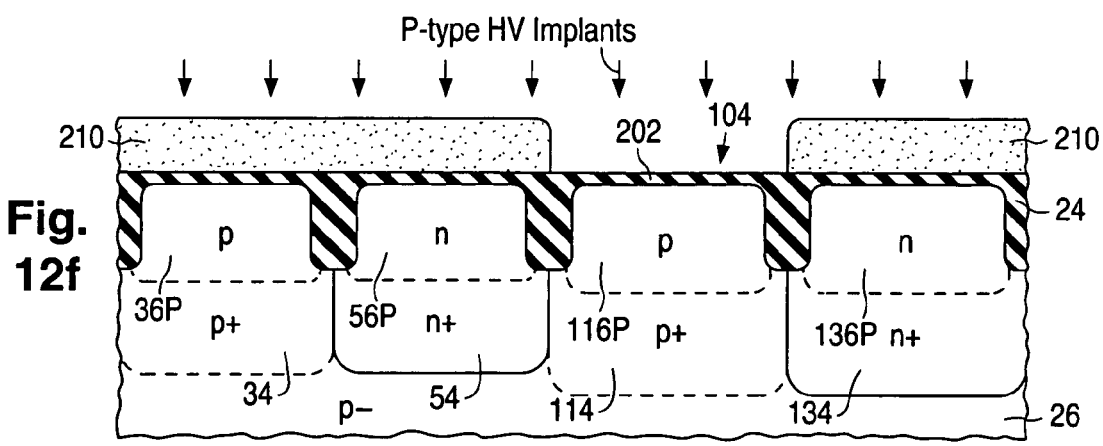

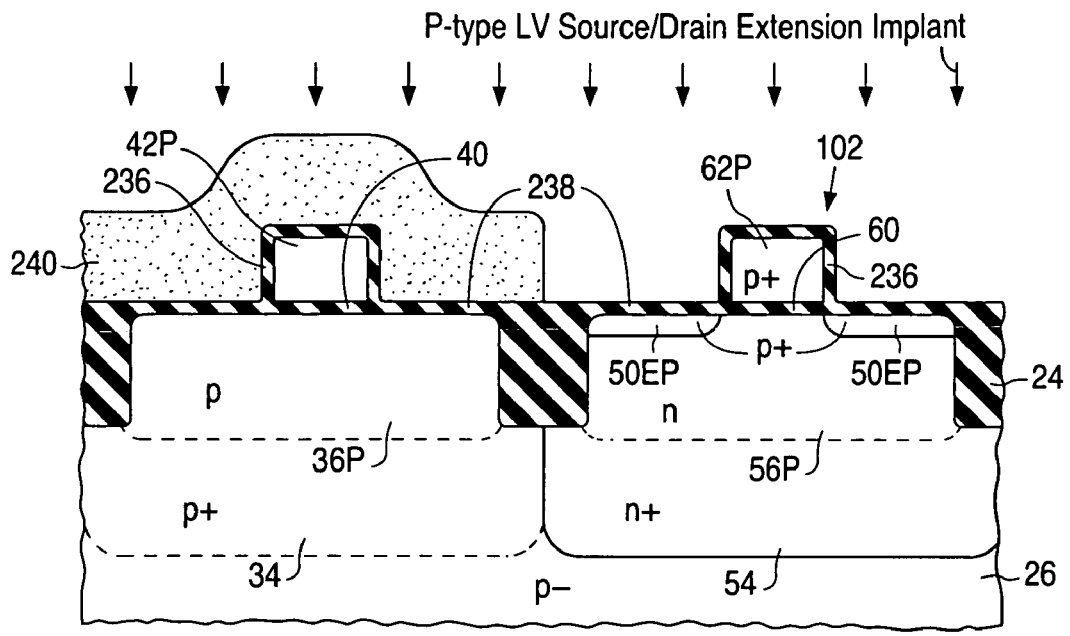
Fig. 12p.1
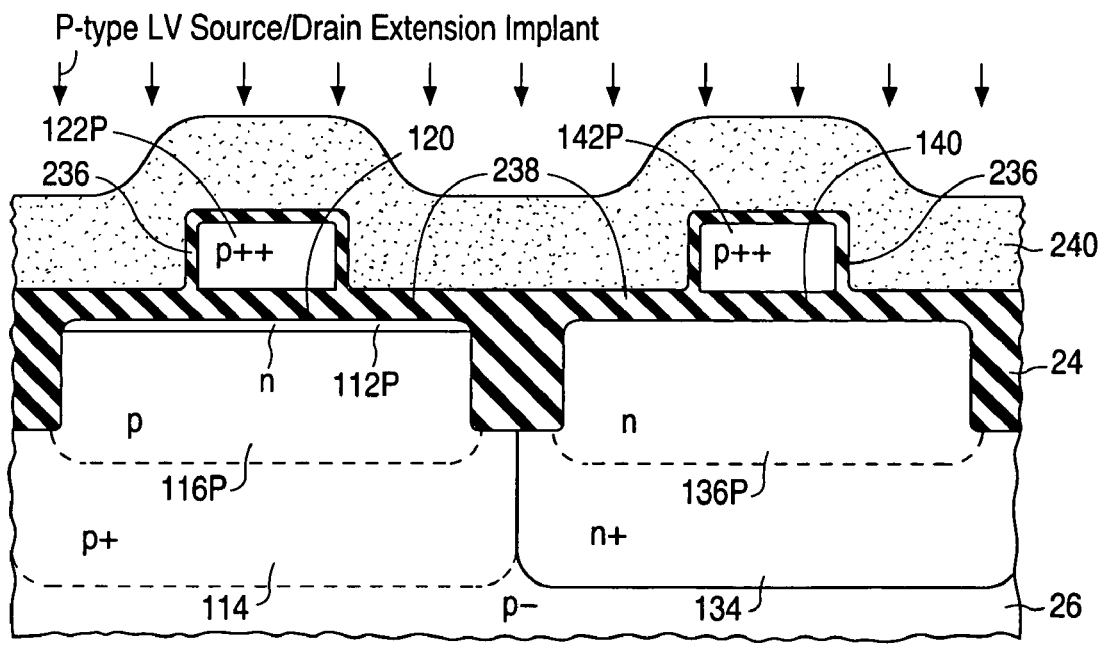
Fig. 12p.2

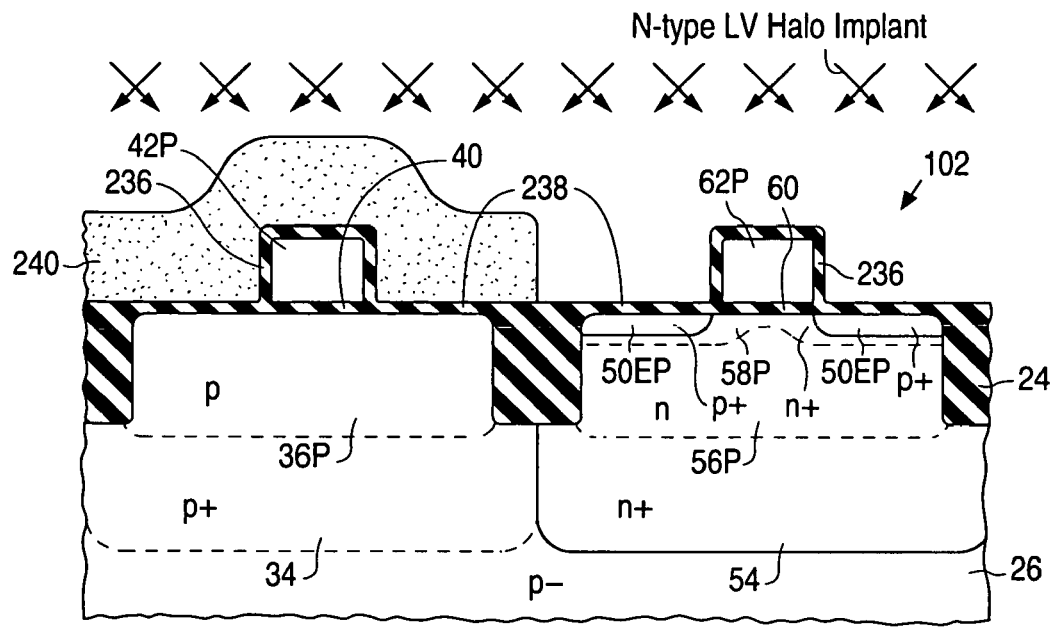
Fig. 12q.1
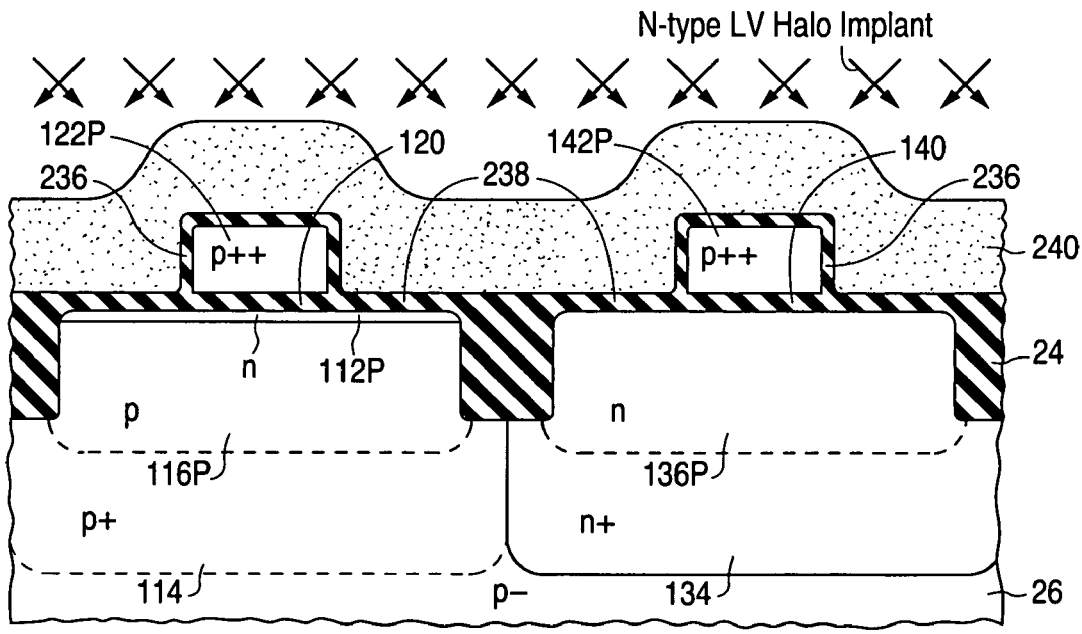
Fig. 12q.2

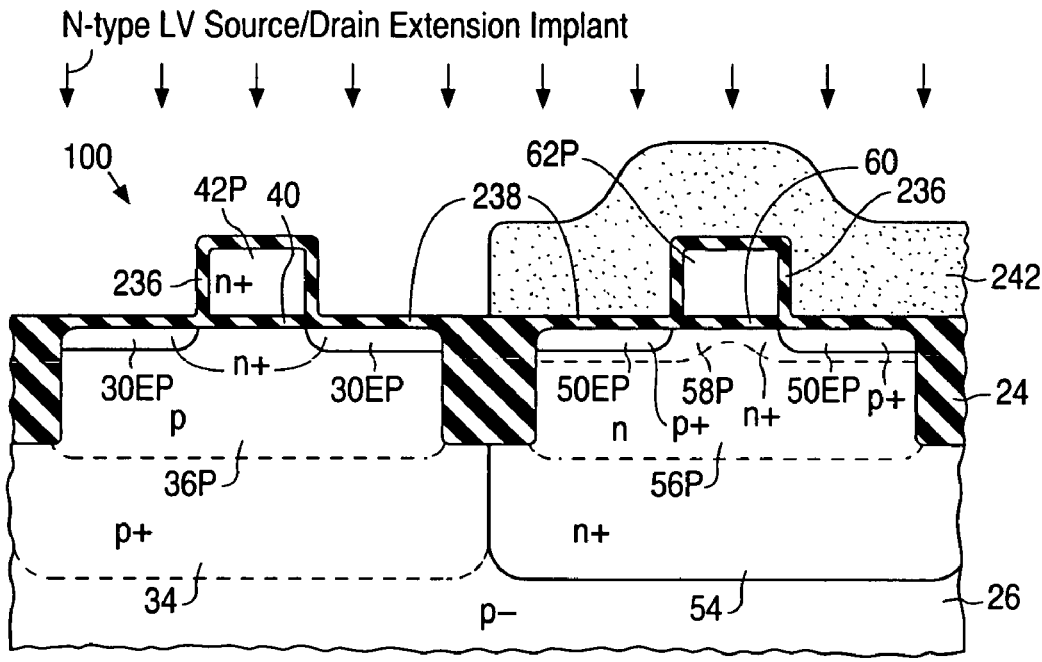
Fig. 12r.1
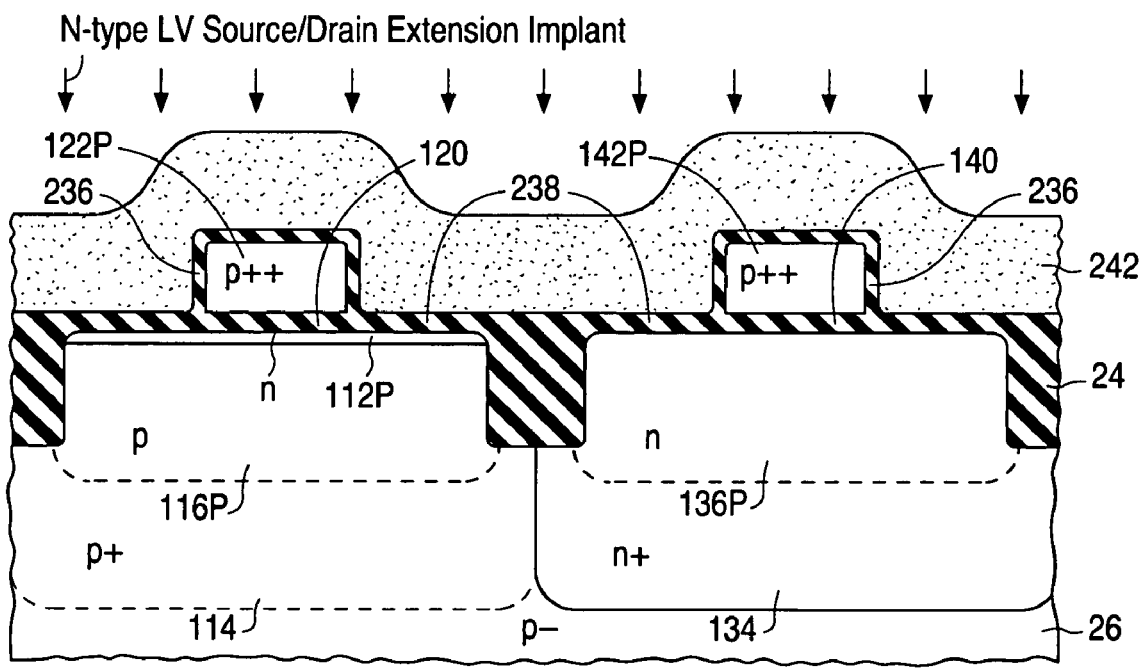
Fig. 12r.2

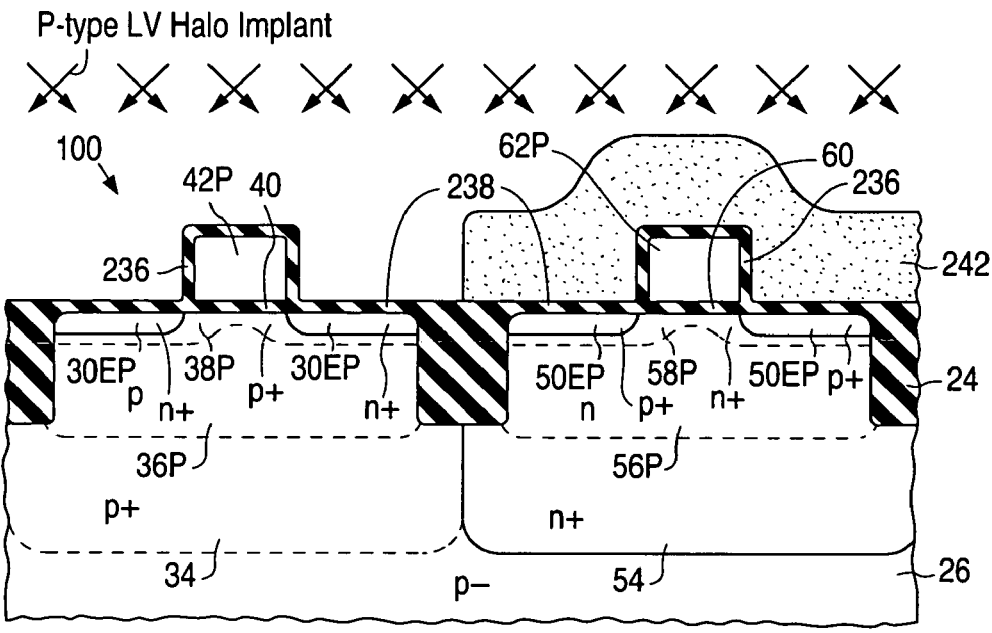
Fig. 12s.1
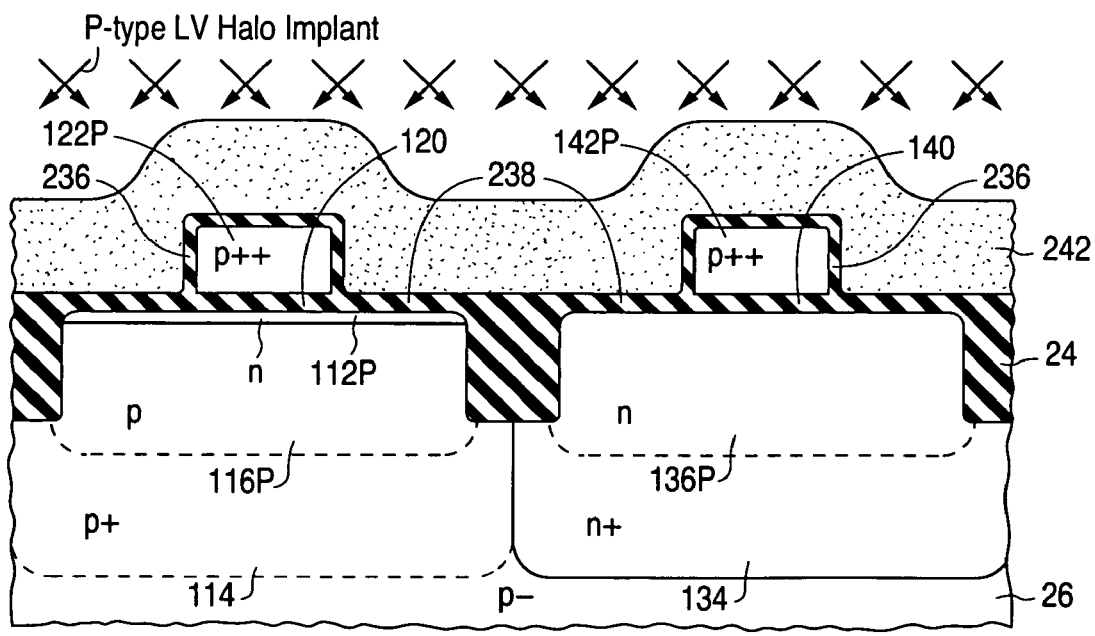
Fig. 12s.2

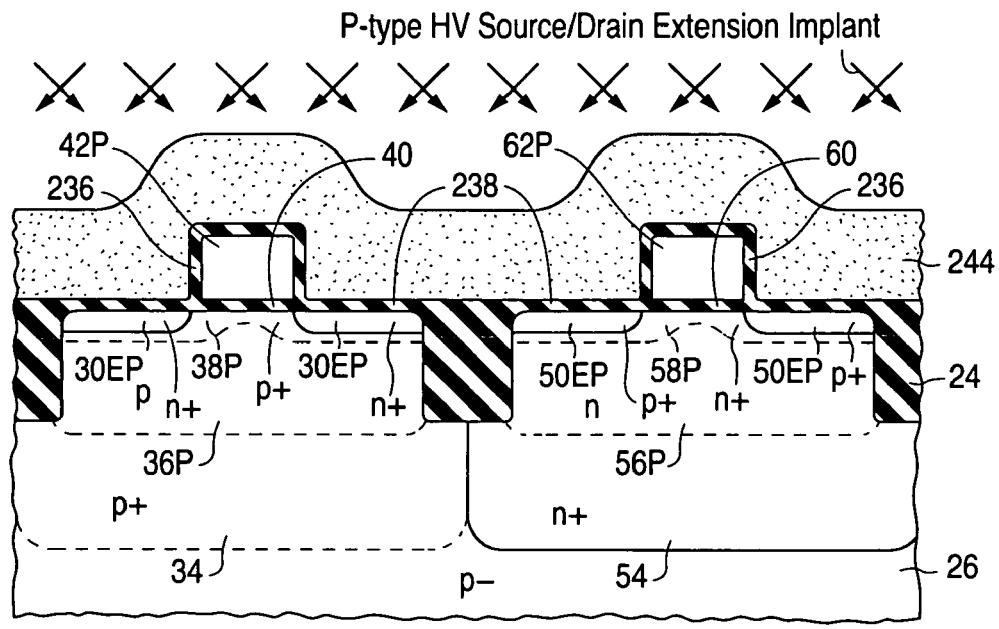
Fig. 12t.1
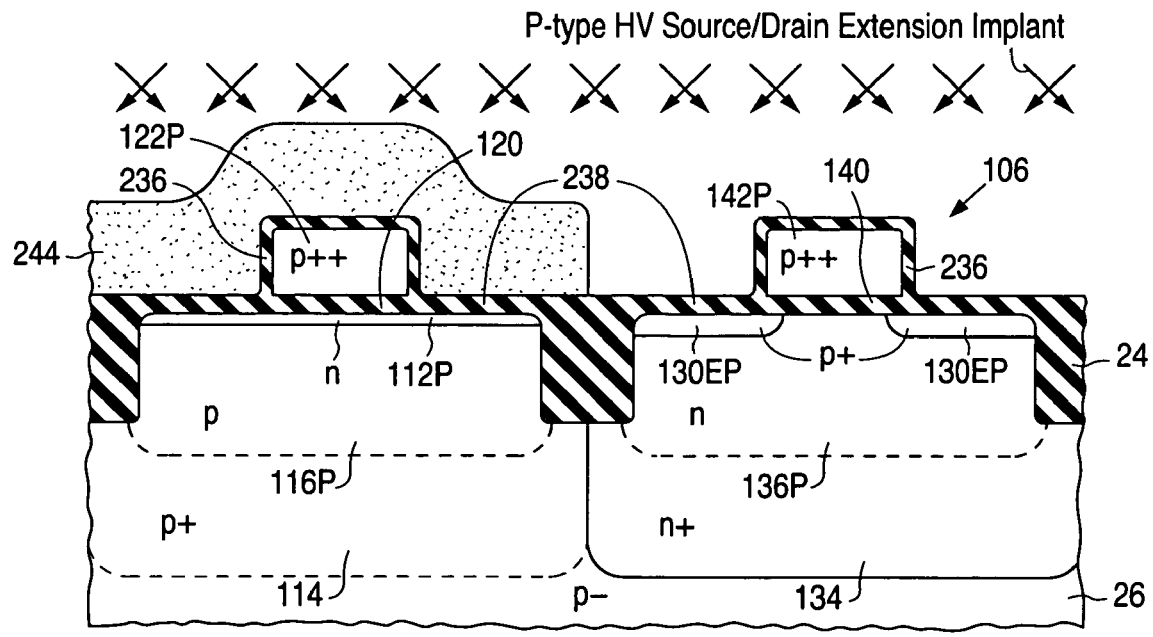
Fig. 12t.2

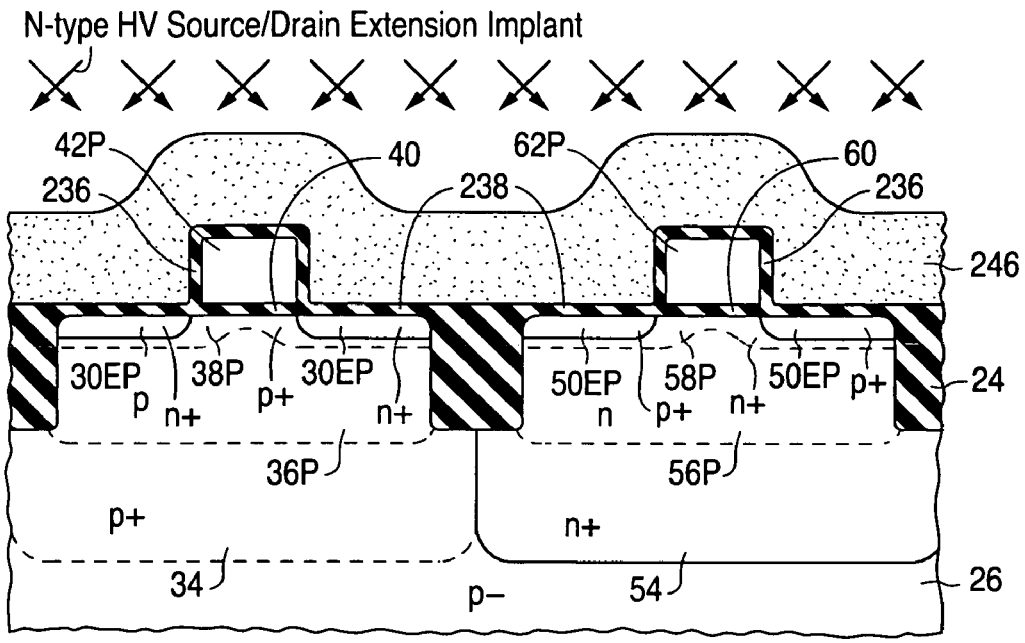
Fig. 12u.1
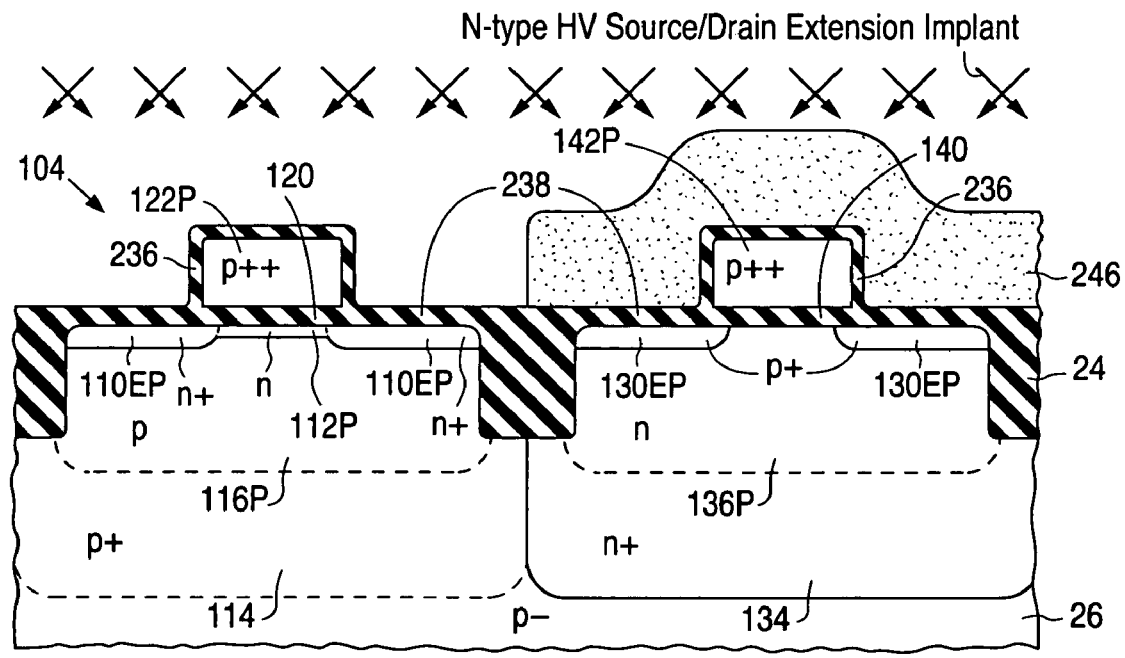
Fig. 12u.2

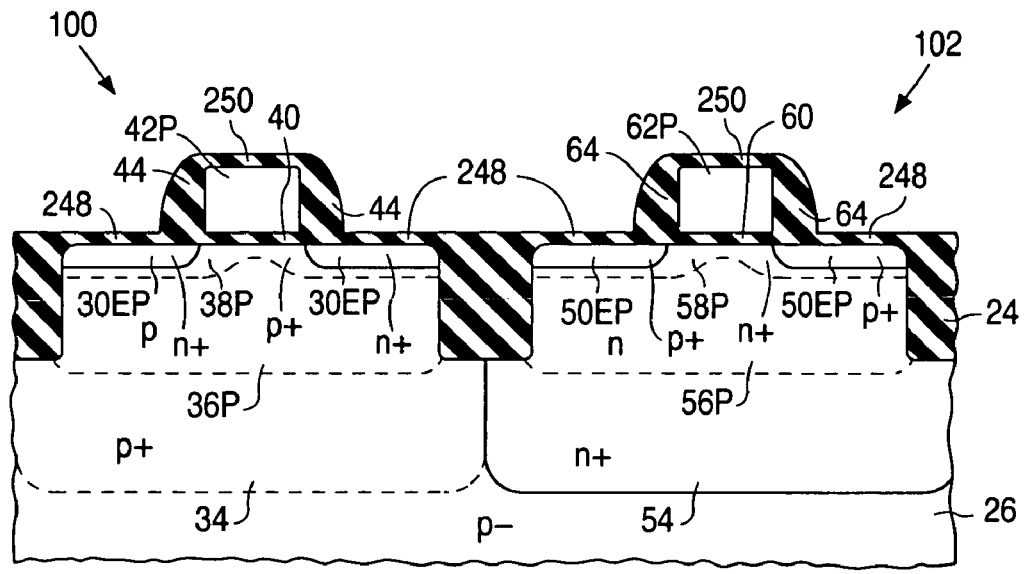
Fig. 12v.1
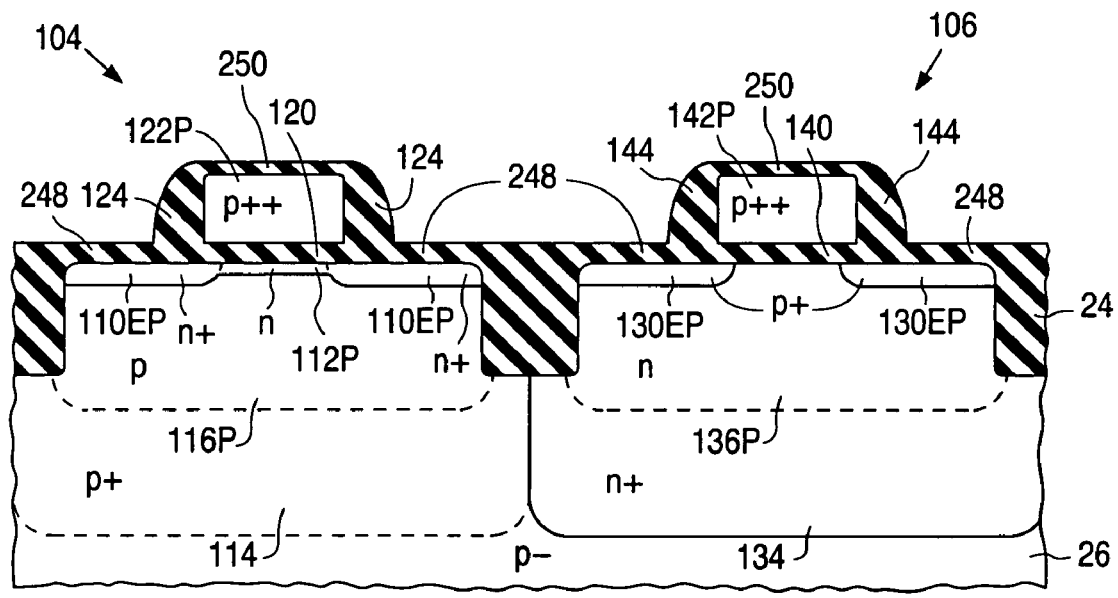
Fig. 12v.2

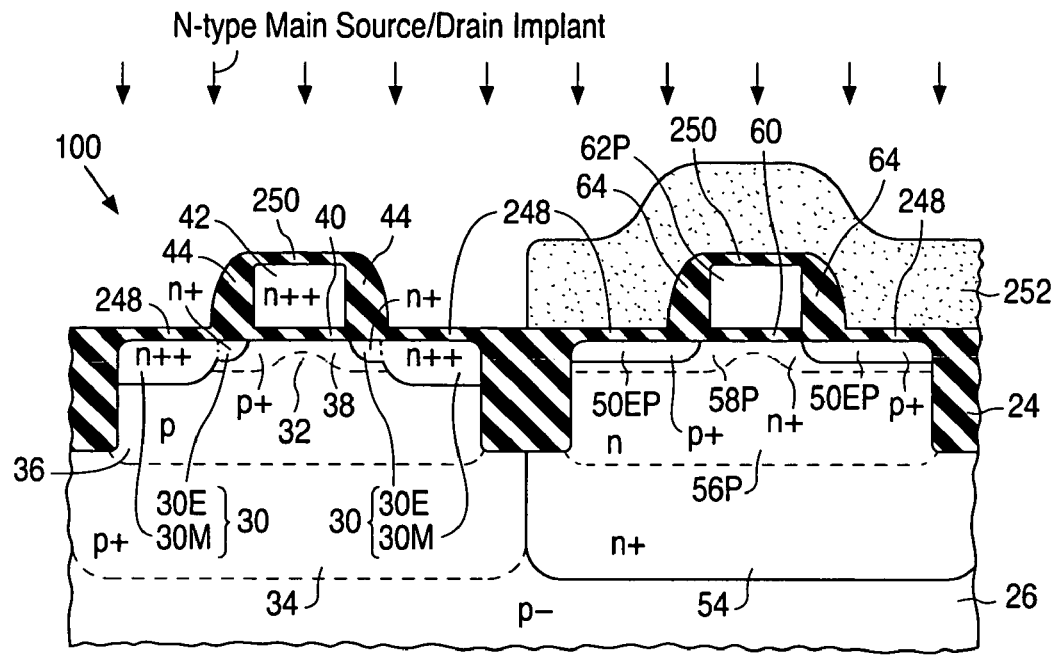
Fig. 12w.1
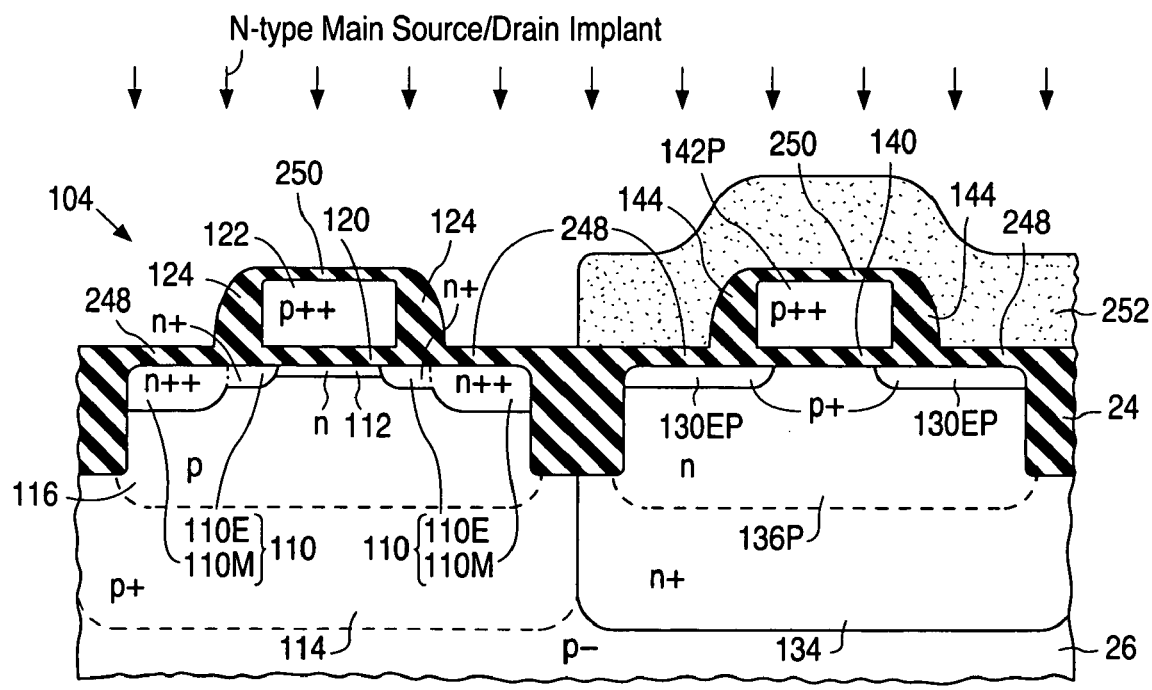
Fig. 12w.2

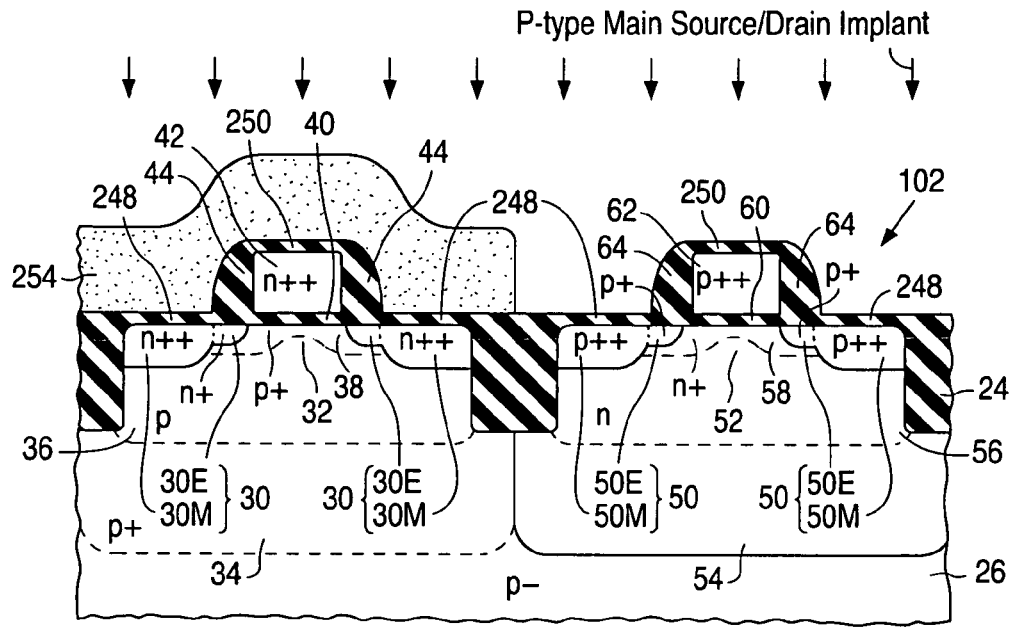
Fig. 12x.1
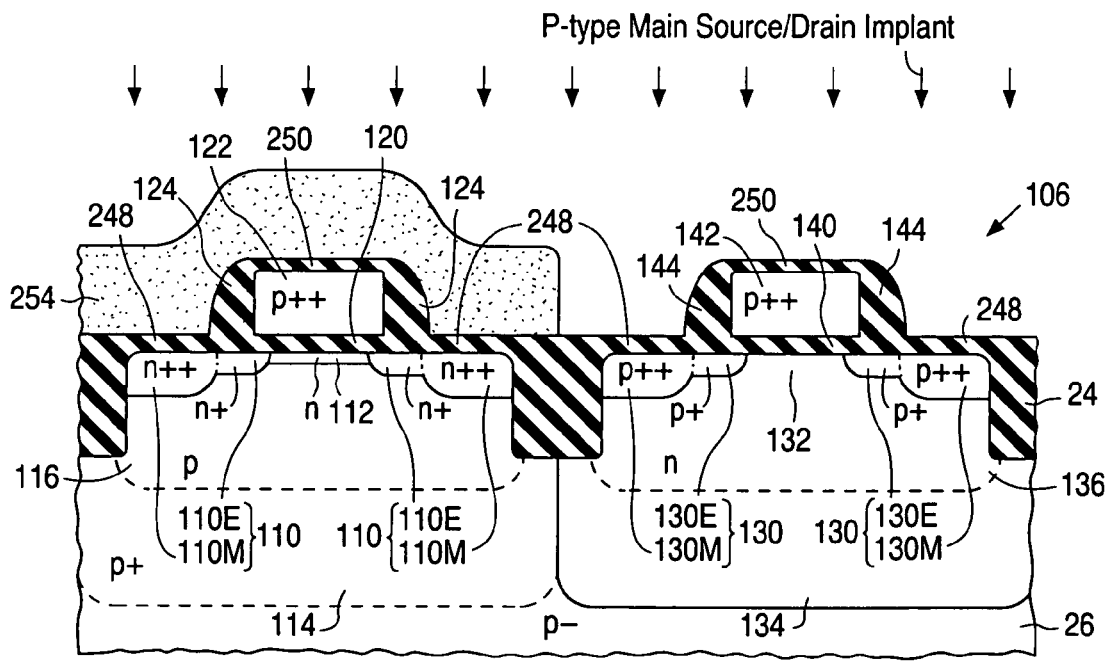
Fig. 12x.2

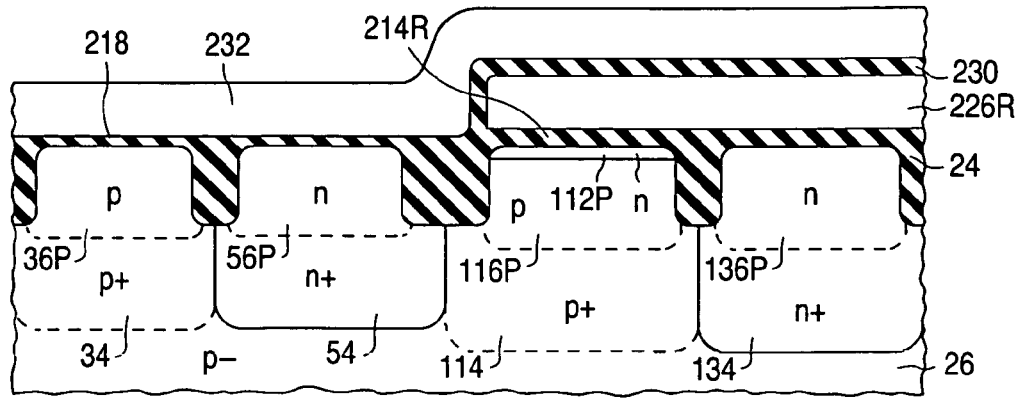
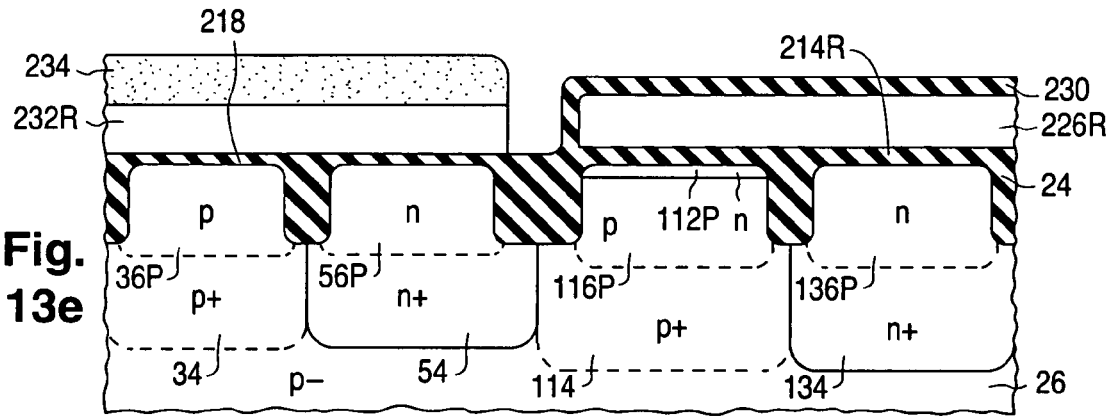
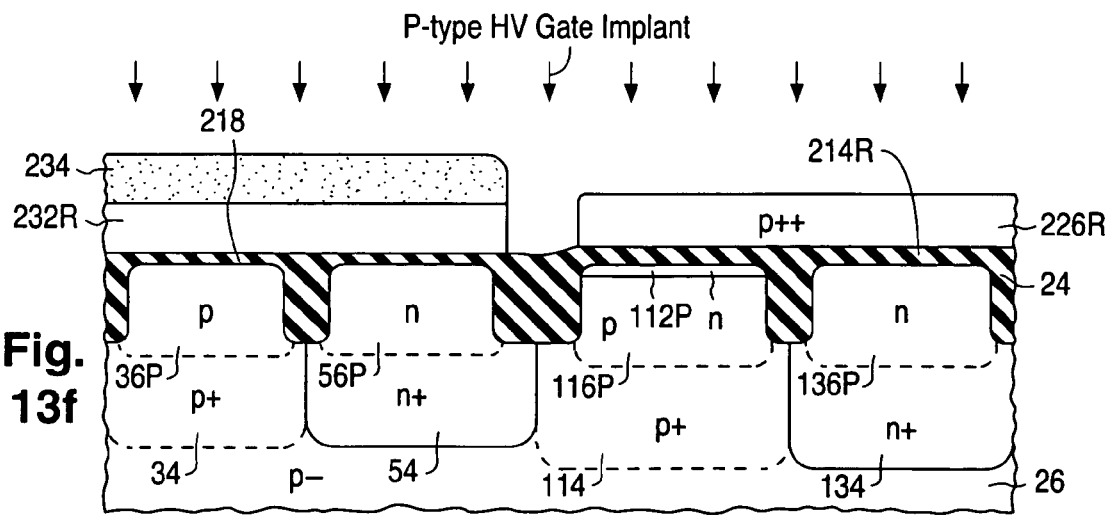

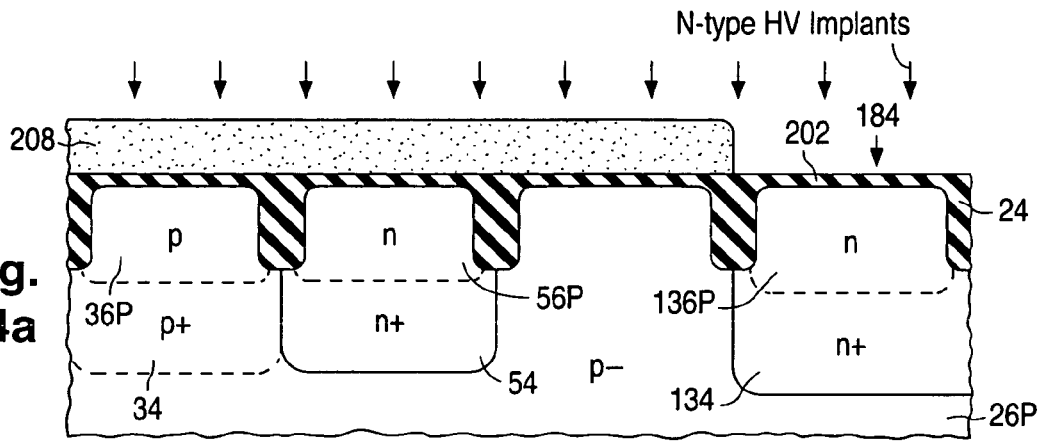
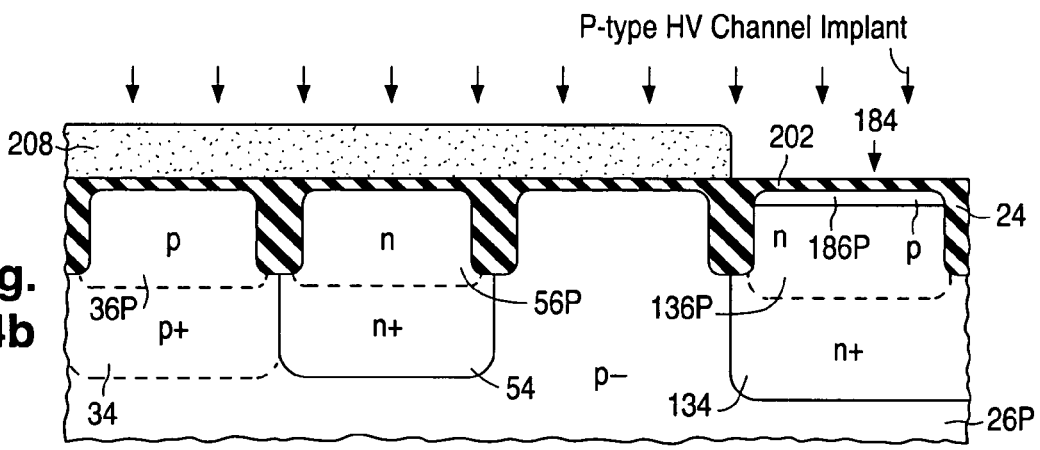
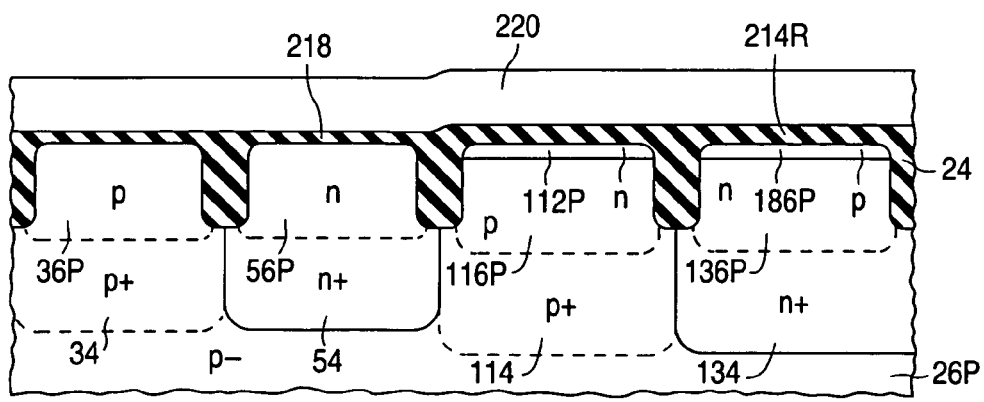

US 7,595,243 B1

FABRICATION OF SEMICONDUCTOR STRUCTURE HAVING N-CHANNEL CHANNEL-JUNCTION FIELD-EFFECT TRANSISTOR

CROSS-REFERENCE TO RELATED APPLICATION

This is a division of U.S. patent application Ser. No. 10/803,203, filed 17 Mar. 2004, now U.S. Pat. No. 7,176,530 B1.

FIELD OF USE

This invention relates to semiconductor technology and, in particular, to field-effect transistors of the insulated-gate type.

BACKGROUND ART

An insulated-gate field-effect transistor ("IGFET") is a semiconductor device in which a gate dielectric layer electrically insulates a channel zone of a semiconductor body from an overlying gate electrode. The channel zone extends between a source and a drain that adjoin a body region of the semiconductor body. The body region, often referred to as the substrate region or substrate, is of opposite conductivity type to the source and drain. Charge carriers, i.e., electrons for an n-channel IGFET and holes for a p-channel IGFET, move from the source through the channel zone to the drain when appropriate voltages are applied to the gate electrode, source, drain, and body region. By suitably controlling these voltages, the IGFET switches between on and off conditions.

The terms "normally off" and "normally on" are commonly used in describing an IGFET with regard to its conductive characteristics when the gate-to-source voltage is zero and the source is connected to the body region, i.e., the gate electrode, source, and body region are at the same voltage such as ground reference. In a normally off IGFET with zero gate-to-source voltage, substantially no charge carriers flow from the source to the drain when the drain is biased so as to attract charge carriers. Charge carriers flow from the source to the drain in a normally on IGFET at zero gate-to-source voltage with the drain biased to attract charge carriers.

The channel zone of an IGFET may be of the same conductivity type as, or of opposite conductivity type to, the source and drain. When the channel zone is of opposite conductivity type to the source and drain, the IGFET is usually a normally off device since no conduction path from the source to the drain extends through the channel zone at zero gate-to-source voltage. By applying a gate-to-source voltage suitable to place the IGFET in a conductive condition, charge carriers are attracted to the upper surface of the channel zone and cause inversion to occur in a thin surface layer of the channel zone. The inverted surface layer forms a conductive surface channel extending from the source to the drain. As a result, this type of IGFET is commonly referred to as a "surface-channel" device.

An IGFET that behaves generally in the way prescribed by the classical model for an IGFET is often characterized as a "long-channel" device. An IGFET is characterized as a "short-channel" device when the channel length is shortened to such an extent that the IGFET's behavior deviates significantly from that of the classical IGFET model. Both long-channel and short-channel IGFETs are variously employed in ICs. Long-channel IGFETs are particularly suitable for many types of analog circuitry. Short-channel IGFETs are prevalent in digital applications.

FIG. 1 illustrates a complementary-IGFET structure containing short-channel normally off n-channel surface-channel IGFET ("SCIGFET") 20 and short-channel normally off p-channel SCIGFET 22 created from a doped monocrystalline silicon ("monosilicon") semiconductor body as described in U.S. Pat. No. 6,548,842 B1. The "SC" portion of the acronym "SCIGFET" means surface channel rather than short channel. Field region 24 of electrically insulating material extends into the semiconductor body along its upper surface to define a group of laterally separated active semiconductor regions. Item 26 in FIG. 1 illustrates lightly doped p-type monosilicon material that remains after SCIGFETs 20 and 22 are created.

N-channel SCIGFET 20 has a pair of laterally separated n-type source/drain zones 30 provided in one of the active semiconductor regions along the upper semiconductor surface. Each n-type surface-adjoining source/drain zone 30 consists of very heavily doped main portion 30M and more lightly doped lateral extension 30E. Although more lightly doped than n++ main source/drain portions 30M, source/drain extensions 30E are still heavily doped n-type. P-type channel zone 32 extends between source/drain zones 30, primarily between n+ extensions 30E. Channel zone 32 is part of p-type device body material that forms a pn junction with each n-type source/drain zone 30. The p-type device body material consists of (a) well portion 34 that merges junctionlessly into p– material 26, (b) moderately doped upper portion 36, and (c) heavily doped halo region 38 that extends around source/drain extensions 30E to meet main source/drain portions 30M.

Gate dielectric layer 40 lies on channel zone 32. Gate electrode 42 consisting of very heavily doped n-type polycrystalline silicon ("polysilicon") lies on gate dielectric layer 40 and extends laterally above part of each source/drain extension 30E. A pair of electrically insulating sidewall spacers 44 are situated respectively along the opposite transverse sidewalls of n++ gate electrode 42. A metal silicide layer 46 is situated along the top of each main source/drain portion 30M. Further metal silicide layer 48 is situated along the top of gate electrode 42.

Configured similarly to n-channel SCIGFET 20, p-channel SCIGFET 22 has a pair of laterally separated p-type source/drain zones 50 provided in another of the active semiconductor regions along the upper semiconductor surface. Each p-type surface-adjoining source/drain zone 50 consists of very heavily doped main portion 50M and more lightly doped, but still heavily doped, lateral extension 50E. N-type channel zone 52 extends between source/drain zones 50, primarily between p+ extensions 50E. Channel zone 52 is part of n-type device body material that forms a pn junction with each p-type source/drain zone 50. The n-type device body material consists of (a) heavily doped well portion 54 that adjoins p– material 26 to form a pn isolation junction, (b) moderately doped upper portion 56, and (c) heavily doped halo region 58 that extends around source/drain extensions 50E to meet main source/drain portions 50M.

Gate dielectric layer 60 lies on channel zone 52. Gate electrode 62 consisting of very heavily doped p-type polysilicon lies on gate dielectric layer 60 and extends laterally above part of each source/drain extension 50E. A pair of electrically insulating sidewalls spacers 64 are respectively situated along the opposite transverse sidewalls of p++ gate electrode 62. A metal silicide layer 66 is situated along the top of each main source/drain portion 50M. Further metal silicide layer 68 is situated along the top of gate electrode 62.

SCIGFETs 20 and 22 operate across the same voltage range. Their gate dielectric layers 40 and 60 are of largely the same (average) thickness. The magnitudes (absolute values) of their threshold voltages at a given channel length are also largely the same. In particular, the magnitudes of their threshold voltages are typically in the vicinity of 0.5 V for a scaled complementary-IGFET fabrication process using minimum lithography features of 0.18-0.25 μm.

IGFETs 20 and 22 are highly advantageous, especially for use in digital applications. The threshold voltage of a surface-channel IGFET rolls off sharply to zero as its channel length is reduced below a value typically in the vicinity of 0.4 μm. With one source/drain zone 30 or 50 operating as the source at (any particular time) while the other source/drain zone 30 or 50 operates as the drain, halo regions 38 and 58 cause threshold voltage roll-off to be shifted to lower channel length in IGFETs 20 and 22, thereby enabling their channel lengths to be reduced without significantly increasing the threshold voltage roll-off. Inasmuch as the source/drain drive current normally increases with decreasing channel length, the reduced channel length achieved with halo regions 38 and 58 enables IGFETs 20 and 22 to have increased drive current as is important for digital applications.

A pair of depletion regions (not shown) extend respectively along the drain/body and source/body junctions of an IGFET. Under certain conditions, especially when the channel length is small, the drain depletion region can extend laterally to the source depletion region and merge with it below the upper semiconductor surface. This phenomenon is termed punchthrough. If the drain depletion region punches through to the source depletion region, the operation of the IGFET cannot be controlled with the gate electrode. Accordingly, punchthrough normally needs to be avoided.

The net dopant concentration in the device body material, specifically upper portion 36 or 56, of each SCIGFET 20 or 22 reaches a local subsurface maximum more than 0.1 μm below the upper semiconductor surface but not more than 0.4 μm below the upper semiconductor surface. The local subsurface maximum of the net dopant concentration of the body material for IGFET 20 or 22 also occurs below a channel surface depletion region (not shown) that extends along the upper semiconductor surface into channel zone 32 or 52 during IGFET operation. The semiconductor dopant which produces the local subsurface maximum in the body material's net dopant concentration for IGFET 20 or 22 causes the thickness of the body-side portion of the depletion region along each source/drain zone 30 or 50 to be reduced at a given voltage between zones 30 or 50. Punchthrough is thus significantly alleviated in IGFETs 20 and 22 so as to significantly improve IGFET performance.

When the channel zone of an IGFET is of the same conductivity type as the source/drain zones, the channel zone is of opposite conductivity type to the body region and forms a channel-zone/body pn junction with the body region. An IGFET of this type can be a normally on device or a normally off device as described in Nishiuchi et al., "A Normally-off Type Buried-Channel MOSFET for VLSI Circuits", *IEDM Tech. Dig.*, December, 1978, pp. 26-29. Referring to U.S. Pat. No. 5,952,701, current conduction in such a normally off IGFET can occur along the upper surface of the channel zone or through a subsurface layer of the channel zone.

An IGFET having a channel zone of the same conductivity type as the source and drain is variously referred to by persons working in the semiconductor art using the following terms: "buried-channel MOSFET", "implanted-channel MOSFET", and "junction MOSFET". Unfortunately, all of these terms are unsatisfactory. For example, characterizing such an IGFET as a "buried-channel MOSFET" is misdescriptive because source-to-drain conduction can occur through either a surface channel or a subsurface (buried) channel. As to "implanted-channel MOSFET", the channel zone is normally created by ion implantation but does not have to be ion implanted. The term "junction MOSFET" does not make it clear that the "junction" is the channel-zone/body junction. Consequently, "junction MOSFET" is confusingly similar to the term "junction field-effect transistor" applied to a field-effect transistor having no gate dielectric layer.

Herein, an IGFET whose channel zone is of the same conductivity type as the source and drain is generally referred to as a "channel-junction insulated-gate field-effect transistor," where the modifier "channel-junction" refers to the pn junction formed between the channel zone and the body region. Consequently, a channel-junction insulated-gate field-effect transistor ("CJIGFET") generally means any transistor commonly referred to as a buried-channel MOSFET, an implanted-channel MOSFET, or a junction MOSFET. In particular, a normally off CJIGFET is a normally off IGFET having a channel zone of the same conductivity type as the source and drain.

CJIGFETs are often used in complementary-IGFET applications in which one of the two types of opposite-polarity IGFETs is a normally off CJIGFET while the other type is a surface-channel IGFET. In Hu et al., "Design and Fabrication of P-channel FET for 1-μm CMOS Technology," *IEDM Tech. Dig.* 11-15 December 1982, pages 710-713, the p-channel device is a normally off CJIGFET while the n-channel device is an SCIGFET. The opposite occurs in Parrillo et al., "A Fine-Line CMOS Technology That Uses P+ Polysilicon/Silicide Gates for NMOS and PMOS Devices," *IEDM Tech, Die.*, December 1984, pages 418-422.

SCIGFETs and normally off CJIGFETs have various advantages and disadvantages. For instance, an SCIGFET is typically easier to fabricate, especially with a threshold voltage that stays within desired limits at short channel length. On the other hand, a normally off CJIGFET typically has lower noise. See Hu et al., cited above, and Nishida et al., "SoC CMOS Technology for NBTI/HCI Immune I/O and Analog Circuits Implementing Surface and Buried Channel Structures", *IEDM Tech. Die.*, 2-5 December 2001, pages. 39.4.1-39.4.4.

IGFETs, especially long-channel IGFETs, employed in analog circuitry commonly operate across greater voltage ranges than short-channel IGFETs utilized in digital circuitry. As a result, the thickness of the gate dielectric layer of an IGFET designed for analog circuitry is often greater than the thickness of the gate dielectric layer of an IGFET designed for digital circuitry. In mixed-signal applications having both digital and analog circuitry, semiconductor fabrication processes commonly provide complementary IGFETs at two different gate dielectric thicknesses so that complementary IGFETs at a low gate dielectric thickness are available for the digital circuitry while complementary IGFETs at a high gate dielectric thickness are available for the analog circuitry.

FIG. 2 generally depicts a complementary-IGFET structure having a first pair of normally off complementary IGFETs 80 and 82 at one gate dielectric thickness and a second pair of normally off complementary IGFETs 84 and 86 at another (different) gate dielectric thickness as described in Nishida et al. cited above. Recessed electrically insulating field region 88 laterally separates the source/drain zones of each IGFET 80, 82, 84, or 86 from the source/drain zones of each other IGFET 80, 82, 84, or 86. Various wells (not shown) are provided in semiconductor body 90.

IGFETs 80 and 82, which are at the higher gate dielectric thickness, operate across the higher of a pair of voltage ranges. IGFET 80 is an n-channel surface-channel device.

IGFET 82 is a p-channel channel-junction device. Item 92 is the p-type channel zone for CJIGFET 82. Nishida et al. does not indicate that any special means is utilized to alleviate punchthrough in high-voltage IGFETs 80 and 82.

IGFETs 84 and 86, which are at the lower gate dielectric thickness, operate across the lower voltage range and are shown as being of lesser channel length than IGFETs 80 and 82. IGFET 84 is a n-channel surface-channel device. IGFET 86 is a p-channel surface-channel device. Low-voltage SCIG-FETs 84 and 86 are similar to SCIGFETs 20 and 22 of FIG. 1 except that IGFETs 84 and 86 are not provided with halo regions to alleviate short-channel threshold-voltage roll-off. Nor does Nishida et al. indicate that any means is employed to alleviate punchthrough in low-voltage IGFETs 84 and 86.

Low-frequency noise that occurs in an IGFET is commonly referred to as "1/f" noise because the low-frequency noise is usually roughly proportional to the inverse of the IGFET's switching frequency. Nishida et al. reports that implementing p-channel high-voltage IGFET 82 as a channel-junction device improves the noise characteristics by causing the 1/f noise to be reduced to about one third of the 1/f noise that would occur if IGFET 82 were a surface-channel device. Unfortunately, n-channel high-voltage SCIGFET 80 appears to be relatively noisy. It would be desirable to have a semiconductor technology in which complementary IGFETs are provided at two different gate dielectric thicknesses such that the complementary IGFETs at the higher gate dielectric thickness incur less 1/f noise than high-voltage IGFETs 80 and 82.

GENERAL DISCLOSURE OF THE INVENTION

The present invention takes advantage of certain materials properties which are asymmetrical with respect to the n and p types of semiconductor conductivity to achieve an insulated-gate field-effect transistor technology having performance characteristics that are greatly improved over the prior art. These properties include (a) higher electron mobility than hole mobility, (b) higher electron channel-zone-to-gate-dielectric tunneling probability than hole channel-zone-to-gate-dielectric tunneling probability, and (c) differences in diffusion rates and other characteristics between n-type dopants and p-type dopants. By taking advantages of these materials properties, especially the electron-to-hole mobility difference and the electron-to-hole channel-zone-to-gate-dielectric tunneling probability difference, in accordance with the invention, the present IGFET technology enables 1/f noise to be reduced by a large factor while signal gain is increased.

The IGFET technology of the invention combines a normally off n-channel channel-junction IGFET (again, "CJIGFET") with an n-channel surface-channel IGFET (again, "SCIGFET"). The n-channel CJIGFET is normally of greater gate dielectric thickness than the n-channel SCIGFET so that the n-channel CJIGFET operates across a greater voltage range than the n-channel SCIGFET. The n-channel CJIGFET can conduct current by way of a field-induced surface channel or a metallurgical subsurface channel. In either case, the n-channel CJIGFET incurs much less, typically at least 90% less, 1/f noise than an otherwise substantially equivalent normally off n-channel surface-channel IGFET, i.e., an n-channel SCIGFET that operates across the same voltage range as the n-channel CJIGFET and thus across a greater voltage range than the n-channel SCIGFET used in the present technology.

A p-channel SCIGFET is preferably combined with the two n-channel devices so as to achieve a complementary-IGFET technology. The n-channel and p-channel SCIGFETs are typically of approximately the same gate dielectric thickness. Hence, the n-channel CJIGFET is normally of greater dielectric thickness than both SCIGFETS.

In fabricating a complementary-IGFET structure containing the n-channel CJIGFET and the two SCIGFETs, channel-zone-defining n-type semiconductor dopant is introduced into a semiconductor body to define an n-type region that includes a surface-adjoining n-type channel zone for the n-channel CJIGFET. The semiconductor body is then provided with a gate dielectric layer for each IGFET. A gate electrode for each IGFET is provided over its gate dielectric layer. The provision of the gate dielectric layers and gate electrodes can be done in various ways such that the gate dielectric layer for the n-channel CJIGFET is thicker than the gate dielectric layers for the two SCIGFETs.

For example, a first dielectric layer can be formed along the semiconductor body at least along the lateral locations for the three gate dielectric layers. Largely all the material of the first dielectric layer is removed generally along the lateral locations for the gate dielectric layers of the two SCIGFETs. A second dielectric layer, preferably thinner than the first dielectric layer, is formed along the semiconductor body at least along the lateral locations for the gate dielectric layers of the two SCIGFETs. The gate dielectric layer of each of the two SCIGFETS then includes a portion of the second dielectric layer while the gate dielectric layer of the n-channel CJIGFET includes a portion of the remainder of the first dielectric layer. The gate electrodes are defined by depositing a semiconductor layer over the second dielectric layer and the remainder of the first dielectric layer, patterning the semiconductor layer, and doping it with suitable semiconductor dopants.

Alternatively, a first dielectric layer can again be formed along the semiconductor body at least along the lateral locations for the three gate dielectric layers. Instead of removing largely all the material of the first dielectric layer generally along the lateral locations for the gate dielectric layers of the two SCIGFETs, a first semiconductor layer is deposited over the first dielectric layer. Largely all the material of the first semiconductor layer and the first dielectric layer is then removed along the lateral locations for the gate dielectric layers of the two SCIGFETs.

The IGFET processing in the foregoing alternative continues with the formation of a second dielectric layer, again preferably thicker than the first dielectric layer, along the semiconductor body at least along the lateral locations for the gate dielectric layers of the two SCIGFETs. A second semiconductor layer is formed over the second dielectric layer. The two semiconductor layers are then patterned and doped with suitable semiconductor dopants to define the gate electrodes for the three IGFETs. The gate dielectric layer of each SCIGFET again includes a portion of the second dielectric layer while the gate dielectric layer of the n-channel CJIGFET includes a portion of the remainder of the first dielectric layer. This alternative technique for defining the gate dielectric layers and gate electrodes, although slightly more complex than the first-mentioned technique, avoids exposing the material which later becomes the gate dielectric layer for the n-channel CJIGFET to potential contaminates, such as photoresist employed in removing largely all the material of the first dielectric layer along the lateral locations for the gate dielectric layers of the two SCIGFETs, since the first semiconductor layer covers the first dielectric layer at that point in the alternative technique.

Regardless of how the gate dielectric layers and gate electrodes are defined for the three IGFETs, n-type semiconductor dopant is introduced into the semiconductor body to define one pair of n-type source/drain zones for the n-channel SCIGFET and another pair of n-type source/drain zones for the n-channel CJIGFET. The n-type source/drain dopant introduction operation is performed in such a way that the n-type channel zone of the n-channel CJIGFET extends between, and is more lightly doped than, its n-type source/drain zones. P-type semiconductor dopant is introduced into the semiconductor body to define a pair of p-type source/drain zones for the p-channel SCIGFET. The doping operations to define the source/drain zones for the three IGFETs can be performed in various orders and in various ways. For instance, each source/drain zone can be formed as a main portion and a more lightly doped lateral extension.

A further p-channel IGFET is preferably combined with the n-channel CJIGFET and the two SCIGFETs. As with the n-channel CJIGFET, the further p-channel IGFET normally has a thicker gate dielectric layer than each of the two SCIGFETs. The n-channel CJIGFET and the further p-channel IGFET are preferably of greater channel length than each of the two SCIGFETs. The present complementary-IGFET structure is then especially suitable for mixed-signal applications in which the two SCIGFETs are employed in digital circuitry while the n-channel CJIGFET and the further p-channel IGFET are employed in higher-voltage analog circuitry.

The further p-channel IGFET can be implemented as a surface-channel device or a channel-junction device. When implemented as an SCIGFET, the further p-channel IGFET incurs roughly the same 1/f noise as an otherwise substantially equivalent normally off p-channel CJIGFET. This is in sharp contrast to the n-channel situation in which an n-channel SCIGFET incurs at least ten times as much 1/f noise as an otherwise substantially equivalent normally off n-channel CJIGFET, and appears to arise largely from the above-mentioned asymmetries in which electrons, the charge carriers in n-channel IGFETs, have greater channel-zone-to-gate-dielectric tunneling probabilities than holes, the charge carriers in p-channel IGFETs. Since the n-channel CJIGFET in the present complementary-IGFET structure typically has at least 90% less 1/f noise than an otherwise comparable SCIGFET, the net result is that the n-channel CJIGFET and the surface-channel-implemented further p-channel IGFET in such an implementation of the complementary-IGFET structure of the invention together experience at least 90% less 1/f noise than the otherwise equivalent prior art reverse combination of an n-channel SCIGFET and a p-channel CJIGFET as occurs with the high-voltage IGFETs in Nishida et al.

When the further p-channel IGFET in the present complementary CJIGFET structure is implemented as a channel-junction device, channel-zone-defining p-type semiconductor dopant is introduced into the semiconductor body to define a p-type region that includes a p-type channel zone for the further p-channel IGFET. The p-type dopant introduction is performed in such a manner that the p-type channel zone of the channel-junction-implemented further p-channel IGFET extends between, and is more lightly doped than, its source/drain zones. Due to the 90% 1/f noise reduction achieved with the n-channel CJIGFET, the 1/f noise incurred by the combination of the n-channel CJIGFET and the further p-channel IGFET, whether implemented as a surface-channel or channel-junction device, in the complementary-IGFET structure of the invention is at least 90% less than that incurred by the above-mentioned prior art combination of an n-channel SCIGFET and a p-channel CJIGFET.

The channel and source/drain zones of the n-channel CJIGFET are preferably largely defined with arsenic, an n-type semiconductor dopant that diffuses slowly compared to boron, the typical p-type counterpart. This enables the CJIGFET's channel and source/drain zones to be made quite shallow and to remain quite shallow throughout subsequent elevated-temperature processing steps as other desirable characteristics are achieved for the n-channel CJIGFET.

In short, the present invention achieves a very large noise reduction. Fabrication of the complementary-IGFET structure of the invention is straightforward and does not require complicated processing steps. Accordingly, the invention provides a large advance over the prior art.

BRIEF DESCRIPTION OF THE DRAWINGS

FIGS. 3.1 and 3.2 are cross-sectional side structural views of two portions of a complementary-IGFET structure configured according to the invention.

FIGS. 12$a$-12$o$ apply to the structural portions illustrated in both of FIGS. 3.1 and 3.2. FIGS. 12$p$.1-12$x$.1 illustrate further steps leading to the structural portion of FIG. 3.1. FIGS. 12$p$.2-12$x$.2 illustrate further steps leading to the structural portion of FIG. 3.2.

Like reference symbols are employed in the drawings and in the description of preferred embodiments to represent the same, or very similar, item or items.

DESCRIPTION OF THE PREFERRED EMBODIMENTS

Reference Notation and Other Conventions

Figure 1:
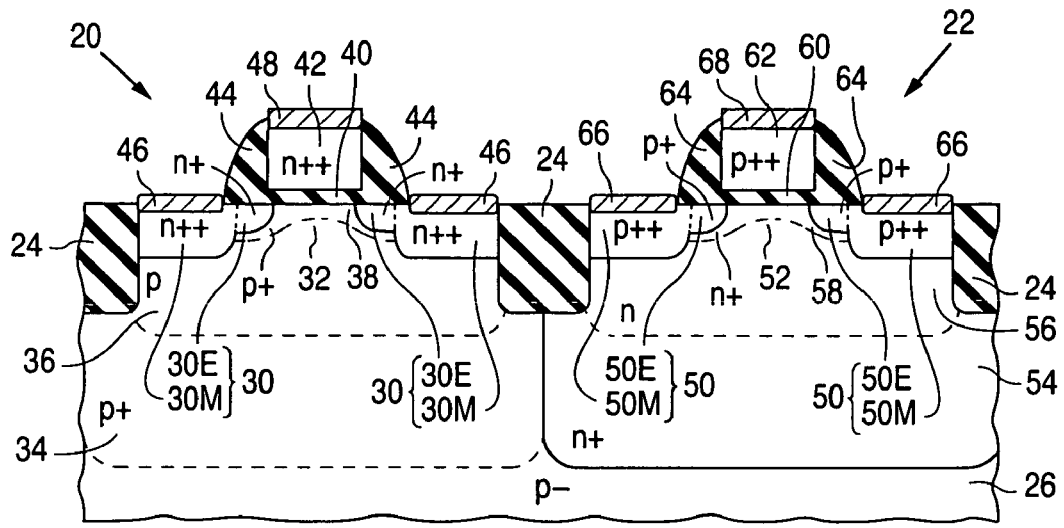
FIGS. 1 and 2 are cross-sectional side structural views of prior art complementary-IGFET structures.
Figure 2:
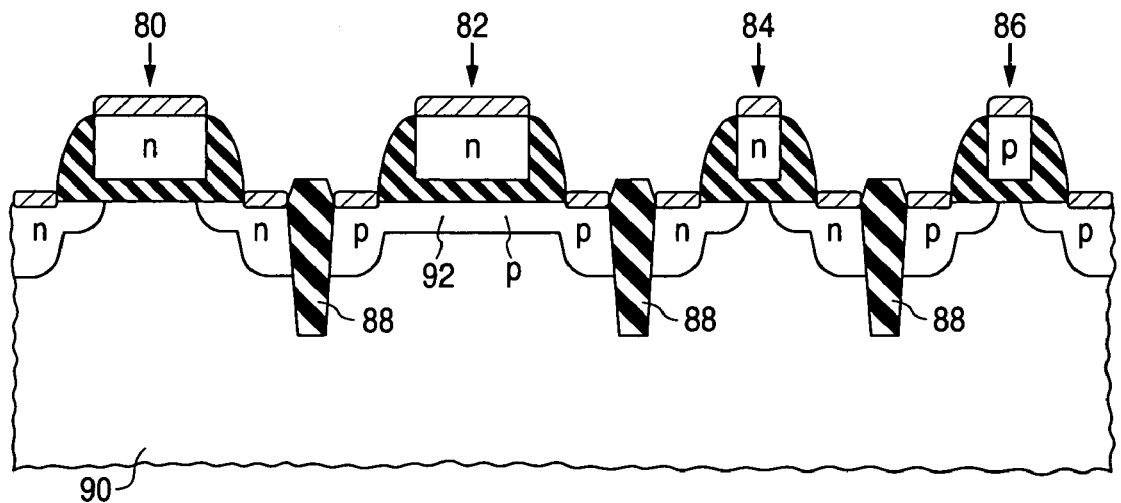

The reference symbols employed below and in the drawings have the following meanings:

| | |
|---|---|
| $C_{GD}$ = | gate dielectric capacitance per unit area |
| $DOSE_{NPOLY}$ = | areal dosage of ions of n-type polysilicon gate-electrode dopant |
| $DOSE_{PPOLY}$ = | areal dosage of ions of p-type polysilicon gate-electrode dopant |
| $E_{GD}$ = | transversal electric field in gate dielectric layer |
| $E_{ST}$ = | transversal electric field at surface of channel zone at threshold condition |
| f = | frequency |
| h = | Planck's constant |
| L = | channel length along upper semiconductor surface |
| $m_0$ = | free electron mass |
| $m^*$ = | density-of-states effective mass of charge carriers in gate dielectric layer |
| M = | empirical parameter |
| $M_A$ = | number of azimuthal angles |
| n = | non-ideality factor |
| $N_B$ = | uniform net dopant concentration in body material |
| $N_{B0}$ = | background dopant concentration in body material |
| $N_C$ = | uniform net dopant concentration in channel zone |
| $N_{C0}$ = | net dopant concentration at upper surface of channel zone |
| $N_N$ = | local net dopant concentration |
| $N_{NPOLY}$ = | uniform net dopant concentration in n-type polysilicon gate electrode material |
| $N_{NSDMAX}$ = | maximum net dopant concentration in n-type source/drain zones |
| $N_{POLY}$ = | uniform net dopant concentration in general polysilicon gate electrode |
| $N_{PPOLY}$ = | uniform net dopant concentration in p-type polysilicon gate electrode material |
| $N_{PSDMAX}$ = | maximum net dopant concentration in p-type source/drain zones |
| $P_t$ = | Fowler-Nordheim tunneling probability |
| q = | electronic charge |
| $S_{VG}$ = | power spectral density of gate voltage noise |
| $t_{GD}$ = | thickness of gate dielectric layer |
| $t_{POLY}$ = | thickness of polysilicon material of gate electrode |
| $V_T$ = | general threshold voltage |
| $V_{T0}$ = | long-channel threshold voltage |
| W = | channel width along upper semiconductor surface |
| y = | depth into semiconductor body measured from upper semiconductor surface |
| $y_J$ = | junction depth of channel zone in CJIGFET |
| $y_{JMAX}$ = | maximum junction depth for metallurgical-channel operation |
| $y_{JMIN}$ = | minimum junction depth for normally off metallurgical-channel operation |
| $\epsilon_{GD}$ = | dielectric constant of gate dielectric material |
| $\epsilon_{SC}$ = | dielectric constant of semiconductor material |
| $\Phi_B$ = | energy barrier for injection of charge carriers from semiconductor material into gate dielectric layer |

No particular channel-length value generally separates the short-channel and long-channel regimes of IGFET operation or generally distinguishes a short-channel IGFET from a long-channel IGFET. A short-channel IGFET, or an IGFET operating in the short-channel regime, is simply an IGFET whose characteristics are significantly affected by short-channel effects. A long-channel IGFET, or an IGFET operating in the long-channel regime, is the converse of a short-channel IGFET. While the channel length value of approximately 0.4 mm roughly constitutes the boundary between the short-channel and long-channel regimes for the background art example of FIG. 1, the long-channel/short-channel boundary can occur at a higher or lower value of channel length depending on various factors such as gate dielectric thickness, minimum printable feature size, channel zone dopant concentration, and source/drain-body junction depth.

IGFETs in a particular integrated circuit are manufactured according to a manufacturing process which employs lithographic design rules characterized by a length parameter that constitutes the minimum printable feature size for those design rules. For instance, the minimum printable feature size for 0.18-μm design rules is approximately 0.18 μm. The channel length of a short-channel IGFET often approximately equals the minimum printable feature size for the design rules utilized in manufacturing that IGFET.

As the minimum feature size of the lithographic design rules is decreased, e.g., from 0.18 μm to 0.13 μm and then to 0.09 μm, certain IGFET dimensions are scaled down. The dopant concentrations in the various IGFET semiconductor regions are adjusted according to the scaled-down IGFET dimensions.

Basic Complementary-IGFET Structure Configured According to Invention

The present invention furnishes a complementary-IGFET semiconductor technology suitable for integrated circuits, such as mixed-signal devices having both analog and digital circuitry, which utilize complementary IGFETs that operate across two different voltage ranges. FIGS. 3.1 and 3.2 (collectively "FIG. 3") illustrate two portions of an example of a complementary-IGFET structure which employs the complementary-IGFET technology of the invention. The complementary-IGFET structure of FIG. 3 contains a short-channel normally off n-channel surface-channel IGFET 100, a short-channel normally off p-channel surface-channel IGFET 102, a long-channel normally off n-channel channel-junction IGFET 104, and a long-channel normally off p-channel surface-channel IGFET 106.

IGFETs 100, 102, 104, and 106 are situated along a major surface of a doped monosilicon semiconductor body. This surface is, for convenience, generally referred to here as the upper surface of the semiconductor body or simply the upper semiconductor surface. A recessed field region of electrically insulating material, typically primarily silicon oxide, extends into the upper semiconductor surface to define a group of laterally separated active semiconductor regions.

The field-insulating region in FIG. 3 is typically constituted the same as field-insulating region 24 in FIG. 1 and, for convenience, is identified by reference symbol 24 even though the field-insulating regions of FIGS. 1 and 3 are invariably of different lateral configuration. Each of IGFETs 100, 102, 104, and 106 is specifically formed along the upper semiconductor surface at the location of a different one of the active semiconductor regions. Similar to FIG. 1, item 26 in FIG. 3 indicates the lightly doped p-type monosilicon material remaining after IGFETs 100, 102, 104, and 106 are created.

Subject to being laterally separated by field insulation 24, complementary IGFETs 100 and 102 are otherwise depicted in FIG. 3.1 as being laterally adjacent to each other. The same applies to complementary IGFETs 104 and 106 in FIG. 3.2. This lateral arrangement of IGFETs 100, 102, 104, and 106 is only for convenience in illustration. Subject to being laterally separated by field insulation 24, each IGFET 100, 102, 104, or 106 may be laterally adjacent to any other IGFET 100, 102, 104, or 106 or/and to a like-configured version of itself.

The complementary-IGFET structure of FIG. 3 may include circuit elements other than IGFETs 100, 102, 104, and 106. For instance, the complementary-IGFET structure may include a long-channel version of n-channel SCIGFET 100, a long-channel version of p-channel SCIGFET 102, a short-channel version of normally off n-channel CJIGFET 104, or/and a short-channel version of p-channel SCIGFET 106. The complementary-IGFET structure may also include one or more normally on channel-junction IGFETs of the n-channel or/and p-channel type. Various types of resistors, capacitors, and inductors may be provided in the complementary-IGFET structure of FIG. 3.

IGFETs 100 and 102 operate across the lower of the two operating voltage ranges and are often referred to here as low-voltage ("LV") devices. In complementary fashion, IGFETs 104 and 106 are often referred to as high-voltage ("HV") devices. Because HV IGFETs 104 and 106 operate across the higher voltage range, IGFETs 104 and 106 are of greater gate dielectric thickness than LV IGFETs 100 and 102.

LV SCIGFETs 100 and 102 are respectively largely identical to SCIGFETs 20 and 22 shown in FIG. 1 and described in U.S. Pat. No. 6,548,842 B1, cited above, the contents of which are incorporated by reference herein. For convenience, the constituents of IGFETs 100 and 102, including the underlying doped semiconductor regions, are respectively identified by the reference symbols employed to identify the corresponding constituents of IGFETs 20 and 22, including the corresponding underlying doped semiconductor regions.

The operating voltage range for LV IGFETs 100 and 102 is typically 1.0-1.8 V. The length of channel zone 32 or 52 of IGFET 100 or 102 is 0.09-0.25 μm, typically 0.18 μm for 0.18-μm lithographic design rules. Taking note of the fact that n-channel IGFET 100 has a positive threshold voltage while p-channel IGFET 102 has a negative threshold voltage, the magnitude (again, absolute value) of the threshold voltage for each IGFET 100 or 102 is normally 0.4-0.6 V, typically 0.5 V, at a typical 0.18-μm channel length. For the long-channel version of IGFET 100 or 102, the channel length is at least 0.25 μm, typically 0.50 μm for 0.18-μm design rules.

N-type source zones 30 of n-channel LV SCIGFET 100 are situated in one of the active semiconductor regions along the upper semiconductor surface. IGFET 100 also contains p-type channel zone 32, p+ halo region 38, gate dielectric layer 40, n++ polysilicon gate electrode 42, gate sidewalls spacers 44, source/drain silicide layers 46, and gate-electrode silicide layer 48 as described above for IGFET 20. IGFET 100 has a p-type body region, referred to here generally as the p-type device body material, consisting of p+ well portion 34, p upper portion 36, and p+ halo region 38. Channel zone 32 consists of the p-type material situated between n-type source/drain zones 30 and is thus formed with halo region 38 and part of upper body-material portion 36.

P-type source/drain zones 50 of p-channel LV SCIGFET 102 are situated in another of the active semiconductor regions along the upper semiconductor surface. IGFET 102 also contains n-type channel zone 52, n+ halo region 58, gate dielectric layer 60, p++ polysilicon gate electrode 62, gate sidewalls spacers 64, source/drain silicide layers 66, and gate-electrode silicide layer 68 as described above for IGFET 22. IGFET 102 has an n-type body region, referred to here generally as the n-type device body material, consisting of n+ well portion 54, n upper portion 56, and n+ halo region 58. Channel zone 52 consists of the n-type material situated p-type source/drain zones 50 and is therefore formed with halo region 58 and part of upper body-material portion 56.

Halo region 38 is defined in p-type channel zone 32 of LV IGFET 100 by introducing a p-type semiconductor dopant, referred to here as the p-type (LV) halo dopant, into at least the location for a portion of channel zone 32. Halo region 58 is similarly defined in n-type channel zone 52 of LV IGFET 102 by introducing an n-type semiconductor dopant, referred to here as the n-type (LV) halo dopant, into at least the location for a portion of channel zone 52. As described below, introduction of the p-type and n-type halo dopants respectively into the locations for portions of channel zones 32 and 52 to form halo regions 38 and 58 is typically done by angled ion implantation subsequent to defining the shapes of gate electrodes 42 and 62.

The presence of p+ halo region 38 in n-channel IGFET 100 causes the net dopant concentration in channel zone 32 at the upper semiconductor surface to reach a local surface minimum in the longitudinal direction, i.e., along the channel length, at a location between source/drain zones 30. The presence of n+ halo region 58 in p-channel IGFET 102 similarly causes the net dopant concentration in channel zone 52 at the upper semiconductor surface to reach a local surface minimum in the longitudinal direction at a location between source/drain zones 50. The local surface minimum in the net surface dopant concentration of channel zone 32 or 52 normally occurs approximately at the channel center, i.e., approximately halfway between source/drain zones 30 or 50. The net dopant concentration in channel zone 32 or 52 at the upper semiconductor surface reaches a local surface maximum in the longitudinal direction at a location close to each source/drain zone 30 or 50. The profile of the net surface dopant concentration in channel zone 32 or 52 along a vertical plane extending between source/drain zones 30 or 50 is thus shaped generally like a saddle in its longitudinal profile.

The long-channel version of each LV IGFET 100 or 102 receives the respective p-type or n-type halo dopant in the same manner as IGFET 100 or 102. The length of the channel zone in the long-channel version of IGFET 100 or 102 is sufficiently great that halo region 38 or 58 is replaced with a pair of laterally separated halo pocket portions. One of the halo pocket portions extends around one of the source/drain extensions (30E or 50E) to meet the associated main source/drain portion (30M or 50M). The other halo pocket extends around the other source/drain extension (30E or 50E) to meet the other main source/drain portion (30M or 50M). The long-channel version of IGFET 100 or 102 is otherwise configured the same as IGFET 100 or 102. Hence, the long-channel version of IGFET 100 or 102 appears as shown in FIG. 3.1 except that the length of channel zone 32 or 52 is sufficiently great that halo region 38 or 58 splits into two separate halo pockets.

The amount of p-type or n-type halo dopant utilized, per unit width of channel zone 32 or 52, to define halo region 38 or 58 in IGFET 100 or 102 is approximately equal to the amount of p-type or n-type halo dopant utilized, per unit channel width, to define the two p-type or n-type halo pockets in the long-channel version of IGFET 100 or 102. The upper-surface dopant profile in channel zone 32 or 52 of IGFET 100 or 102 is thus defined by approximately the same amount of p-type or n-type halo dopant as the upper-surface dopant profile in channel zone 32 or 52 in the long-channel version of IGFET 100 or 102.

The p-type halo dopant increases the average net dopant concentration in channel zone 32 of IGFET 100. The n-type halo dopant similarly increases the average net dopant concentration in channel zone 52 of IGFET 102. Inasmuch as IGFETs 100 and 102 are of lesser channel length than their long-channel versions, the p-type and n-type halo dopants cause the average net dopant concentration in channel zones 32 and 52 to increase as their channel lengths decrease. By suitably choosing the amount of p-type or n-type halo dopant, the increase in the average net dopant concentration in channel zone 32 or 52 with decreasing channel length causes short-channel threshold voltage roll-off to be shifted to lower channel length.

The source-to-drain drive current in an IGFET generally increases with decreasing channel length. Because the usage of halo regions 38 and 58 causes threshold-voltage roll-off to be reduced to lower channel length, LV IGFETs 100 and 102 can be designed to have reduced channel length while still having threshold voltages whose magnitude is relatively stable despite changes in IGFET characteristics, especially channel length, due to normal fabrication variations. For example, IGFETs 100 and 102 can readily be provided at channel length at least as little as 0.09 µm using 0.09-µm lithographic design rules. IGFETs 100 and 102 thereby have increased drive current making them especially suitable for many types of digital circuitry.

Upper body-material portions 36 and 56, in respective combinations with halo regions 38 and 58, help alleviate punchthrough in LV SCIGFETs 100 and 102. P upper region 36 for IGFET 100 is defined by providing the semiconductor body with an ion-implanted p-type semiconductor dopant, referred to here as the p-type LV anti-punchthrough ("APT") dopant, that causes the net dopant concentration in the p-type device body material for IGFET 100 to reach a primary local subsurface maximum in portion 36 at a depth typically no more than 0.4 µm below the upper semiconductor surface when the channel length of IGFET 100 is defined according to lithographic design rules whose minimum printable feature size is 0.25 µm or less, e.g., 0.18 µm. N upper portion 56 for IGFET 102 is similarly defined by providing the semiconductor body with an ion-implanted n-type semiconductor dopant, referred to here as the n-type LV APT dopant, that causes the net dopant concentration in the n-type device body material for IGFET 102 to reach a primary local subsurface maximum in portion 58 at a depth likewise typically no more than 0.4 µm below the upper semiconductor surface when the channel length of IGFET 102 is defined according to the same design rules.

The primary local subsurface maxima in the net dopant concentrations of the body materials for IGFETs 100 and 102 normally occur more than 0.1 µm below the upper semiconductor surface, preferably 0.15-0.35 µm below the upper semiconductor surface, typically 0.2 µm below the upper semiconductor surface. The net dopant concentrations in channel zones 32 and 52 are sufficiently high that the surface depletion regions which respectively extend into zones 32 and 52 during IGFET operation are not more than 0.1 µm thick. For instance, the thickness of the channel surface depletion region in channel zone 32 or 52 is normally 0.04-0.06 µm, typically 0.05 µm. As produced by the p-type and n-type LV APT dopants, upper body-material portions 36 and 56 thereby reach maximum net dopant concentrations respectively below the channel surface depletion regions in channel zones 32 and 52 at a depth normally more than 0.1 µm below the upper semiconductor surface but typically not more than 0.4 µm below the upper semiconductor surface.

A depletion region (not shown) extends along the pn junction between each source/drain zone 30 or 50 and the adjoining body material of upper body-material portion 36 or 56 during IGFET operation. The p-type LV APT dopant causes the average net dopant concentration in channel zone 32 of IGFET 100 to be considerably increased. The n-type LV APT dopant similarly causes the average net dopant concentration in channel zone 52 of IGFET 102 to be considerably increased. By so elevating the net dopant concentrations in channel zones 32 and 52 and by positioning the p-type and n-type LV APT dopants in the manner described above, the thickness of the body-side portion of each of these source/drain-body junction depletion regions is reduced considerably at any given value of drain-to-source voltage. As a result, the p-type LV APT dopant inhibits source/drain zone 30 which acts as the drain (at any particular time) from punching through to the other source/drain zone 30. The n-type LV APT dopant similarly inhibits drain-acting source/drain zone 50 from punching through to the other source/drain zone 50.

P+ well portion 34 is defined for IGFET 100 by providing the semiconductor body with an ion-implanted p-type semiconductor dopant, referred to here as the p-type LV well dopant, that causes the net dopant concentration in the p-type device body material for IGFET 100 to reach a further local subsurface maximum in well 34 and thus below the location of the net dopant concentration's primary local subsurface maximum in upper body-material portion 36. N+ well portion 54 is similarly defined for IGFET 102 by providing the semiconductor body with an ion-implanted n-type semiconductor dopant, referred to here as n-type LV well dopant, that causes the net dopant concentration in the n-type device body material for IGFET 102 to reach a further local subsurface maximum in well 54 and thus below the location of the net dopant concentration's primary local subsurface maximum in upper body-material portion 56. The further local subsurface maxima in the net dopant concentration of the body materials for IGFETs 100 and 102 normally occur 0.4-0.8 µm, typically 0.6 µm, below the upper semiconductor surface, again when the channel lengths of IGFETs 100 and 102 are defined according to lithographic design rules whose minimum printable feature size is 0.25 µm or less, e.g., 0.18 µm.

HV CJIGFET 104 has a pair of laterally separated n-type source/drain zones 110 provided in a third of the active semiconductor regions along the upper semiconductor surface. Each n-type surface-adjoining source/drain zone 110 consists of a very heavily doped main portion 110M and a more lightly doped lateral extension 110E. Although more lightly doped than main source/drain portions 110M, source/drain extensions 110E are still heavily doped n-type. A moderately doped n-type channel zone 112 extends between source/drain zones 110, specifically between n+ extensions 110E. N channel zone 112 forms a pn junction with a p-type body region, referred to here generally as the p-type device body material, for IGFET 104. The p-type device body material also forms a pn junction with each n-type source/drain zone 110. The three pn junctions join together to form a composite pn junction.

The p-type device body material for IGFET 104 consists of a heavily doped well portion 114 and a moderately doped upper portion 116. P+ well portion 114 merges junctionlessly into p− material 26. P upper body-material portion 116 merges into well portion 114 and meets source/drain zones 110 and channel zone 112 to form the composite pn junction. Unlike IGFET 100, the p-type device body material for IGFET 104 does not include any halo-type region more heavily doped p-type than upper body-material portion 116 and extending around either n+ source/drain extension 110E.

A gate dielectric layer 120 lies on channel zone 112. A gate electrode 122 consisting of very heavily doped p-type polysilicon lies on gate dielectric layer 120 above channel zone 112. P++ gate electrode 122 extends laterally over part of each source/drain zone 110, specifically over part of each extension 110E. A pair of electrically insulating sidewall spacers 124 are respectively situated along the opposite transverse sidewalls of gate electrode 122. A metal silicide layer 126 is situated along the top of each main source/drain portion 110M. A further metal silicide layer 128 is situated along the top of gate electrode 122.

HV CJIGFET 104 operates as a normally off device with either a metallurgical channel (often simply "MC") or a field-induced channel (often simply "FIC") depending on various factors such as the thickness (depth) of channel zone 112, the thickness of gate dielectric layer 120, and the net dopant concentrations in n channel zone 112, p+ well 114, p upper body-material portion 116, and p++ gate electrode 122. One of source/drain zones 110 acts as the source (at any particular time) while the other source/drain zone 110 acts as the drain. To understand the MC and FIC embodiments, assume that the drain voltage of IGFET 104 exceeds its source voltage since IGFET 104 is an n-channel device. As a normally off device, n-channel IGFET 104 has a positive threshold voltage.

In an MC embodiment of IGFET 104, a surface depletion region (not shown) extends from the upper semiconductor surface into n channel zone 112 from source to drain. A junction depletion region (not shown) extends along the pn junction between channel zone 112 and p upper body-material portion 116 from source to drain. When the gate-to-source voltage of IGFET 104 is greater than or equal to its positive threshold voltage, a subsurface channel of non-depleted n-type material extends between the channel surface depletion region and the channel-side portion of the junction depletion region from source to drain. Current flows between the source and drain by way of this subsurface metallurgical channel. IGFET 104 is turned on.

Reducing the gate-to-source voltage of IGFET 104 to a value, e.g., zero, below its threshold voltage causes the channel surface depletion region to merge with the junction depletion region, specifically the channel-side portion, at least at a location along the drain. The subsurface metallurgical channel is broken so that current can no longer flow between the source and drain. IGFET 104 turns off. The threshold voltage for an MC embodiment of IGFET 104 is normally 0.1-1.0 V, typically 0.5 V. The thickness of channel zone 112 for the MC embodiment is normally 0.05-0.15 µm, typically 0.1 µm.

In an FIC embodiment of IGFET 104, an electrically conductive channel extending from source to drain is induced in a layer of channel zone 112 along the upper semiconductor surface when the gate-to-source voltage of CJIGFET 104 is greater than or equal to its positive threshold voltage. The induced surface channel consists of electrons attracted to the upper surface of channel zone 112 by the transversal electric field that results from the gate-to-source voltage being greater than or equal to the threshold voltage. Current flows between the source and drain by way of the induced surface channel. IGFET 104 is turned on. A depletion region extending along the pn junction between n channel zone 112 and p upper body-material portion 116 occupies the remainder of channel zone 112, i.e., from the induced surface channel to the channel-zone/body pn junction. In effect, an electron surface channel is induced at the top of the depletion region.

Reducing the gate-to-source voltage of IGFET 104 to a value, e.g., zero, below its positive threshold voltage during operation in an FIC embodiment causes the induced surface channel to disappear. The depletion region extending along the pn junction between channel zone 112 and upper body-material portion 116 now occupies all of channel zone 112. IGFET 104 turns off. The threshold voltage for an FIC embodiment of IGFET 104 is normally 0.7-0.12 V, typically 0.9 V. The thickness of channel zone 112 for the FIC embodiment is normally 0.03-0.08 µm, typically 0.05 µm.

P upper body-material portion 116 helps alleviate punch-through in HV CJIGFET 104. P upper portion 116 is defined by providing the semiconductor body with an ion-implanted p-type semiconductor dopant, referred to here as the p-type HV APT dopant, that causes the net dopant concentration in the p-type device body material for IGFET 104 to reach a primary local subsurface maximum in portion 116 at a location below channel zone 112 but typically not more than 0.6 µm below the upper semiconductor surface when the channel length of IGFET 104 is defined according to lithographic design rules whose minimum printable feature size is 0.25 µm or less, e.g., 0.18 um. The primary local subsurface maximum in the net dopant concentration of the body material for IGFET 104 normally occurs more than 0.2 µm below the upper semiconductor surface, preferably 0.25-0.4 µm below the upper semiconductor surface, typically 0.3 µm below the upper semiconductor surface.

A depletion region (not shown) extends along the pn junction between each n-type source/drain zone 110 and p upper body-material portion 116. The p-type LV APT dopant causes the average net dopant concentration in the p body material situated between source/drain zones 110 below n channel zone 112 to be increased considerably. By so elevating the net dopant concentration in this part of p body material portion 116 and by positioning the p-type HV APT dopant in the foregoing manner, the thickness of the body-side portion of each of these source/drain-body depletion regions is reduced considerably at any given value of the voltage between source/drain zones 110. As a result, the p-type HV APT dopant inhibits source/drain zone 110 acting as the drain (at any particular time) from punching through the p-type body material below channel zone 112 and reaching the other source/drain zone 110.

P+ well 114 for HV CJIGFET 104 is defined by providing the semiconductor body with an ion-implanted p-type semiconductor dopant, referred to here as the p-type HV well dopant, that causes the net dopant concentration in the p-type device body material for IGFET 104 to reach a further local subsurface maximum in well 114 and thus below the location of the net dopant concentration's primary subsurface maximum in upper body-material portion 116. The further local subsurface maximum in the net dopant concentration of the body material for IGFET 104 normally occurs 0.4-1.0 µm, typically 0.7 µm, below the upper semiconductor surface, again when the channel length of IGFET 104 is defined according to lithographic design rules whose minimum printable feature size is 0.25 µm or less, e.g., 0.18 µm.

HV SCIGFET 106 has a pair of laterally separated p-type source/drain zones 130 provided in a fourth of the active semiconductor regions along the upper semiconductor surface. Each p-type surface-adjoining source/drain zone 130 consists of a very heavily doped main portion 130M and a more lightly doped, but still heavily doped, lateral extension 130E. An n-type channel zone 132 extends between source/drain zones 130, primarily between n+ extensions 130E. Channel zone 132 is part of an n-type body region, referred to here generally as the n-type device body material, for IGFET 106. The n-type device body material forms a pn junction with each n-type source/drain zone 130.

The n-type device body material for IGFET 106 consists of a heavily doped well portion 134 and an upper portion 136. N+ well portion 134 adjoins p– material 26 to form a pn junction. N upper body-material portion 136 merges into well portion 134 and meets each p-type source/drain zone 130 to form a source/drain-body pn junction. Channel zone 132 consists of the n-type material situated between source/drain zones 130 and is thus formed by part of upper body-material portion 136. Unlike IGFET 102, the n-type device body material for IGFET 106 does not include any halo-type region more heavily doped n-type than upper body-material portion 136 and extending around either p+ source/drain extension 130E.

A gate dielectric layer 140 lies on channel zone 132. A gate electrode 142 consisting of very heavily doped p-type polysilicon lies on gate dielectric layer 140 above channel zone 132. P++ gate electrode 142 extends laterally over part of each source/drain zone 130, specifically over part of each extension 130E. A pair of electrically insulating sidewall spacers 144 are respectively situated along the opposite transverse sidewalls of gate electrode 142. A metal silicide layer 146 is situated along the top of each main source/drain portion 130M. A further metal silicide layer 148 is situated along the top of gate electrode 142.

N upper body-material portion 136 helps alleviate punch-through in HV SCIGFET 106. N upper portion 136 is defined by providing the semiconductor body with an ion-implanted n-type semiconductor dopant, referred to here as the n-type HV APT dopant, that causes the net dopant concentration in the n-type device body material for IGFET 106 to reach a primary local subsurface maximum in portion 136 at a location below a channel surface depletion region that extends into channel zone 132 along the upper semiconductor surface during IGFET operation but typically not more than 0.6 µm below the upper semiconductor surface when the channel length of IGFET 106 is defined according to lithographic design rules whose minimum printable feature size is 0.25 µm or less, e.g., 0.18 um. The primary local subsurface maximum in the net dopant concentration of the body material for IGFET 106 normally occurs more than 0.2 µm below the upper semiconductor surface, preferably 0.25-0.4 µm below the upper semiconductor surface, typically 0.3 µm below the upper semiconductor surface.

The net dopant concentration in n channel zone 132 is sufficiently high that its channel surface depletion region is not more than 0.2 µm thick. For instance, the thickness of the channel surface depletion region in channel zone 132 is normally 0.1-0.2 µm, typically 0.15 µm. As produced by the n-type HV APT dopant, n upper body-material portion 136 thereby reaches a maximum net dopant concentration below the surface depletion region of channel zone 132 at a depth normally more than 0.2 µm below the upper semiconductor surface but typically not more than 0.6 µm below the upper semiconductor surface.

A depletion region (not shown) extends along the pn junction between each p-type source/drain zone 130 and n upper body-material portion 136. The n-type HV APT dopant causes the average net dopant concentration in channel zone 132 to be increased considerably. By so elevating the net dopant concentration in channel zone 132 and by positioning the n-type HV APT dopant in the manner described above, the thickness of the body-side portion of each of these source/drain-body depletion regions is reduced considerably at any given value of the voltage between source/drain zones 130. Consequently, the n-type HV APT dopant inhibits source/drain zone 130 acting as the drain (at any particular time) from punching through to the other source/drain zone 130.

N+ well portion 134 for HV SCIGFET 106 is defined by providing the semiconductor body with an ion-implanted n-type semiconductor dopant, referred to here as the n-type HV well dopant, that causes the net dopant concentration in the n-type device body material for IGFET 106 to reach a further local subsurface maximum in well 134 and thus at a location below the location of the net dopant concentration's primary local subsurface maximum in n upper body-material portion 136. The further local subsurface maximum in the net dopant concentration of the body material of IGFET 106 normally occurs 0.4-1.0 µm, typically 0.7 µm, below the upper semiconductor surface, again when the channel length of IGFET 106 is defined according to lithographic design rules whose minimum printable feature size is 0.25 µm or less, e.g., 0.18 µm.

The operating voltage range for HV IGFETs 104 and 106 is typically 3.3-5.0 V. Subject to each HV IGFET 104 or 106 being of greater channel length than each LV IGFET 100 or 102, the length of channel zone 112 or 132 of IGFET 104 or 106 is 0.25-2.0 µm, typically 1.0 µm, for 0.18-µm lithographic design rules. With IGFET 104 having a positive threshold voltage of 0.7-1.2 V, typically 0.9 V, as indicated above, IGFET 106 has a negative threshold voltage of −0.7-−1.2 V, typically −0.9 V.

The thickness of gate dielectric layers 40 and 60 of LV IGFETs 100 and 102 is normally 2-8 nm. The thickness of gate dielectric layers 120 and 140 of HV IGFETs 104 and 106 is normally 6-16 nm. Although the thickness range for gate dielectric layers 120 and 140 overlaps the thickness range for gate dielectric layers 40 and 60, the values of the gate dielectric thicknesses within these ranges for any particular implementation of IGFETs 100, 102, 104, and 106 are chosen such that gate dielectric layers 120 and 140 are thicker than, typically at least twice as thick as, gate dielectric layers 40 and 60. The thickness of gate dielectric layers 40 and 60 is preferably 3-5 nm, typically 3.5 nm for operation across a 1.8-V voltage range. The thickness of gate dielectric layers 120 and 140 is preferably 7-13 nm, typically 12 nm for operation across a 5.0-V voltage range.

Gate dielectric layers 40, 60, 120, and 140 normally contain oxygen and silicon. With no other element being present to a significant degree in layers 40, 60, 120, and 140, the silicon and oxygen form silicon oxide.

Gate dielectric layers 40 and 60 are, as described below, typically formed at the same time. When the polysilicon of gate electrode 62 of IGFET 102 is made p-type by very heavy doping with boron, nitrogen may be incorporated into gate dielectric layer 60 of IGFET 102 to inhibit boron in p++ gate electrode 62 from penetrating through gate dielectric 60 into channel zone 52 and causing undesired threshold-voltage shift in IGFET 102. In so doing, nitrogen is also incorporated into gate dielectric layer 40 of IGFET 100. Layers 40 and 60 then consist of silicon oxynitride.

Gate dielectric layers 120 and 140, which are considerably thicker than gate dielectric layers 40 and 60, are usually sufficiently thick that boron in gate electrodes 122 and 142 of IGFETs 104 and 106 does not penetrate significantly through layers 120 and 140 into channel zones 112 and 132 when gate electrodes 122 and 142 are made p-type by doping with boron. Although nitrogen can be incorporated into gate dielectric layers 120 and 140, so that they consist of silicon oxynitride, nitrogen is typically not incorporated into layers 120 and 140.

Metal silicide layers 46, 66, 126, 146, 48, 68, 128, and 148, typically consisting of cobalt silicide, facilitate making electrical contact respectively to source/drain zones 30, 50, 110, and 130 and gate electrodes 42, 62, 122, and 142. Electrode 42 and silicide layer 48 form a composite gate electrode 42/48 for IGFET 100. Electrode 62 and silicide layer 68 form a composite gate electrode 62/68 for IGFET 102. Electrode 122 and silicide layer 128 form a composite gate electrode 122/128 for IGFET 104. Electrode 142 and silicide layer 148 form a composite gate electrode 142/148 for IGFET 106.

Complementary-IGFET Structural Variations

The complementary-IGFET structure of FIG. 3 can be modified in various ways. FIGS. 4-7 illustrate four ways of modifying either the LV structural portion of FIG. 3.1 or the HV structural portion of FIG. 3.2. The IGFET elements and other structural components in the modifications of FIGS. 4-7 are identified with the same reference symbols used respectively for the corresponding IGFET elements and other structural components in FIG. 3 to the extent that the elements and components in FIGS. 4-7 are respectively the same or substantially the same as in FIG. 3.

Figure 4:
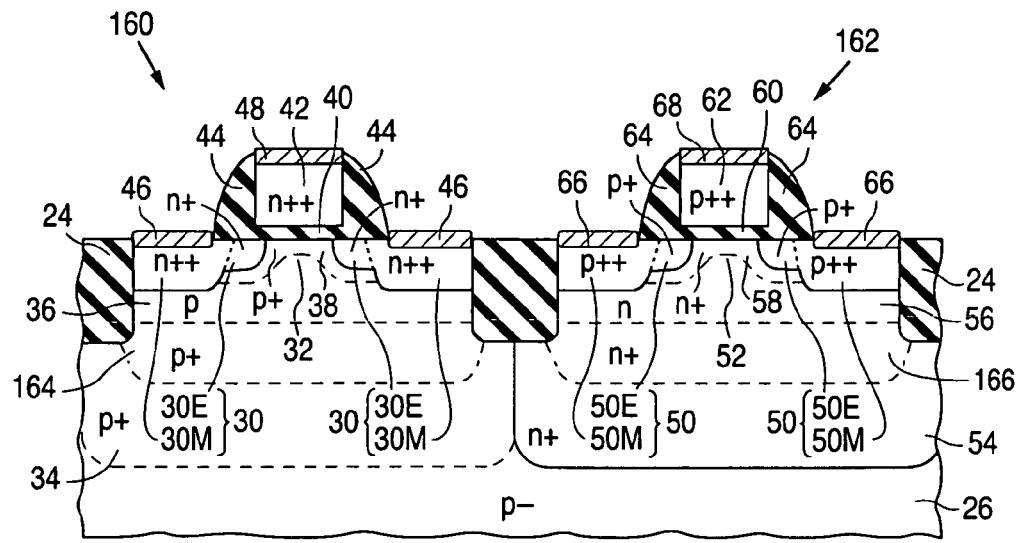
FIG. 4 is a cross-sectional side structural view of a variation, in accordance with the invention, of the complementary-IGFET structural portion of FIG. 3.1.

In FIG. 4, n-channel. LV SCIGFET 100 is replaced with a short-channel normally off n-channel LV surface-channel IGFET 160 whose p-type device body material is provided with an ion-implanted p-type semiconductor dopant, referred to here as the p-type LV isolation dopant, for flattening the vertical dopant profile between the primary (APT) and further (well) local subsurface maxima in the net dopant concentration of the p-type body material. P-channel LV SCIGFET 102 is similarly replaced with a short-channel normally off p-channel LV surface-channel IGFET 162 whose n-type device body material is provided with an n-type semiconductor dopant, referred to here as the n-type LV isolation dopant, for flattening the vertical dopant profile between the primary (APT) and further (well) local subsurface maxima in the net dopant concentration of the n-type body material. Although FIG. 4 depicts both of SCIGFETs 160 and 162, a modification of the complementary-IGFET structure of FIG. 3 may include one of IGFETs 100 and 102 and the complementary one of IGFETs 160 and 162, i.e., n-channel IGFET 100 and p-channel IGFET 162 or p-channel IGFET 102 and n-channel IGFET 160.

The p-type LV isolation dopant for IGFET 160 defines a heavily doped p-type intermediate body-material portion 164 that lies between, and merges into, p+ well portion 34 and p upper body-material portion 36. The n-type LV isolation dopant for IGFET 162 similarly defines a heavily doped n-type intermediate body-material portion 166 that lies between, and merges into, n+ well 54 and n upper body-material portion 56. While intermediate body-material portions 164 and 166 are described here as heavily doped, they could alternatively be described as moderately doped. P+ well portion 34 and p+ intermediate portion 164 form a composite p-type LV well 34/164 for IGFET 160. N+ well portion 54 and n+ intermediate portion 166 form a composite n-type LV well 54/166 for IGFET 162.

The p-type LV isolation dopant causes the net dopant concentration for the p-type device body material of IGFET 160 to reach, in intermediate body-material portion 164, an additional local subsurface maximum at a location between the locations for the primary (APT) and further (well) local subsurface maxima in the net dopant concentration for that p-type body material. The n-type LV isolation dopant similarly causes the net dopant concentration for the n-type device body material of IGFET 162 to reach, in intermediate body-material portion 166, an additional local subsurface maximum at a location between the locations for the primary (APT) and further (well) local subsurface maxima in the net dopant concentration for that n-type body material. The additional local subsurface maxima in the net dopant concentration for the body materials of IGFETs 160 and 162 each normally occur 0.3-0.5 μm below the upper semiconductor surface, typically 0.4 μm below the upper semiconductor surface, when the channel lengths of IGFETs 160 and 162 are defined according to lithographic design rules whose minimum printable feature size is 0.25 μm or less, e.g., 0.18 μm.

Intermediate body-material portions 164 and 166 function to eliminate weak regions where currently leakage can occur. In particular, the p-type LV isolation dopant helps isolate composite p-type LV well 34/164 from an adjacent n-type well so as to avoid well-to-well current leakage. The n-type LV isolation dopant helps isolate composite n-type LV well 54/166 from an adjacent p-type well, thereby likewise avoiding well-to-well current leakage.

Figure 5:
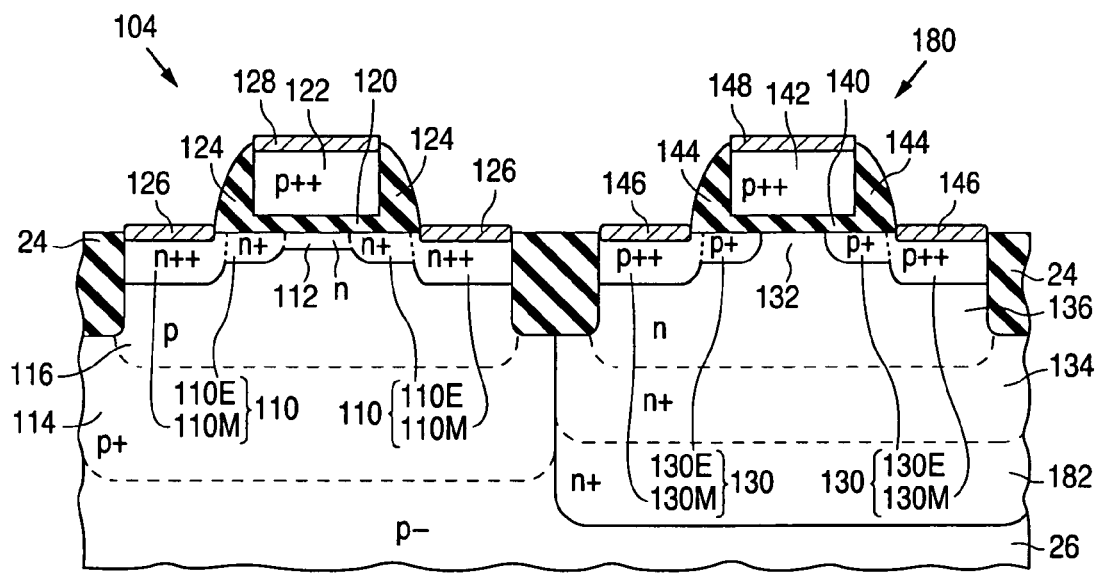
FIGS. 5-7 are cross-sectional side structural views of variations, in accordance with the invention, of the complementary-IGFET structural portion of FIG. 3.2.
Figure 5A:
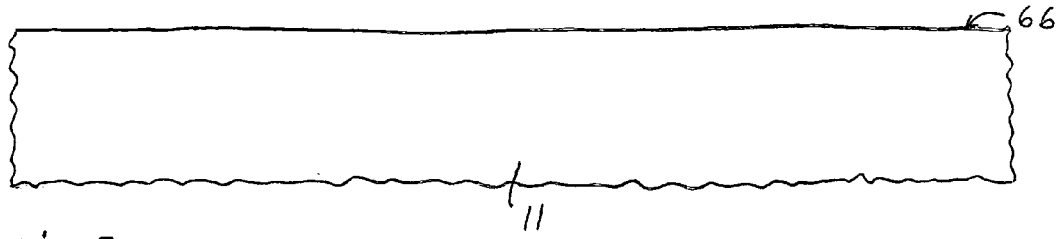
Figure 5B:
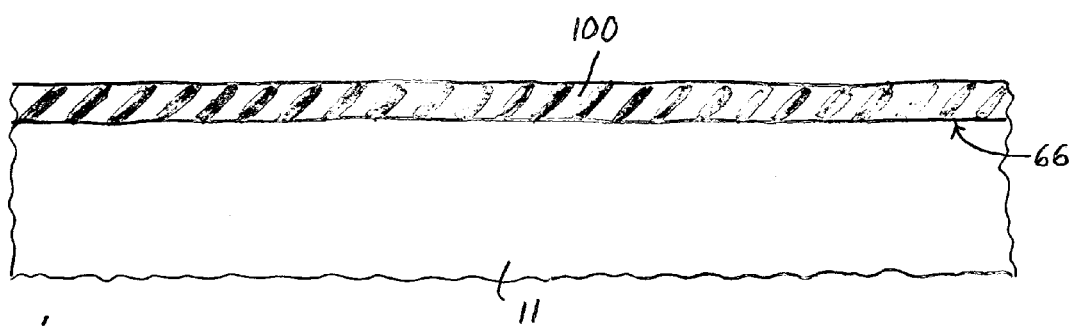
Figure 5C:
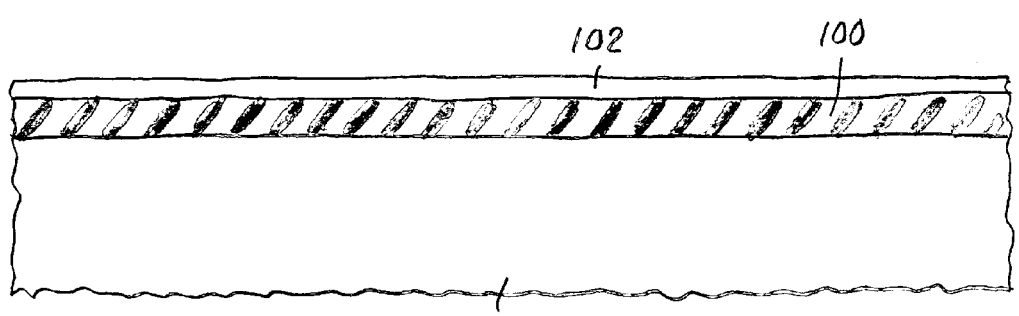
Figure 5D:
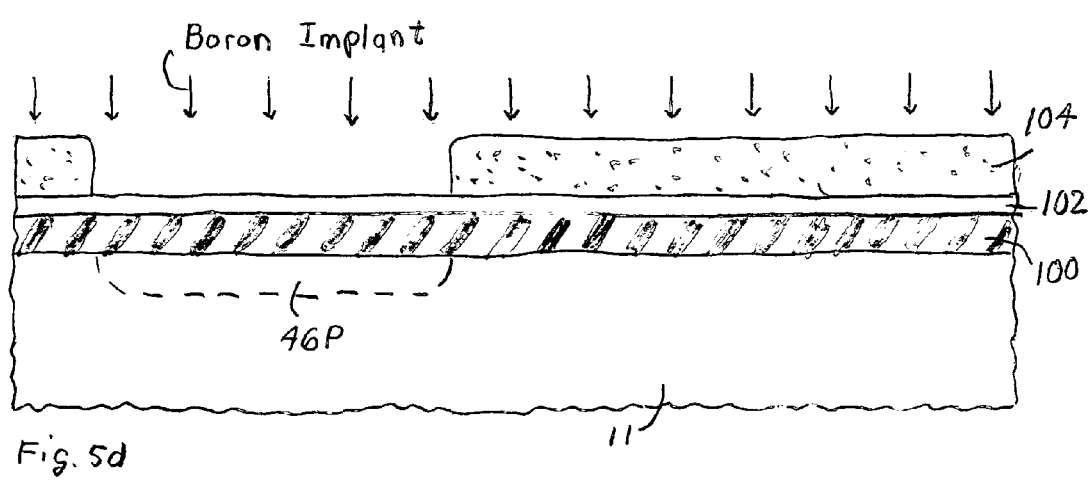
Figure 5E:
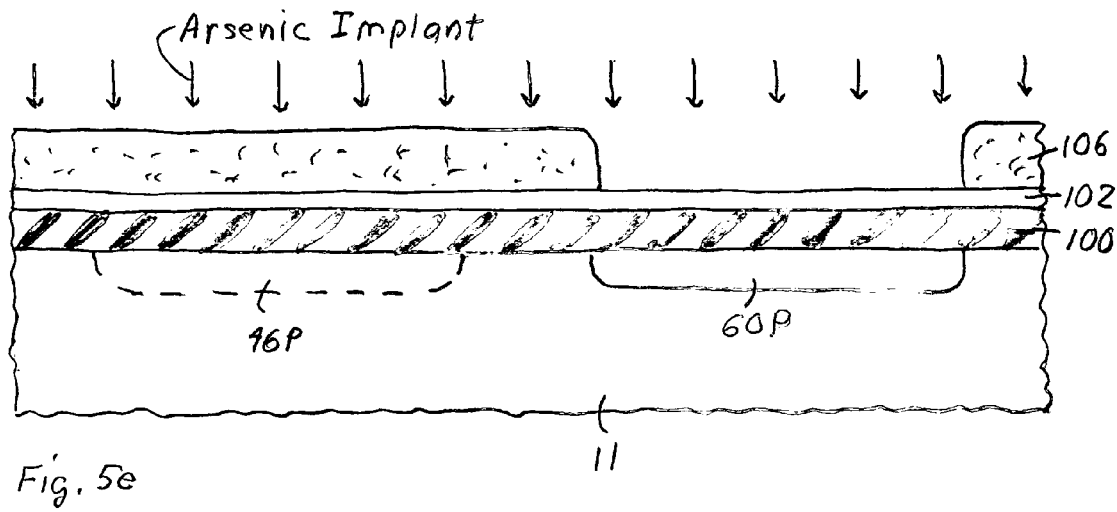
Figure 5F:
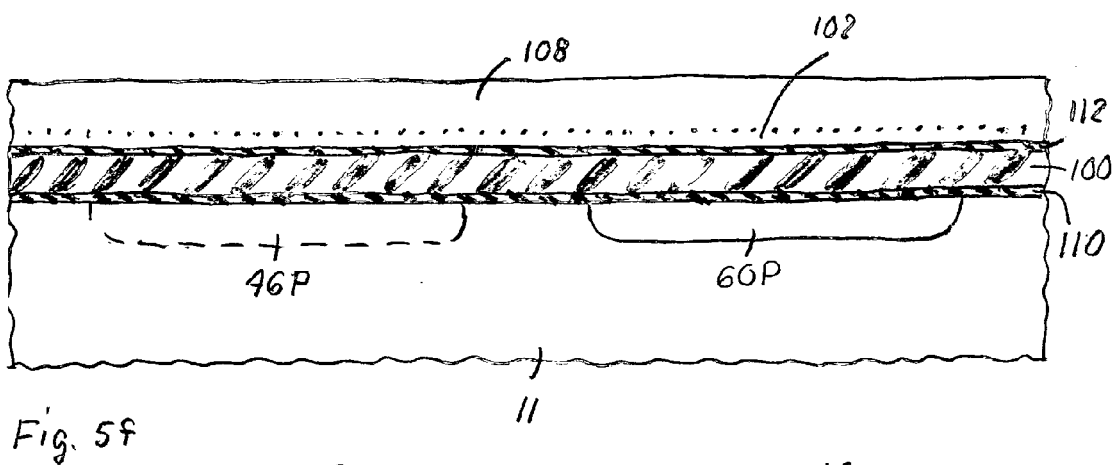
Figure 5G:
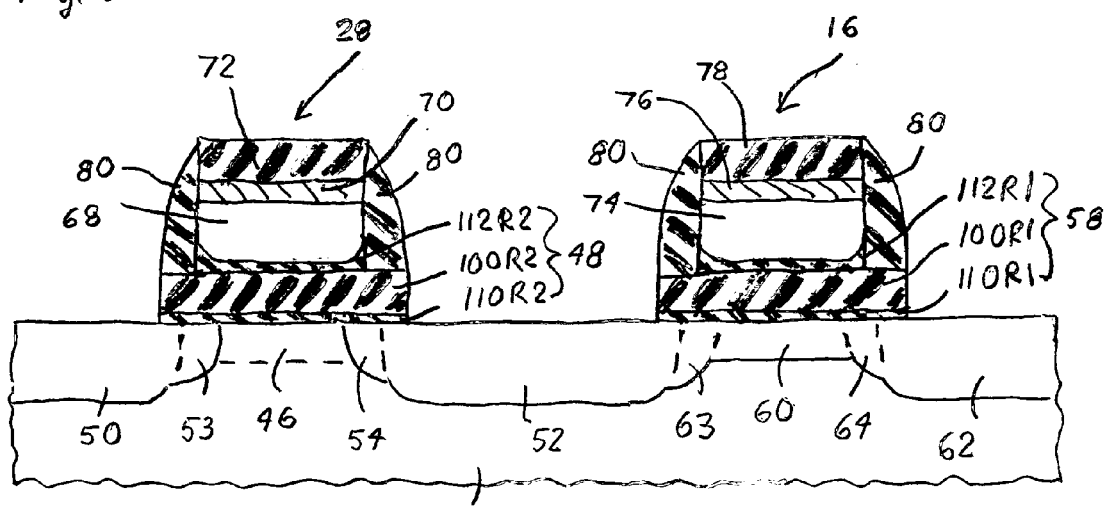

Referring to FIG. 5, p-channel HV SCIGFET 106 may be modified in some implementations to form a long-channel normally off p-channel HV surface-channel IGFET 180 whose n-type device body material is extended downward to include a heavily doped well portion 182. The present complementary-IGFET structure may thus include one or more implementations of HV SCIGFET 106 and one or more implementations of HV SCIGFET 180. N+ deep well portion 182 ensures that IGFET 180 is pn-junction isolated from p− material 26 and from p-type wells such as p+ well 114 of IGFET 104 or p+ well 34 of IGFET 100 or 160.

N+ well 134 constitutes a shallow well portion for IGFET 180, the n-type HV well dopant employed to form well 134 then being referred to as the n-type HV shallow well dopant for IGFET 180. Shallow well portion 134 and deep well portion 182 together form a composite heavily doped n-type well portion 134/182. N+ deep well 182 is defined by providing the semiconductor body with an n-type semiconductor dopant, referred to here as the n-type HV deep well dopant, that causes the net dopant concentration in the n-type device body material for IGFET 180 to reach, in deep well 182, an additional local subsurface maximum at a location below the location of the further (shallow well) subsurface maximum in the net dopant concentration of that n-type body material and thus also below the location of the primary (APT) subsurface maximum in the net dopant concentration of that n-type body material. The additional local subsurface maximum in the net dopant concentration of the n-type body material for IGFET 180 normally occurs 0.6-1.0 μm below the upper semiconductor surface, typically 0.8 μm below the upper semiconductor surface when the channel length of IGFET 180 is defined according to lithographic design rules whose minimum printable feature size is 0.25 μm or less, e.g., 0.18 μm. Introduction of the n-type HV deep well dopant is normally done by ion implantation.

Figure 6:
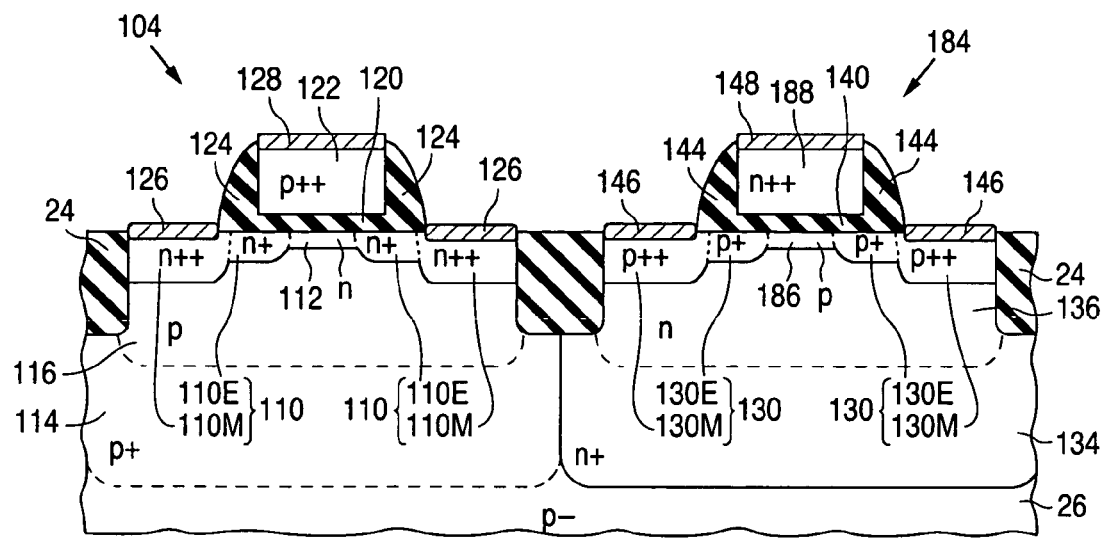

In FIG. 6, a long-channel normally off p-channel HV channel-junction IGFET 184 replaces p-channel HV surface-channel IGFET 106. The present complementary-IGFET structure may include both CJIGFET 184 and SCIGFET 106 in some applications. CJIGFET 184 is configured the same as SCIGFET 106 except that a moderately doped p-type channel zone 186 extends between n-type source/drain zones 130, specifically between n+ extensions 130E, in IGFET 184. P channel zone 186 forms a pn junction with upper portion 136 of the n-type device body material for IGFET 184. Also, IGFET 184 has a very heavily doped n-type polysilicon gate electrode 188 that replaces p++ gate electrode 142 of IGFET 106. Electrode 188 and metal silicide layer 148 form a composite gate electrode 188/148 for IGFET 106.

Similar to CJIGFET 104, CJIGFET 184 operates as a normally off device with either a metallurgical channel or a field-induced channel depending on various factors including the characteristics of channel zone 186. To understand the MC and FIC embodiments of IGFET 184, assume that the voltage at drain-acting source/drain zone 130 is less than the voltage at source-acting source/drain zone 130 since IGFET 184 is a p-channel IGFET. As a normally off p-channel device, IGFET 184 has a negative threshold voltage.

In an MC embodiment of IGFET 184, placing the gate-to-source voltage at a value less than or equal to the negative threshold voltage turns IGFET 184 on and causes it to conduct current by way of a subsurface metallurgical channel of non-depleted p-type material that extends from source-acting source/drain zone 130 through p-channel zone 186 to drain-acting source/drain zone 130. This subsurface metallurgical channel lies between (a) a surface depletion region that extends into channel zone 186 along the upper semiconductor surface and (b) the channel-side portion of a junction depletion region that extends along the pn junction between p channel zone 186 and n upper body-material portion 136. The channel surface depletion region merges with the junction depletion region, specifically the channel-side portion, to break the metallurgical subsurface channel and turn IGFET 184 off when the gate-to-source voltage rises to a value above the negative threshold voltage.

In an FIC embodiment, CJIGFET 184 conducts current through an electrically conductive channel induced in a layer of channel zone 186 extending along the upper semiconductor surface from source-acting source/drain zone 130 to drain-acting source/drain zone 130 so that IGFET 184 is turned on when the gate-to-source voltage is less than the negative threshold voltage. The induced surface channel consists of holes attracted to the upper surface of channel zone 186 by the transversal electric field that arises from having the gate-to-source voltage be less than or equal to the negative threshold voltage. The channel-side portion of the depletion region extending along the pn junction between channel zone 186 and upper body-material portion 136 occupies the remainder of channel zone 186. Raising the gate-to-source voltage to a value above the negative threshold voltage of IGFET 184 causes the surface channel to disappear, thereby turning IGFET 184 off. The channel-side portion of the junction depletion region then occupies all of channel zone 186.

Figure 7:
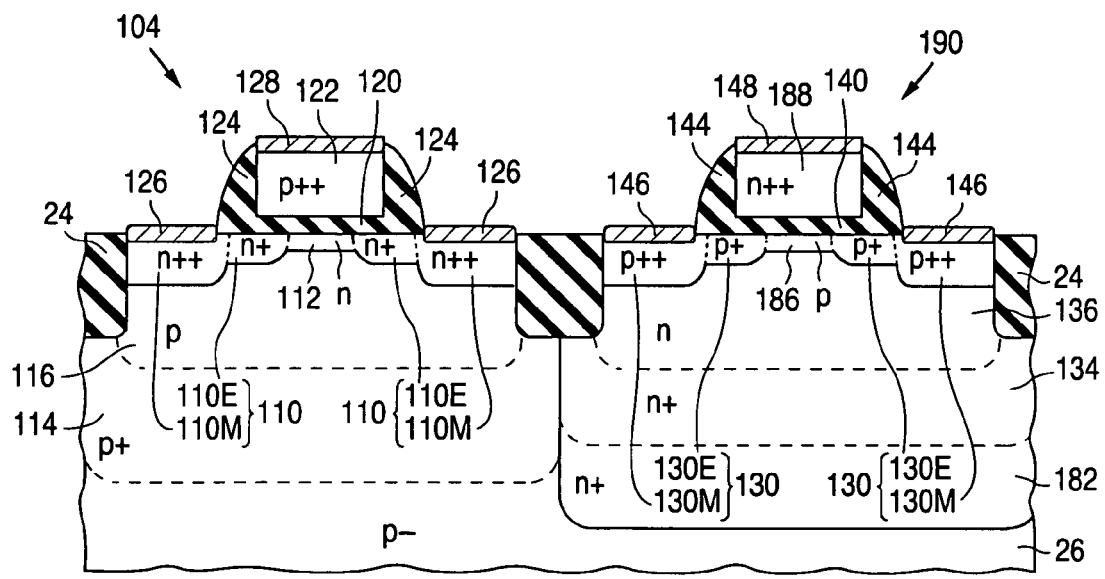

FIG. 7 depicts a variation of the present complementary-IGFET structure in which another long-channel normally-off p-channel HV channel-junction IGFET 190 replaces p-channel HV surface-channel IGFET 106. The complementary-IGFET structure of the invention may include CJIGFET 190 and CJIGFET 184 or SCIGFET 106. SCIGFET 106 and CJIGFETs 184 and 190 can all be present in some applications. CJIGFET 190 is configured the same as CJIGFET 184 except that the n-type device body material is extended downward in IGFET 190 to include n+ deep well portion 182 of CJIGFET 180. CJIGFET 190 operates the same as CJIGFET 184 in either the MC mode or the FIC mode. N+ well portion 182 in IGFET 190 performs the same function as in IGFET 180.

CJIGFET Operational Modeling and Design

Figure 8:
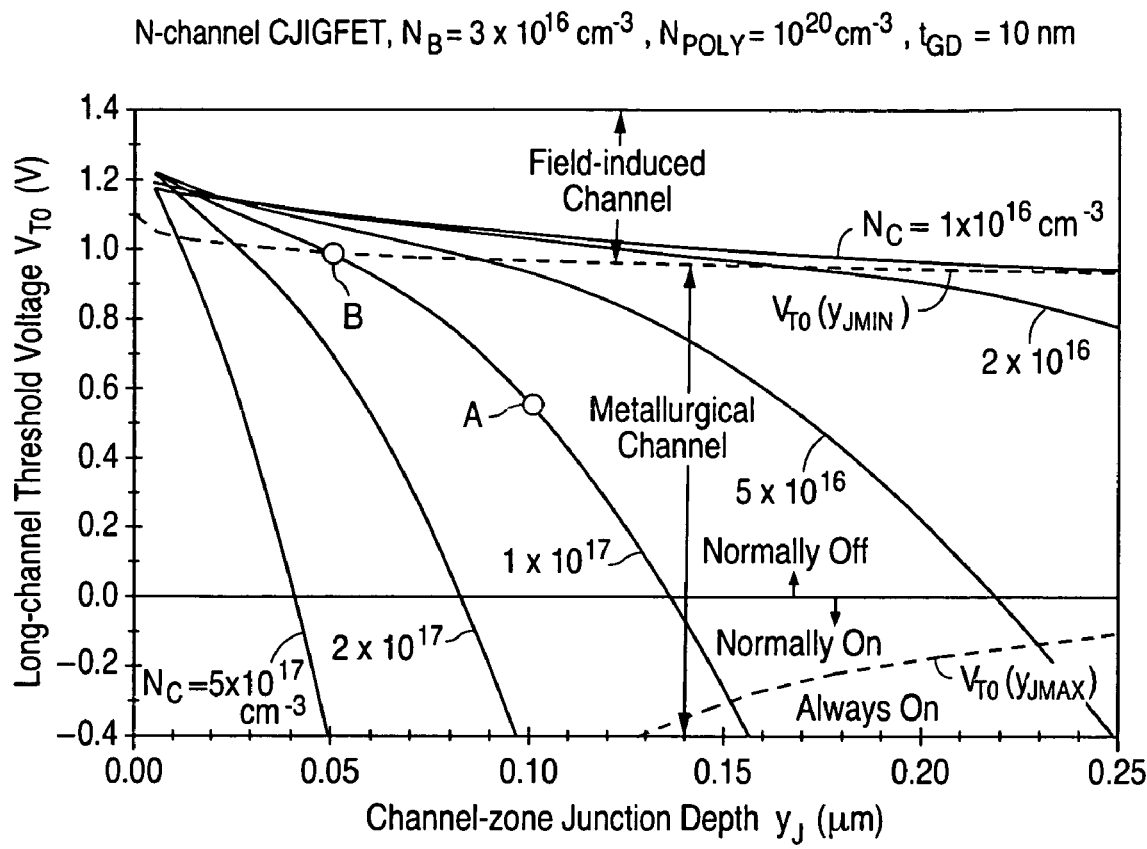
FIG. 8 is a design chart for long-channel threshold voltage as a function of channel-zone junction depth for n-channel CJIGFETs at various values of uniform net channel-zone dopant concentration for operation varying from conduction by field-induced surface channel to conduction by a metallurgical subsurface channel.

The term "crossover" as applied to a channel-junction IGFET refers to the regime of IGFET parameter values in which the CJIGFET transitions between a metallurgical-channel embodiment and a field-induced-channel embodiment. FIG. 8 presents an example of the crossover characteristics for a long-channel n-channel CJIGFET that approximates normally off n-channel CJIGFET 104. In the model used for generating FIG. 8, it is assumed that the n, channel zone has a uniform net dopant concentration $N_C$, that the p-type device body material below the channel zone has a uniform net dopant concentration $N_B$, and that a step change in net dopant concentration occurs in going across the pn junction between the n channel zone and the p-type body material.

Figure 9:
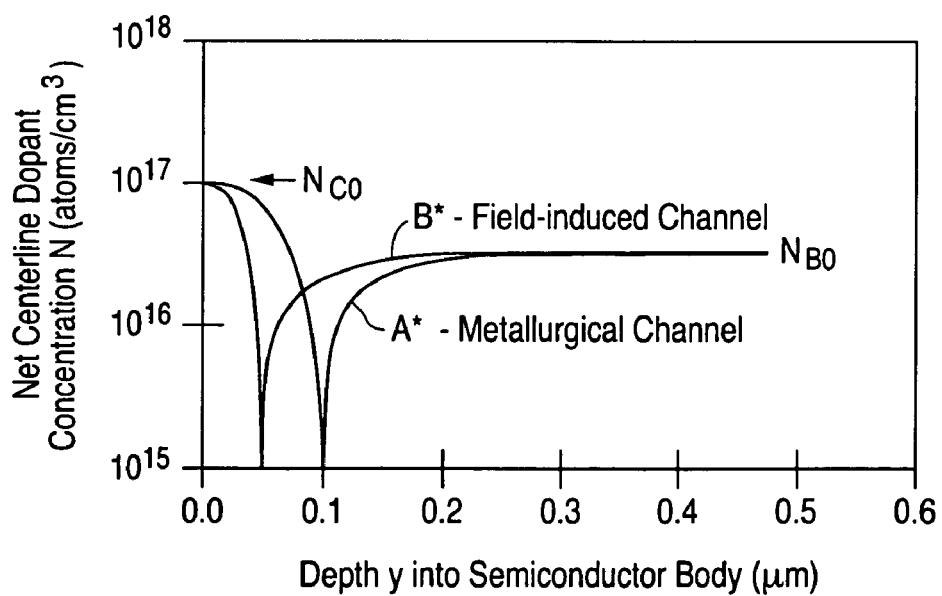
FIG. 9 is a graph of net centerline dopant concentration for two normally off n-channel CJIGFETs, one conducting through a field-induced surface channel and the other conducting through a metallurgical subsurface channel.

The net dopant concentration in CJIGFET 104 actually varies continuously in crossing the channel-zone/body pn junction and, in fact, drops to zero at the channel-zone/body junction. This situation is indicated in FIG. 9 for two examples of net dopant concentration $N_N$ through the vertical centerline of a long-channel n-channel channel-junction IGFET as a function of depth y into the semiconductor body starting from its upper surface. The net dopant concentration in the n channel zone of the CJIGFET modeled in FIG. 9 substantially reaches a maximum value $N_{C0}$ at the upper semiconductor surface. The net dopant concentration in the p-type body material of the modeled CJIGFET reaches a maximum background value $N_{B0}$ in the bulk of the body material, e.g., in the bulk of upper body-material portion 116 in IGFET 104.

Uniform net channel-zone dopant concentration $N_C$ and uniform net body-material dopant concentration $N_B$ of FIG. 8 can be reasonably approximated respectively as net channel-zone surface concentration $N_{C0}$ and net body-material bulk concentration $N_{B0}$ of FIG. 9. Alternatively, uniform net channel-zone dopant concentration $N_C$ can be equated to the average net dopant concentration in the channel zone, e.g., channel zone 112 in IGFET 104. Uniform net body-material dopant concentration $N_B$ can then be equated to the average net dopant concentration in upper body-material portion 116 of IGFET 104.

Returning to FIG. 8 with the foregoing comments about uniform concentrations $N_C$ and $N_B$ in mind, FIG. 8 specifically illustrates how long-channel threshold voltage $V_{T0}$ varies as a function of depth $y_J$ of the channel-zone/body pn junction at six different values of uniform net channel-zone dopant concentration $N_C$ for a long-channel n-channel CJIGFET whose uniform net body-material dopant concentration $N_B$, net gate-electrode polysilicon dopant concentration $N_{POLY}$, and gate-dielectric thickness $t_{GD}$ are suitable for n-channel CJIGFET 104. Long-channel threshold voltage $V_{T0}$ is the value of threshold voltage $V_T$ when the channel length is sufficiently great to avoid short-channel effects. In this regard, the reverse short-channel effect in which threshold voltage $V_T$ decreases slowly with increasing channel length in the long-channel regime is not included in the model of the IGFET for FIG. 8. Since the n channel zone of the modeled CJIGFET extends to the upper semiconductor surface, channel-zone junction depth $y_J$ is also the thickness of the channel zone such as n channel zone 112 in IGFET 104. Gate dielectric thickness $t_{GD}$ in FIG. 8 is 10 nm, slightly less than the typical 12-nm value for the thickness of gate dielectric layer 120 in IGFET 104 for 5.0-V operation.

For a channel-junction IGFET to operate with a metallurgical channel, channel-zone junction depth $y_J$ must lie between a minimum junction depth $y_{JMIN}$ and a maximum junction depth $y_{JMAX}$. Minimum junction depth $y_{JMIN}$ and maximum junction depth $y_{JMAX}$ are both functions of uniform net channel-zone net dopant concentration $N_C$ and uniform net body-material dopant concentration $N_B$ as described in U.S. Pat. No. 5,952,701, cited above, the contents of which are incorporated by reference herein. If junction depth $y_J$ is greater than or equal to $y_{JMAX}$, the metallurgical (subsurface) channel through the channel zone of the n-channel CJIGFET modeled in FIG. 8 is never pinched off at any value of the gate-to-source voltage. The CJIGFET is then an always on device.

Figure 10:
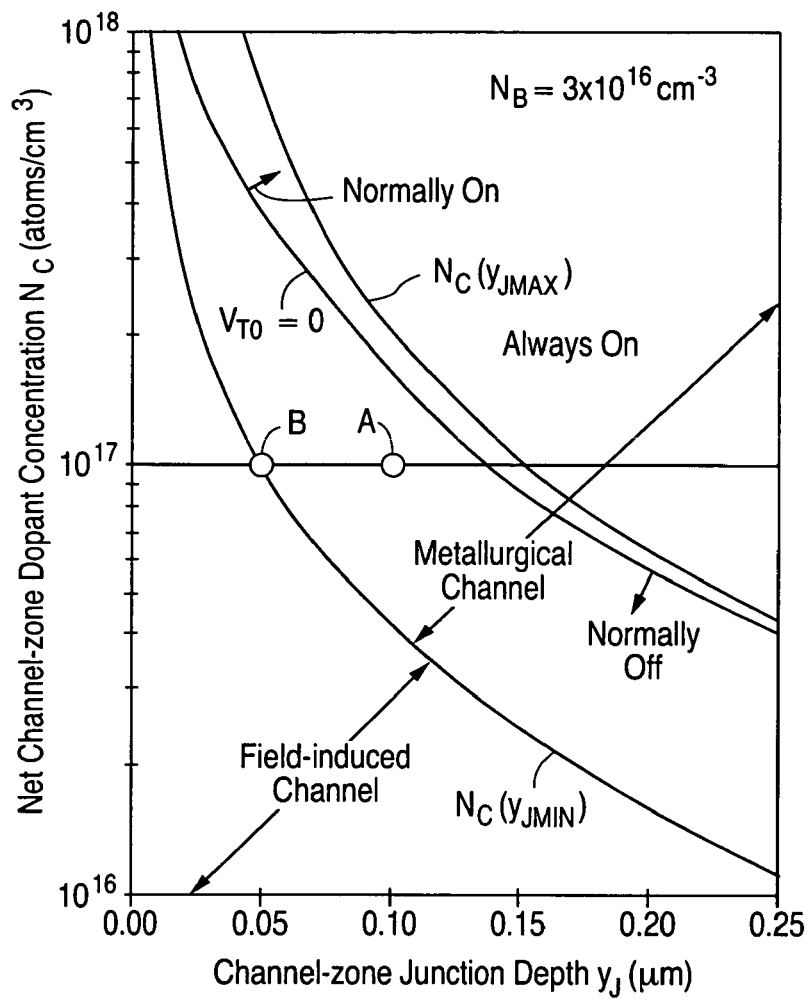
FIG. 10 is a design chart for uniform net channel-zone dopant concentration as a function of channel-zone junction depth for n-channel IGFETs at various conditions, including the condition at the crossover location between field-induced surface-channel conduction and metallurgical subsurface-channel conduction.

The CJIGFET operates with a field-induced channel when channel-zone junction depth $y_J$ is less than $y_{JMIN}$. Consequently, minimum junction depth $y_{JMIN}$ is the boundary between the MC and FIC parameter regimes for any particular value of uniform net dopant concentrations $N_C$ and $N_B$. Alternatively stated, uniform net channel-zone dopant concentration $N_C$ is a function of minimum junction depth $y_{JMIN}$ at any particular value of uniform net body-material dopant concentration $N_B$ as illustrated in FIG. 10 for the situation in which body-material concentration $N_B$ is $3 \times 10^{16}$ atoms/cm$^3$. The CJIGFET operates with a field-induced channel when the combination of channel-zone concentration $N_C$ and minimum junction depth $y_{JMIN}$ is below the $N_C(y_{JMIN})$ curve in FIG. 10, and with a metallurgical channel when the combination of concentration $N_C$ and depth $y_{JMIN}$ is above the $N_C(y_{JMIN})$ curve.

Returning again to FIG. 8, the upper and lower limits for operation with a metallurgical channel are respectively indicated by the dashed lines labeled $V_{T0}(y_{JMIN})$ and $V_{T0}(y_{JMAX})$. Note that the value of long-channel threshold voltage $V_{T0}$ for an MC embodiment extends into the parameter regime where the MC CJIGFET is a normally on device with a negative threshold voltage. Hence, the CJIGFET modeled in FIG. 8 operates with a metallurgical channel as a normally off device in the parameter regime between the $V_{T0}(y_{JMIN})$ curve and the line at which threshold voltage $V_{T0}$ is zero. The CJIGFET operates with a field-induced channel as a normally off device in the parameter regime above the $V_{T0}(y_{JMIN})$ curve. The $V_{T0}(y_J)$ curves at the various values of channel-zone concentration $N_C$ transition seamlessly between the MC and FIC regimes.

An especially suitable value of uniform net channel-zone dopant concentration $N_C$ is $1 \times 10^{17}$ atoms/cm$^3$. It is typically desirable that the threshold voltage of n-channel CJIGFET 104 be in the vicinity of 0.6 V for normally off operation. Using the model of FIGS. 8-10, this threshold-voltage value can be achieved by utilizing an MC embodiment with channel-zone junction depth $y_J$ set at 0.1 µm for the condition in which uniform net body-material dopant concentration $N_B$ is $3 \times 10^{16}$ atoms/cm$^3$, net polysilicon gate-electrode dopant concentration $N_{POLY}$ is $1 \times 10^{20}$ atoms/cm$^3$, and gate-dielectric thickness $t_{GD}$ is 10 nm. This combination of conditions is indicated by circle A in each of FIGS. 8 and 10.

Curve A* in FIG. 9 indicates a first order approximation to the vertical dopant profile through the center of CJIGFET 104 for the parameter conditions represented by circle A in FIG. 8. The multiple subsurface maxima in the net dopant concentration of the p-type device body material are, for simplicity, not illustrated in curve A*.

The threshold voltage of n-channel CJIGFET 104 can be at a value somewhat different from 0.6 V in the simplified design model of FIG. 8. Based on FIG. 8, threshold voltage $V_{T0}$ of IGFET 104 for normally off operation with a metallurgical channel is 0.2-0.8 V, typically 0.6 V. As in the actual implementation of IGFET 104, thickness $y_J$ of channel zone 112 is then 0.05-0.15 µm, typically 0.1 µm, provided that the combination of the $V_{T0}$, $y_J$, $t_{GD}$, $N_C$, $N_B$, and $N_{POLY}$ values places IGFET 104 in the normally off MC regime.

The model of FIG. 8 indicates that a normally off n-channel CJIGFET, such as CJIGFET 104, cannot operate with a field-induced channel at a threshold voltage of approximately 0.6 V for the conditions in which net body-material dopant concentration $N_B$ is $3 \times 10^{16}$ atoms/cm$^3$, net gate-electrode polysilicon dopant concentration $N_{POLY}$ is $1 \times 10^{20}$ atoms/cm$^3$, gate-dielectric thickness $t_{GD}$ is 10 nm, and channel-zone dopant concentration $N_C$ varies from a low value as little as $1 \times 10^{16}$ atoms/cm$^3$ to a high value at least as high as $5 \times 10^{17}$ atoms/cm$^3$. Instead, the threshold voltage must be 1.0 V or higher.

The parameter values for operation with a field-induced channel are preferably chosen so as to be substantially on the crossover boundary between the MC and FIC parameter regimes. For the previously indicated $N_B$, $N_{POLY}$, and $t_{GD}$ values, the resultant value of threshold voltage $V_{T0}$ is approximately 1.0 V for an $N_B$ value of $1 \times 10^{17}$ atoms/cm$^3$. Channel-zone junction depth $y_J$, which approximately equals minimum junction depth $y_{JMIN}$, is then 0.05 µm. Circle B in each of FIGS. 8 and 10 indicates this situation.

A first order approximation to the vertical dopant profile through the center of CJIGFET 104 for the conditions represented by circle B in FIGS. 8 and 10 is indicated by curve B* in FIG. 9. As with curve A* corresponding to circle A in FIG. 8, the multiple subsurface maxima in the net dopant concentration of the p-type device body material are, for simplicity, not illustrated in curve B*.

Choosing parameter values for operation with a field-induced channel so as to be on the crossover boundary between the MC and FIC regimes is advantageous because the threshold voltage is at the minimum value for any given set of $N_C$, $N_B$, $N_{POLY}$, and $t_{GD}$ values. This allows the gate voltage overdrive to be maximized so as to yield maximum drive (drain saturation) current. Due to manufacturing variations, the parameters values achieved in an actual implementation of CJIGFET 104 whose parameter values are intended to be at the crossover boundary between the MC and FIC regimes may place IGFET 104 slightly in the MC regime. However, IGFET 104 still operates very similar to a normally off n-channel IGFET in the FIC regime.

The parameter values for CJIGFET 104 can be chosen so as to operate clearly within the FIC regime rather than on the boundary between the FIC and MC parameter regimes. Based on FIG. 8, threshold voltage $V_{T0}$ of IGFET 104 for (normally off) FIC operation is 1.0-1.2 V. As with threshold voltage $V_{T0}$ for the MC embodiment, this $V_{T0}$ range for the modeled FIC embodiment of IGFET 104 differs slightly from the $V_T$ range prescribed above for IGFET 104 due to the $V_{T0}$ reduction caused by the reverse short-channel effect. Corresponding thickness $y_J$ of channel zone 112 for the FIC embodiment is 0.02-0.10 µm, typically 0.05 µm, provided that the combination of $V_{T0}$, $y_J$, $t_{GD}$, $N_C$, $N_B$, and $N_{POLY}$ values places IGFET 104 in the FIC regime or along the MC/FIC boundary.

Subject to reversing the voltage polarities, all of the previous comments about n-channel CJIGFET 104 operating in the MC and FIC regimes substantially apply to p-channel CJIGFET 184 operating in the MC and FIC parameter regimes. The differences in mobilities and channel-zone-to-gate-dielectric tunneling probabilities between electrons and holes do not significantly affect the conditions that determine MC and FIC operation, including the boundary between the MC and FIC regimes. Consistent with the various parameter values given above for CJIGFET 104, the preceding $V_{T0}$, $y_J$, $t_{GD}$, $N_C$, $N_B$, and $N_{POLY}$ values for IGFET 104 in the FIC and normally off MC regimes carry largely over to CJIGFET 184 in the FIC and normally off MC regimes with the threshold-voltage values reversed in sign so as to be negative.

Noise Reduction and Signal Gain

Various types of noise occur in integrated circuits. A major type of noise that arises with IGFETs, especially IGFETs operating at low frequency such as those often used in analog circuitry, is low-frequency flicker noise often referred to as "1/f" noise because its spectral density is roughly proportional to 1/f where f is the signal frequency. During noise measurement, f is the measuring frequency.

Noise in integrated circuits is typically characterized in terms of the noise spectral density. For 1/f noise, the noise spectral density for an IGFET can be referred to its gate electrode or its drain. The input-referred spectral noise density $S_{VG}$ for 1/f noise at the gate electrode of an IGFET is given generally as:

$$S_{VG} = M/(WLC_{GD}^2 f^n) \qquad (1)$$

where M is an empirical parameter, W is the width of the channel zone along the upper semiconductor surface, L is the length of the channel zone, $C_{GD}$ is the gate dielectric capacitance per unit area, and n is a non-ideality factor typically in a range of 0.7-1.3.

Eq. 1 applies to the frequency range below a corner frequency of roughly 1 kHz. 1/f noise is essentially constant above the corner frequency. Eq. 1 does not apply to DC operation, i.e., at zero frequency, or when the frequency is extremely low. The lowest frequency for most 1/f noise measurement is typically around 1 Hz.

Various models have been presented to account for 1/f noise in an IGFET. These models include a carrier mobility model and a trapping/detrapping model.

In the carrier mobility model, 1/f noise is caused by fluctuations in the mobility of the charge carriers in the conducting channel as a result of collisions with atoms of semiconductor material, with dopant atoms, and with themselves. The mobility fluctuations of the charge carriers depend on the transversal electric field in the conducting channel where the transversal electric field means the vertical component of the overall electric field. The transversal electric field is higher in a surface-channel IGFET than in an otherwise substantially equivalent normally off channel-junction IGFET regardless of whether the CJIGFET operates with a metallurgical or field-induced channel.

More particularly, the transversal electric field in the conducting channel of a normally off metallurgical-channel CJIGFET is essentially zero because the channel consists of undepleted doped semiconductor material lying between the channel surface depletion region and the channel-zone/body junction depletion region below the upper semiconductor surface. Inasmuch as a surface-channel IGFET conducts current by way of an inversion layer at the upper semiconductor surface, the transversal electric field in the conducting channel of an SCIGFET is a surface field determined by the electrical charge in the body region. The body-region charge is necessarily of some finite value. Consequently, an SCIGFET has a higher transversal electric field in the conducting channel than does a normally off MC CJIGFET.

Similar to what occurs in a surface-channel IGFET, the transversal electric field in a field-induced-channel channel-junction IGFET is a surface field because its conducting channel occurs in a layer along the upper semiconductor surface. However, the transversal surface field in an FIC CJIGFET is determined by the difference between the charge in the body region and the opposite-sign charge in the channel zone. The conducting channel of an SCIGFET thus has a higher transversal electric field than an otherwise substantially equivalent FIC CJIGFET.

Figure 11:
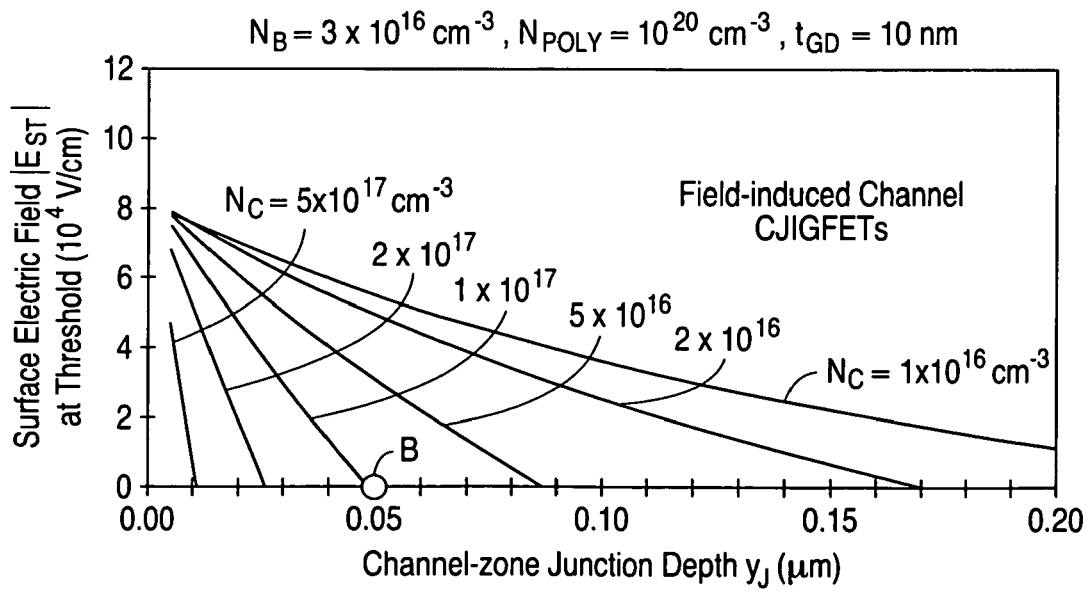
FIG. 11 is a graph of surface electric field as a function of channel-zone junction depth for normally off field-induced-channel CJIGFETs at various values of uniform channel-zone dopant concentration.

FIG. 11 illustrates how transversal electric field $E_{ST}$ at the upper semiconductor surface of an FIC CJIGFET varies with channel-zone junction depth $y_J$ for the six $N_C$ values respectively utilized for the six $V_{T0}(y_J)$ curves in FIG. 8. Although circle B in FIG. 11 corresponds to circle B in FIGS. 8 and 10, FIG. 11 applies to both n-channel and p-channel CJIGFETs. The $E_{ST}(y_J)$ curves in FIG. 11 are all generated at same $N_B$, $N_{POLY}$, and $t_{GD}$ values as in FIG. 8. As FIG. 11 indicates, the magnitude of transversal surface field $E_{ST}$ in the modeled FIC CJIGFET is less than $8\times10^4$ V/cm for all the $E_{ST}(y_J)$ curves down to the lower modeling-limit $y_J$ value of slightly less than 0.01 μm.

The doped polysilicon in the gate electrode of the FIC CJIGFET employed as the model in generating FIG. 11 is of opposite conductivity type to the doped polysilicon in the gate electrode of an otherwise substantially equivalent surface-channel SCIGFET of the same polarity (channel-type) as the modeled FIC CJIGFET. Uniform net body-material dopant concentration $N_B$ is $3\times10^{16}$ atoms/cm$^3$ for the modeled FIC CJIGFET. Dopant concentration $N_B$ in an otherwise substantially equivalent SCIGFET is typically in the vicinity of $1.5\times10^{17}$ atoms/cm$^3$ in order to achieve a typical value of 0.5 V for the magnitude of long-channel threshold voltage $V_{T0}$. The magnitude of surface field $E_{ST}$ for such a SCIGFET is typically in the vicinity of $20\times10^4$ V/cm and thus is typically more than double the $E_{ST}$ value for the modeled CJIGFET.

The mobility fluctuations of the charge carriers in the conducting channel of an IGFET generally increase as the transversal electric field increases. Since the transversal electric field is higher in the conducting channel of a surface-channel IGFET than in the conducting channel of an otherwise substantially equivalent normally off channel-junction IGFET, an SCIGFET is expected to incur more 1/f noise than an otherwise substantially equivalent normally off CJIGFET under the carrier mobility model.

In the trapping/detrapping model, 1/f noise in an IGFET is caused by fluctuations in the number of charge carriers in the conducting channel as the charge carriers are randomly trapped by, and detrapped (released) from, trapping sites in the IGFET's gate dielectric layer. The trapping/detrapping of a particular type of charge carriers, i.e., electrons or holes, depends on the probability that those charge carriers tunnel into the gate dielectric layer. The amount of charge-carrier trapping/detrapping increases as the tunneling probability increases, thereby causing the 1/f noise to increase, and vice versa.

For an IGFET whose conducting channel adjoins (meets) its gate dielectric layer, the Fowler-Nordheim probability $P_t$ of charge carriers tunneling from the conducting channel into the gate dielectric layer is:

$$P_t = \exp[-8\pi(2m^*q)^{1/2}\Phi_B^{3/2}/3h|E_{GD}|] \qquad (2)$$

where m* is the density-of-states effective mass of the charge carriers in the gate dielectric layer, q is the electronic charge, $\Phi_B$ is the energy barrier for the injection of charge carriers from the semiconductor material into the gate dielectric layer, h is Planck's constant, and $E_{GD}$ is the transversal electric field in the gate dielectric layer. Eq. 2 applies to both a surface-channel IGFET and an FIC channel-junction IGFET since the conducting channel of each of these IGFETs adjoin its gate dielectric layer.

Transversal gate-dielectric field $E_{GD}$ is determined from surface field $E_{ST}$ as:

$$E_{GD} = (\in_{SC}/\in_{GD})E_{ST} \qquad (3)$$

where $\in_{SC}$ is the dielectric constant of the semiconductor material, and $\in_{GD}$ is the dielectric constant of the gate dielectric material. Combining Eqs. 2 and 3 leads to:

$$P_t = \exp[-8\pi\in_{GD}(2m^*q)^{1/2}\Phi_B^{3/2}/3h\in_{SC}|E_{ST}|] \qquad (4)$$

Dielectric constant ratio $\in_{SC}/\in_{GD}$ substantially equals 3 (11.7/3.9) for the typical situation in which the semiconductor and gate dielectric materials respectively consist of silicon and silicon oxide.

The value of transversal surface electrical field $E_{ST}$ for a surface-channel IGFET is, as mentioned above, typically more than twice the $E_{ST}$ value for an otherwise substantially equivalent FIC channel-junction IGFET (of the same polarity, i.e., channel type). Using Eq. 4, charge-carrier tunneling probability $P_t$ for an SCIGFET is greater than probability $P_t$ for an otherwise substantially equivalent FIC CJIGFET. Since 1/f noise increases as gate dielectric charge-carrier trapping/detrapping increases and since the amount of trapping/detrapping increases with increasing charge-carrier tunneling probability, an SCIGFET is expected to incur more 1/f noise under the trapping/detrapping model than an otherwise substantially equivalent FIC CJIGFET.

Eqs. 2 and 4 do not directly apply to a normally off MC channel-junction IGFET because its conducting channel is separated from its gate dielectric layer by an intermediate region of undepleted semiconductor material. The intermediate semiconductor region absorbs (or collects) some of the charge carriers so as to reduce the amount of charge-carrier trapping/detrapping in the gate dielectric layer of the MC CJIGFET. In this case, the probability of charge carriers tunneling into the gate dielectric layer can be represented as the product of probability $P_t$ of Eq. 2 or 4 and a less-than-unity transmission factor that accounts for the charge carriers collected in the intermediate semiconductor region.

Based on the foregoing, an SCIGFET has an overall higher charge-carrier tunneling probability than an otherwise substantially equivalent normally off MC CJIGFET. Accordingly, an SCIGFET is expected to incur more 1/f noise under the charge-carrier trapping/detrapping model than an otherwise substantially equivalent normally off MC CJIGFET. The trapping/detrapping model thus leads to the same conclusion as the carrier mobility model with respect to 1/f noise in IGFETs of a particular polarity, namely that an SCIGFET is expected to incur more 1/f noise than an otherwise substantially equivalent normally off CJIGFET regardless of whether it is implemented to operate with a metallurgical channel or a field-induced channel.

Next consider two normally off surface-channel IGFETs configured substantially the same except that one of the SCIGFETs is an n-channel device with an n-type polysilicon gate electrode while the other SCIGFET is p-channel device with a p-type polysilicon gate electrode. Density-of-states effective mass m* for electrons is $0.5\ m_0$ where $m_0$ is the free electron mass. Density-of-states effective mass m* for holes is 5-10 $m_0$. Energy barrier $\Phi_B$ for electrons is 3.1 eV while energy barrier $\Phi_B$ for holes is approximately 4.3 eV. Consequently, holes which tunnel from the channel zone of the p-channel SCIGFET into its gate dielectric layer are of 10-20 times higher m* and of somewhat greater $\Phi_B$ than electrons which tunnel from the channel zone of the n-channel SCIGFET into its gate dielectric layer.

The magnitudes of transversal surface electric field $E_{ST}$ (for Eq. 4 or transversal gate-dielectric electric field $E_{GD}$ for Eq. 2) for the two complementary SCIGFETs are largely the same. Insertion of the previous m* and $\Phi_B$ data into Eq. 4 thereby leads to the conclusion that probability $P_t$ of electrons tunneling into the gate dielectric layer of the n-channel SCIGFET is much greater than probability $P_t$ of holes tunneling into the gate dielectric layer of the p-channel SCIGFET. Under the trapping/detrapping model, the n-channel SCIGFET is thus expected to incur much more 1/f noise than the otherwise substantially equivalent p-channel SCIGFET.

The net result of the carrier mobility and trapping/detrapping models is that an n-channel surface-channel IGFET incurs considerably more 1/f noise than each of (a) an otherwise equivalent p-channel surface-channel IGFET, (b) an otherwise substantially equivalent normally off n-channel channel-junction IGFET, and (c) an otherwise substantially equivalent normally off p-channel channel-junction IGFET. By not implementing n-channel IGFET 104 as an n-channel surface-channel device, the high-voltage portion of the complementary-IGFET structure of FIG. 3 avoids the high-voltage IGFET that appears to incur the most 1/f noise in the high-voltage IGFETs of prior art high-voltage/low-voltage complementary-IGFET structures in which the high-voltage n-channel IGFET is, as in Nishida et al., implemented as an n-channel surface-channel device.

The 1/f noise that occurs in high-voltage IGFETs 104 and 106 of the high-voltage/low-voltage complementary-IGFET structure of FIG. 3 is typically at least an order of magnitude lower than the 1/f noise that occurs in the high-voltage IGFETs of prior art high-voltage/low-voltage complementary-IGFET structures, such as that of Nishida et al., in which the high-voltage n-channel IGFET is a surface-channel device and in which the high-voltage p-channel IGFET is a channel-junction device. This 1/f noise reduction in high-voltage IGFETs 104 and 106 of the present complementary-IGFET structure occurs largely because n-channel IGFET 104 is a normally off channel-junction device rather than a much noisier surface-channel device. Although implementing p-channel IGFET 106 as a surface-channel device instead of a normally off channel-junction device may increase the 1/f noise produced in high-voltage IGFETs 104 and 106, the increase in the 1/f noise of FETs 104 and 106 is much less than what would occur if, as in prior art such as Nishida et al., a high-voltage n-channel IGFET were implemented as a surface-channel device instead of a normally off channel-junction device.

In fact, p-channel surface-channel IGFET 106 is not greatly noisier than an otherwise equivalent normally off p-channel channel-junction IGFET. As occurs in the variations of FIGS. 6 and 7, SCIGFET 106 can be replaced with normally off p-channel channel-junction IGFET 184 or 190 to help further reduce the high-voltage 1/f noise. By implementing n-channel IGFET 104 as a normally off channel-junction device, the complementary-IGFET structure of the present invention achieves a large reduction in the high-voltage 1/f noise.

The maximum signal gain of an IGFET is proportional to its transconductance which, in turn, is proportional to the mobility of the charge carriers in the IGFET's conducting channel. The mobilities of charge carriers in semiconductor material depend on the material's net dopant concentration. However, electrons are always more mobile than, normally at least twice as mobile as, holes at the same net dopant concentration.

The charge carriers in the conducting channel of an n-channel IGFET are electrons while the charge carriers in the conducting channel of a p-channel IGFET are holes. Accordingly, a normally off n-channel channel-junction IGFET has higher signal gain than an otherwise substantially equivalent normally off p-channel channel-junction IGFET. In addition to providing a reduction in 1/f noise, implementing IGFET 104 as an n-channel CJIGFET in the present high-voltage/low-voltage complementary-IGFET structure enables high-voltages IGFETs 104 and 106 to achieve a higher maximum signal gain that what occurs in prior art high-voltage/low-voltage complementary-IGFET structures, such as that of Nishida et al., in which the high-voltage channel-junction IGFET is a p-channel device rather than an n-channel device.

Fabrication of Complementary-IGFET Structure According to Invention

Figure 12G:
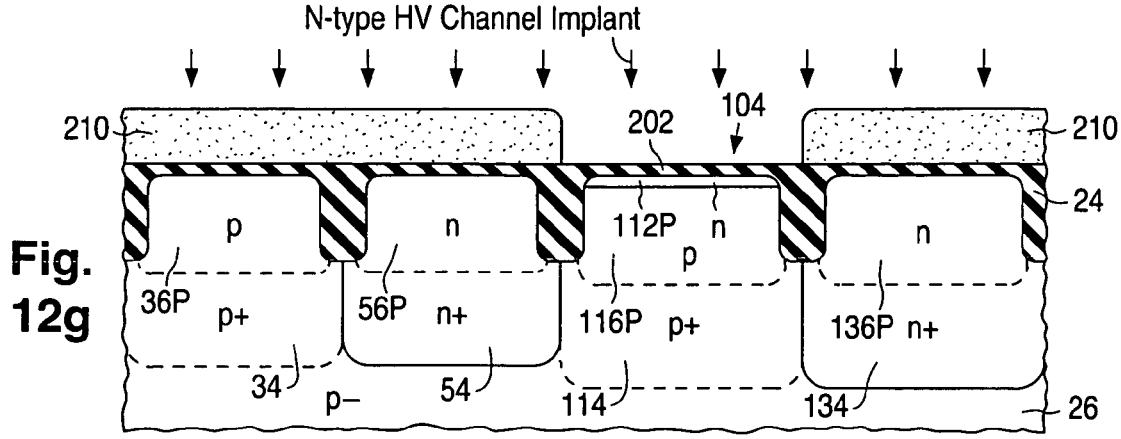
FIGS. 12$a$-12$o$, 12$p$.1-12$x$.1, and 12$p$.2-12$x$.2 are cross-sectional side structural views representing steps in manufacturing the complementary-IGFET structure of FIGS. 3.1 and 3.2 in accordance with the invention.
Figure 12H:
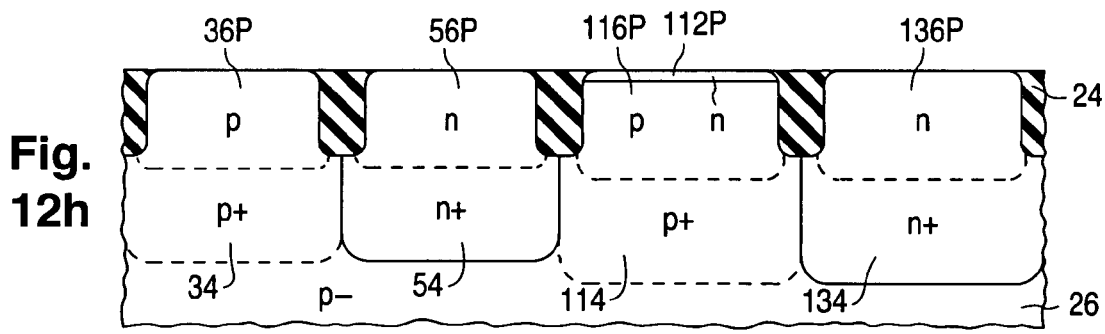
Figure 12I:
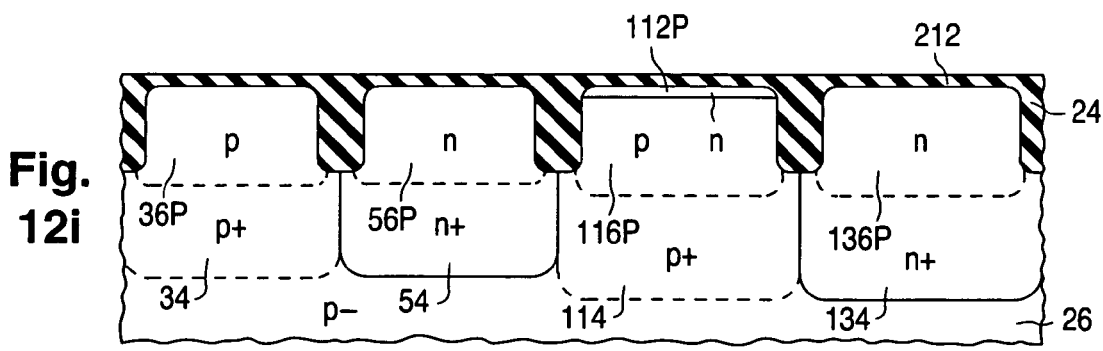
Figure 12J:
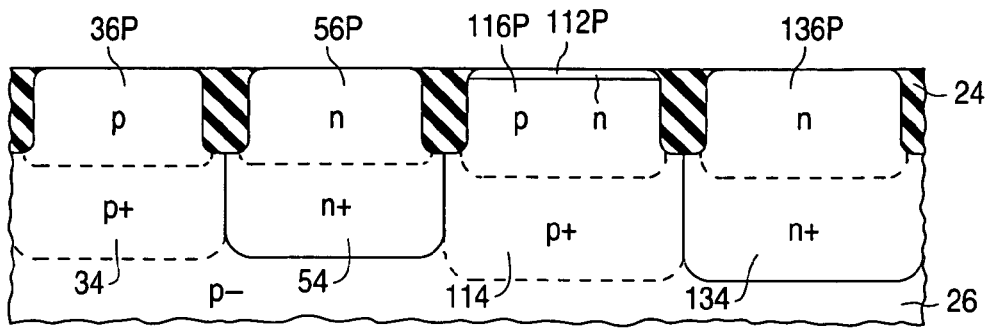
Figure 12K:
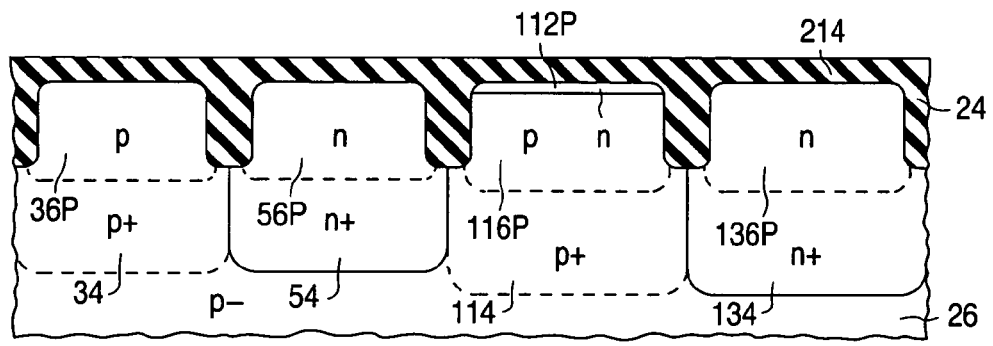
Figure 12L:
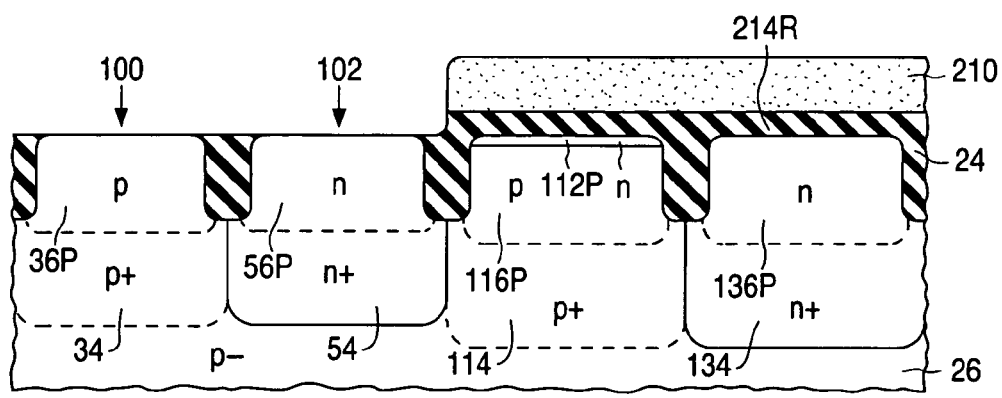
Figure 12M:
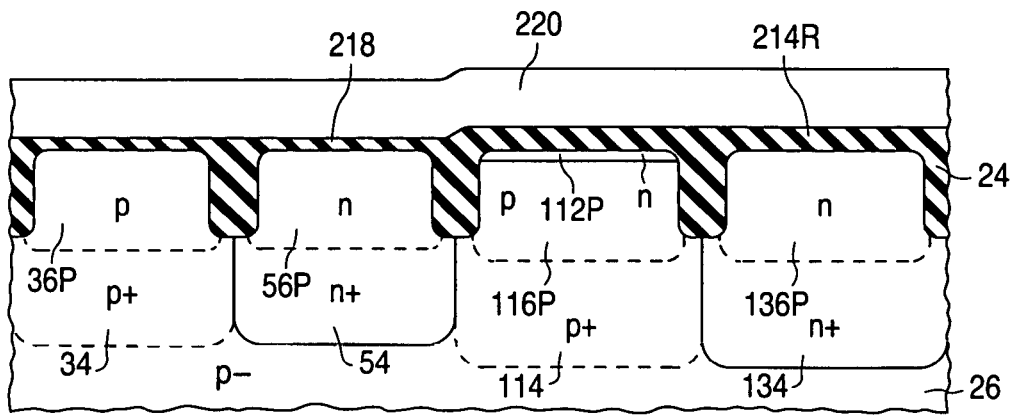
Figure 12N:
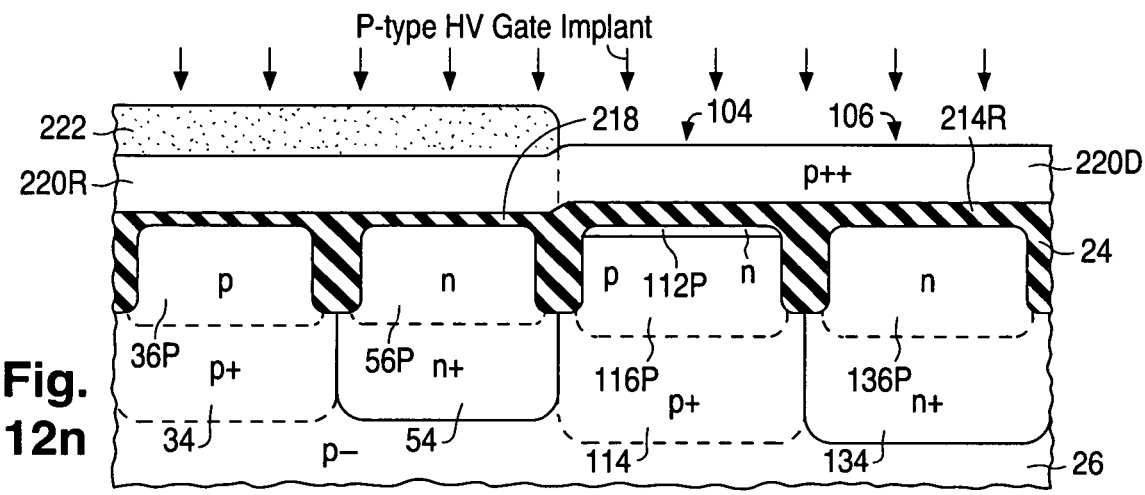
Figure 12O:
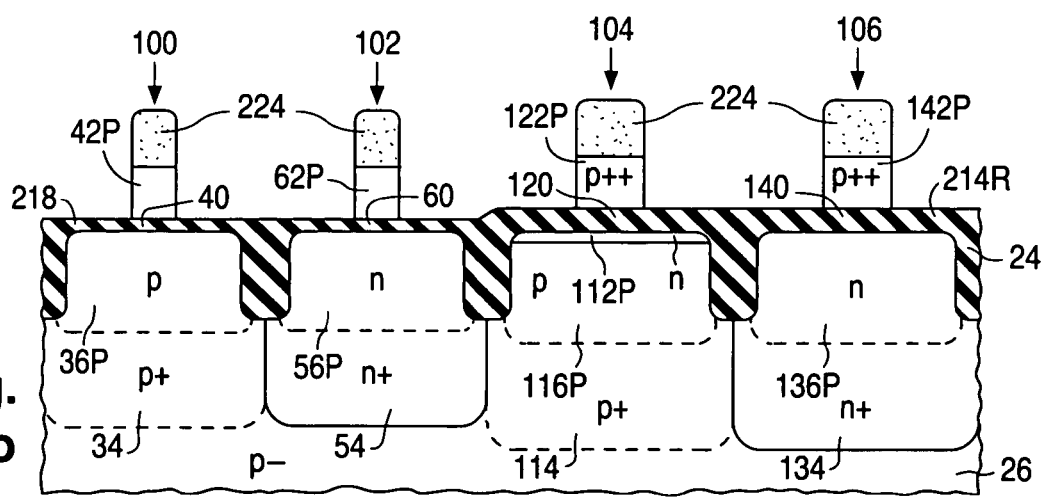

FIGS. 12a-12o, 12p.1-12x.1, and 12p.2-12x.2 (collectively "FIG. 12") illustrate a semiconductor process in accordance with the invention for manufacturing a complementary-IGFET structure containing IGFETs 100, 102, 104, and 106 as shown in FIG. 3. The steps involved in the fabrication of all of IGFETs 100, 102, 104, and 106 up through the definition of the lateral shapes for their gate electrodes 42, 62, 122, and 142 are shown in FIGS. 12a-12o. FIGS. 12p.1-12x.1 present later steps involved in the fabrication of LV IGFETs 100 and 102 as shown in FIG. 3.1. FIGS. 12p.2-12x.2 present later steps involved in the fabrication of HV IGFETs 104 and 106 as shown in FIG. 3.2.

Long-channel versions of LV IGFETs 100 and 102 may be manufactured according to the same fabrication steps utilized in fabricating short-channel LV IGFETs 100 and 102. The long-channel IGFETs 100 and 102 are of greater channel length than IGFETs 100 and 102 but otherwise have the same intermediate IGFET appearances as depicted in FIG. 12. Although not indicated in FIG. 12, the steps needed to create n-channel LV IGFET 160 as a replacement for n-channel LV IGFET 100 and/or to create p-channel LV IGFET 162 as a replacement for p-channel LV IGFET 102 are described below as options to the fabrication process of FIG. 12. Similarly, the steps needed to create one or more of p-channel HV IGFETs 180, 184, and 190 as a replacement for, or in addition to, p-channel HV IGFET 106 are described below as options to the present fabrication process but are not indicated in FIG. 12.

One or two of IGFETs 100, 102, 104, and 106, including LV SCIGFETs 160 and 162 as replacements for LV SCIGFETs 100 and 102 and including p-channel HV CJIGFET 180, 184, or 188 as a replacement for p-channel HV SCIGFET 106, may not be included in a particular implementation of the present multiple-IGFET structure. The additional steps needed to fabricate each such non-included IGFET may be deleted from the fabrication process. Any such non-included IGFET is normally created in one or more other multiple-IGFETs structures fabricated according to below-described steps.

Aside from the halo ion implantation steps and the HV source/drain extension ion implantation steps, all of the ion implantation steps in the present fabrication process are performed roughly perpendicular to the lower semiconductor surface and thus roughly perpendicular to the upper semiconductor surface. More particularly, all of the implantation steps except the halo and HV source/drain extension ion implantation steps are performed at a small angle, typically 7°, to the vertical. This small deviation from perpendicularity is used to avoid undesirable ion channeling effects. For simplicity, the small deviation from perpendicularity is not indicated in FIG. 12.

Unless otherwise indicated, the species of n-type dopant utilized in each of the n-type ion implantations in the fabrication process of FIG. 12 consists of the specified n-type dopant in elemental form. That is, each n-type ion implantation is performed with ions of the specified n-type dopant element rather than with ions of a chemical compound that contains the n-type dopant. The species of p-type dopant employed in each of the p-type ion implantations variously consists of the p-type dopant, normally boron, in elemental or compound form. Hence, each p-type ion implantation is normally performed with boron ions or with ions of a boron-containing compound.

In some of the fabrication steps in FIG. 12, openings extend (substantially) through a photoresist mask above the active semiconductor regions for two IGFETs. When the two IGFETs are formed laterally adjacent to each other in the exemplary cross sections of FIG. 12, the two photoresist openings are illustrated as a single opening in FIG. 12 even through they are described below as separate openings.

The starting point for the fabrication process of FIG. 12 is typically a monosilicon semiconductor body consisting of a heavily doped p-type substrate 200 and an overlying lightly doped p-type epitaxial layer 26P. See FIG. 12a. P+ substrate 200 is a semiconductor wafer formed with <100> monosilicon doped with boron to achieve a typical resistivity of 0.015 ohm-cm. For simplicity, substrate 200 is not shown in the remainder of FIG. 12. Alternatively, the starting point can simply be a lightly doped p-type substrate.

P-epitaxial layer 26P consists of epitaxially grown <100> monosilicon doped with boron to achieve a typical resistivity of 30 ohm-cm. Epitaxial layer 26P is a precursor to p-type material 26. The letter "P" at the end of a reference symbol is utilized here to indicate a precursor to a region identified by the portion of the reference symbol preceding the letter "P". The thickness of epitaxial layer 26P is typically 5.5 mm. When the starting point for the fabrication process of FIG. 12 is a lightly doped p-type substrate, item 26P is the p− substrate.

Field-insulating region 24 is provided along the upper surface of p− epitaxial layer (or p− substrate) 26P as shown in FIG. 12b so as to define the active regions for IGFETs 100, 102, 104, and 106 going from left to right in FIG. 12b. Field insulation 24 is preferably created according to a trench-oxide technique. In that case, field insulation 24 typically extends 0.35 μm into epitaxial layer 26P. Field insulation 24 may also be created according to a local-oxidation technique. In providing field insulation 24, a thin screen insulating layer 202 of silicon oxide is thermally grown along the upper surface of epitaxial layer 26P. Screen-oxide layer 202 is typically 15 nm in thickness.

A photoresist mask 204 is formed on screen-oxide layer 202 as shown in FIG. 12c. Mask 204 has an opening above the active region for p-channel LV SCIGFET 102. N+ well 54 is defined by ion implanting a species of the n-type LV well dopant at a heavy dosage through the uncovered section of screen oxide 202 and into epitaxial layer 26P. The dosage of the n-type LV well dopant is $5 \times 10^{12}$-$4 \times 10^{13}$ ions/cm$^2$, typically $2 \times 10^{13}$ ions/cm$^2$. The n-type LV well dopant may consist of phosphorus or arsenic. For the typical case in which phosphorus constitutes the n-type LV well dopant, the implantation energy is 400-600 keV, typically 500 keV.

A moderately doped n-type precursor upper body-material portion 56P for IGFET 102 is defined by ion implanting a species of the n-type LV APT dopant at a moderate dosage through the uncovered section of screen-oxide layer 202 and into epitaxial layer 26P. The dosage of the n-type LV APT dopant is $1 \times 10^{12}$-$1 \times 10^{13}$ ions/cm$^2$, typically $3 \times 10^{12}$ ions/cm$^2$. The n-type LV APT dopant may consist of phosphorus or arsenic. For the typical case in which phosphorus constitutes the n-type LV APT dopant, the implantation energy is 110-130 keV, typically 120 keV.

If p-channel SCIGFET 162 of FIG. 4 is to replace p-channel SCIGFET 102, a heavily doped n-type precursor to intermediate body-material portion 166 for SCIGFET 162 is defined by ion implanting a species of the n-type LV isolation dopant at a heavy dosage through the uncovered section of screen oxide 202 and into epitaxial layer 26P while photoresist 204 is in place. The dosage of the n-type LV isolation dopant is typically $1 \times 10^{13}$ ions/cm$^2$. The n-type LV isolation dopant may consist of phosphorus or arsenic. When phosphorus constitutes the n-type isolation dopant, the implantation energy is typically 230 keV.

The n-type LV APT dopant, the n-type LV well dopant, and (when present) the n-type LV isolation dopant respectively reach maximum dopant concentrations below the upper semiconductor surface substantially at the respective locations of the primary (APT), further (well), and additional (isolation) local subsurface maxima in the net dopant concentration for respective portions 56, 54, and 166 of the n-type device body material for p-channel SCIGFET 102 or 162. The implantations of the two or three n-type LV dopants can be done in any order. Photoresist 204 is removed after performing these two or three n-type LV implantations.

A photoresist mask 206 is formed on screen oxide 202 as depicted in FIG. 12d. Mask 206 has an opening above the active region for n-channel LV SCIGFET 100. P+ well 34 is defined by ion implanting a species of the p-type LV well dopant at a heavy dosage through the uncovered section of screen oxide 202 and into epitaxial layer 26P. The dosage of the p-type LV well dopant is $1\times10^{13}$-$3\times10^{13}$ ions/cm$^2$, typically $2\times10^{13}$ ions/cm$^2$. The p-type LV well dopant may consist of boron in elemental form or in the form of boron difluoride. For the typical case in which the p-type LV well dopant consists of elemental boron, the implantation energy is 200-220 keV, typically 210 keV.

A moderately doped p-type precursor upper body-material portion 36P for IGFET 100 is defined by ion implanting a species of the p-type LV APT dopant at a moderate dosage through the uncovered section of screen oxide 202 and into the epitaxial layer 26P. The dosage of the p-type LV APT dopant is $2\times10^{12}$-$1\times10^{13}$ ions/cm$^2$, typically $5\times10^{12}$ ions/cm$^2$. The p-type LV APT dopant may consist of boron in elemental form or in the form of boron difluoride. For the typical case in which the p-type LV APT dopant consists elemental boron, the implantation energy is 40-70 keV, typically 50 keV.

If n-channel SCIGFET 160 of FIG. 4 is to replace n-channel SCIGFET 100, a heavily doped p-type precursor to intermediate body-material portion 164 for SCIGFET 160 is defined by ion implanting a species of the p-type LV isolation dopant at a heavy dosage through the uncovered section of screen oxide 202 and into epitaxial layer 26P while photoresist 206 is in place. The dosage of the p-type LV isolation dopant is typically $1\times10^{13}$ ions/cm$^2$. The p-type LV isolation dopant typically consists of elemental boron implanted at an energy of 110 keV.

The p-type LV APT dopant, the p-type LV well dopant, and (when present) the p-type LV isolation dopant respectively reach maximum dopant concentrations below the upper semiconductor surface substantially at the respective locations for the primary (APT), further (well), and additional (isolation) local subsurface maxima in the net dopant concentration for respective portions 36, 34, and 164 of the device body material for n-channel SCIGFET 100 or 160. The implantations of the two or three p-type LV dopants can be done in any order. Photoresist 206 is removed after performing these two or three p-type LV implantations.

A photoresist mask 208 is formed on screen oxide 202 as shown in FIG. 12*e*. Mask 208 has an opening above the active region for p-channel IGFET 106. N+ well 134 for IGFET 106 is defined by ion implanting a species of the n-type HV well dopant at a heavy dosage through the uncovered section of screen oxide 202 and into epitaxial layer 26P. The dosage of the n-type HV well dopant is $1\times10^{13}$-$3\times10^{13}$ ions/cm$^2$, typically $2\times10^{13}$ ions/cm$^2$. The n-type HV well dopant may consist of phosphorus or arsenic. For the typical case in which phosphorus constitutes the n-type HV well dopant, the implantation energy is 400-600 keV, typically 500 keV.

A moderately doped n-type precursor upper body-material portion 136P for IGFET 106 is defined by ion implanting a species of the n-type HV APT dopant at a moderate dosage through the uncovered section of screen oxide 202 and into epitaxial layer 26P. The dosage of the n-type HV APT dopant is $4\times10^{12}$-$8\times10^{12}$ ions/cm$^2$, typically $6\times10^{12}$ ions/cm$^2$. The n-type HV APT dopant may consist of phosphorus or arsenic. For the typical case in which phosphorus constitutes the HV APT dopant, the implantation energy is 80-160 keV, typically 120 keV.

A species of a further n-type semiconductor dopant, referred to here as the n-type HV threshold-adjust dopant, is introduced through the uncovered section of screen oxide 202 and into epitaxial layer 26P at the intended location for n channel zone 132 of IGFET 106 in order to adjust its negative threshold voltage downward, i.e., to increase the magnitude of its threshold voltage. The n-type HV threshold-adjust dopant is normally introduced by ion implantation at a moderate dosage of $1\times10^{12}$-$3\times10^{12}$ ions/cm$^2$, typically $2\times10^{12}$ ions/cm$^2$. The n-type HV threshold-adjust dopant may consist of phosphorus or arsenic. For the typical case in which the n-type HV threshold-adjust dopant is phosphorus, the implantation energy is 20-30 keV, typically 25 keV.

As mentioned above, each of one or more, but not all, implementations of p-channel HV IGFET 106 is replaced with an implementation of p-channel HV IGFET 180 or 190, each having n+ deep well portion 182, in some variations of the present complementary-IGFET structure. Every implementation of IGFET 106 can, however, be replaced with an implementation of IGFET 180 or 190. In that case, deep well portion 182 is defined at this point for each IGFET 180 or 190 by ion implanting a species of the n-type HV deep well dopant at a heavy dosage through the uncovered section of screen oxide 202 and into epitaxial layer 26P. The species, dosage, and implantation energy for this operation are the same as described below for the situation in which one or more, but not all, implementations of IGFET 106 is replaced with an implementation of IGFET 180 or 190.

P-channel SCIGFET 106 is, as also mentioned above, replaced with p-channel CJIGFET 184 or 190, each having p channel zone 186 and n++ gate electrode 188, in some variations of the complementary-IGFET structure of FIG. 3. In such a case with photoresist mask 208 still in place, a precursor to p channel zone 186 is defined by introducing a species of a p-type semiconductor dopant, referred to here as the p-type HV channel dopant, through the uncovered section of screen oxide 202 and into epitaxial layer 26P. This doping operation is described further below in connection with FIGS. 14*a*-14*f*.

The n-type HV APT dopant, the n-type HV (shallow) well dopant, and (when present) the n-type HV deep well dopant respectively reach maximum dopant concentrations below the upper semiconductor surface at the respective locations for the primary (APT), further (well), and additional (deep well) local subsurface maxima for portions 136, 134, and 182 of the n-type device body material for IGFET 106, 180, 184, or 190. The implantations of these two or three n-type HV dopants along with the implantation of the n-type HV threshold-adjust dopant and (when performed) the implantation of the p-type HV channel dopant can be done in any order. Photoresist 208 is removed after performing these three, four, or five HV doping operations.

A photoresist mask 210 is formed on screen oxide 202 as depicted in FIG. 12*f*. Mask 210 has an opening above the active region for n-channel HV IGFET 104. P+ well 114 for IGFET 104 is defined by ion implanting a species of the p-type HV well dopant at a heavy dosage through the uncovered section of screen oxide 202 and into epitaxial layer 26P. The dosage of the p-type HV well dopant is $1\times10^{13}$-$3\times10^{13}$ ions/cm$^2$, typically $2\times10^{13}$ ions/cm$^2$. The p-type HV well dopant may consist of boron in elemental form or in the form of boron difluoride. For the typical case in which the p-type HV well dopant consists of elemental boron, the implantation energy is 150-250 keV, typically 200 keV.

A moderately doped precursor upper body-material portion 116P for IGFET 104 is defined by ion implanting a species of the p-type HV APT dopant, at a moderate dosage through the uncovered section of screen oxide 202 and into epitaxial layer 26P. The dosage of the p-type HV APT dopant is $2\times10^{12}$-$6\times10^{12}$ ions/cm$^2$, typically $4\times10^{12}$ ions/cm$^2$. The p-type HV APT dopant may consist of boron in elemental form or in the form of boron difluoride. For the typical case in which elemental boron constitutes the p-type HV APT dopant, the implantation energy is 40-60 keV, typically 50 keV. The lightly doped remainder of epitaxial layer 26P is p− material 26 after completion of the p-type HV well and APT doping operations.

With photoresist mask 210 still in place, a moderately doped n-type precursor 112P to n channel zone 112 for IGFET 104 is defined by introducing an n-type semiconductor dopant, referred to here as the n-type HV channel dopant, at a moderate dosage through the uncovered section of screen oxide 202 and into p upper-body material portion 116P (or epitaxial layer 26P if upper body-material portion 116P is not yet defined). See FIG. 12g. The n-type HV channel dopant is normally introduced by ion implanting a species of the dopant at a dosage of $1 \times 10^{12}$-$3 \times 10^{12}$ ions/cm$^2$, typically $2 \times 10^{12}$ ions/cm$^2$.

The n-type HV channel dopant preferably consists of a slow-diffusing species (large atoms) such as arsenic to facilitate making channel zone 112 as a thin (or shallow region whose thickness is typically in the vicinity of 0.1 μm. Arsenic diffuses slowly compared to boron, the typical p-type counterpart. When the n-type HV channel dopant consists of arsenic, the implantation energy is 20-40 keV, typically 30 keV. Phosphorus can also be used as the n-type HV channel dopant.

The p-type HV APT dopant and the p-type HV well dopant respectively reach maximum dopant concentrations below the upper semiconductor surface at the respective locations for the primary (APT) and further (well) local subsurface maxima in the net dopant concentration for respective portions 116 and 114 of the device body material for IGFET 104. The implantation of these two p-type HV dopants along with the implantation of the n-type HV channel dopant can be done in any order. Photoresist 210 is removed after performing these three HV implantations.

In variations where each of one or more, but not all, implementations of p-channel HV IGFET 106 is replaced with an implementation of p-channel HV IGFET 180 or 190 having n+ deep well portion 182, a photoresist mask (not shown) is formed on screen oxide 202. This photoresist mask, referred to here as the selective HV deep well photoresist mask, has an opening above each location where an implementation of p-channel IGFET 106 is to be replaced with an implementation of p-channel IGFET 180 or 190. N+ deep well 182 is defined for each implementation of IGFET 180 or 190 by ion implanting the n-type HV deep well dopant at a heavy dosage through the uncovered section of screen oxide 202 and into epitaxial layer 26P. The dosage of the n-type HV deep well dopant is $5 \times 10^{12}$-$2 \times 10^{13}$ ions/cm$^2$, typically $1 \times 10^{13}$ ions/cm$^2$. The n-type HV deep well dopant may consist of phosphorus or arsenic. For the typical case in which phosphorus constitutes the n-type HV deep well dopant, the implantation energy is 500-700 keV, typically 600 keV. The selective HV deep well photoresist mask is removed after performing the n-type HV deep well implantation.

Photoresist masks 204, 206, 208, and 210 and, when used, the selective HV deep well photoresist mask can be formed on screen oxide 202 in any order. In other words, the doping step(s) performed with each of these four or five masks can be performed in any order with respect to the doping step(s) performed with each other of these masks.

A thermal anneal is optionally now performed on the resultant semiconductor structure to repair lattice damage and place the implanted n-type and p-type dopants in energetically more stable sites so as to minimize further diffusion of these dopants during subsequent thermal operations, especially the final anneal described below. This optional intermediate anneal is preferably a rapid thermal anneal ("RTA") at 900-1100° C., typically 1000° C., for 5-20 sec., typically 10 sec. The RTA is normally done in a non-reactive environment, typically nitrogen, but can be done in a reactive, e.g., oxidizing, environment. By using the RTA, the implanted dopants are activated without significant dopant movement (redistribution). Although the above-mentioned implantation steps define precursor channel-zone portion 112P, precursor upper body-material portions 38P, 56P, 116P, and 136P, well portions 34, 54, 114, and 134 and, in variations of the complementary-IGFET structure of FIG. 3, deep well portion 182 for HV IGFET 180 or 190, the precursor to channel zone 186 for HV IGFET 184 or 190, and intermediate body-material portions 164 and 166 respectively for LV IGFETs 160 and 162, the intermediate anneal completes the formation of these regions.

In the remainder of the process description, all references to LV IGFETs 100 and 102 with respect to particular components of IGFETs 100 and 102 respectively encompass, i.e., respectively implicitly include, references to LV IGFETs 160 and 162 insofar as they have the same respective components. All references to p-channel IGFET 106 with respect to particular components of IGFET 106 encompass references to p-channel HV IGFET 180, 184, or 190 insofar as it has the same components as IGFET 106.

Subsequent to the intermediate anneal, screen-oxide layer 202 is removed to expose the upper semiconductor surface as shown in FIG. 12h. The upper semiconductor surface is also cleaned, typically by a wet chemical process utilizing various combinations of strong acid, hydrogen peroxide, deionized water, and possibly ammonium hydroxide. The acid is typically sulfuric or/and hydrochloric acid. In one embodiment, the cleaning step is performed with 98% sulfuric acid and 2% hydrogen peroxide at 120° C. for 10 min. The cleaning step removes surface contaminants along with a few atomic layers of the exposed silicon to provide a clean upper semiconductor surface in order to help reduce noise.

A sacrificial layer 212 of silicon oxide is thermally grown along the upper semiconductor surface to prepare the upper semiconductor surface for formation of gate dielectric layers 40, 60, 120, and 140. See FIG. 12i. The thickness of sacrificial oxide layer 212 is typically at least 10 nm. Sacrificial oxide layer 212 is subsequently removed as indicated in FIG. 12j.

The formation and removal of sacrificial oxide layer 112 removes defects and/or contamination along the upper semiconductor surface to produce a high-quality upper semiconductor surface. This reduces the 1/f noise that occurs in LV SCIGFETs 100 and 102 and in HV SCIGFET 106 or 180 as charge carriers move through the inversion-layer channels in their respective channel zones 32, 52, and 132. The 1/f noise that occurs in n-channel HV CJIGFET 104 when it utilizes a field-induced channel with electrons moving through the induced surface channel in channel zone 112 is also reduced. The same applies to p-channel HV CJIGFET 184 or 190 when it employs a field-induced channel with holes moving through the induced surface channel in channel zone 186.

A (comparatively) thick gate-dielectric-containing dielectric layer 214 is provided along the upper semiconductor surface as depicted in FIG. 12k. Portions of thick dielectric layer 214 are at the lateral locations for, and later constitute portions of, gate dielectric layers 120 and 140 of HV IGFETs 104 and 106. To allow for subsequent increase in the thickness of the sections of dielectric layer 214 at the lateral locations for gate dielectric layers 120 and 140, the thickness of layer 214 is slightly less than the intended thickness for dielectric layers 120 and 140. For instance, the thickness of dielectric layer 214 is normally 7-15 nm, typically 11 nm.

Thick dielectric layer 214 is normally thermally grown. To inhibit redistribution of the various dopants introduced into epitaxial layer 36P, the thermal growth of dielectric layer 214 is usually done in a wet oxidizing environment according to a thermal profile in which the maximum thermal-oxidation temperature is relatively low, typically 700-900° C. Layer 214 normally consists of substantially pure silicon oxide for which the wet oxidizing environment is formed with oxygen and hydrogen.

The thermal schedule for growing thick dielectric layer 214 to a target thickness of approximately 11 nm typically consists of a ramp-up from 700° C. to 875° C. at 15° C./min. in nitrogen with 1% oxygen, a stabilization at 875° C. for 10 min. in nitrogen with 1% oxygen, a thermal oxidation at 875° C. for 20-30 min., typically 25 min., in hydrogen and oxygen diluted 90% in argon, a stabilization at 875° C. for 10 min. in nitrogen, a ramp-up from 875° C. to 900° C. at 10° C./min. in argon, an anneal at 900° C. for 10-15 min., typically 10 min., in argon, and a ramp-down from 900° C. to 600° C. in argon. Based on suitable experimentation, other thicknesses for dielectric layer 214 are obtained by modifying certain portions of the thermal schedule, e.g., the thermal oxidation at 875° C.

A photoresist mask 216 is formed on thick dielectric layer 214. See FIG. 12*l*. An opening extends through mask 216 above the active region for each of LV IGFETs 100 and 102. The uncovered material of dielectric layer 214 is removed as indicated in FIG. 12*l*. Item 214R is the remainder of layer 214.

A thin layer (not shown) of silicon along the upper surface of the active region for each of LV IGFETs 100 and 102 is also removed in order to compensate for the non-ideal silicon-oxide-to-silicon selectivity of the etching process. This ensures complete removal of the gate dielectric material at the removal locations. Additional defects and/or contamination, e.g., contamination caused by photoresist 216, present along the upper surface of the active regions for IGFETs 100 and 102, are removed in the course of removing the thin silicon layers. This further improves the upper surfaces of the active regions for IGFETs 100 and 102 in preparation for creating their gate dielectric layers 40 and 60 and thereby further reduces the 1/f noise in IGFETs 100 and 102. The removal of the thin silicon layers and the uncovered portions of dielectric layer 214 is typically done with a hydrofluoric-acid-based wet chemical etchant. Photoresist 216 is removed after the thin silicon layers are removed.

A (comparatively) thin gate-dielectric-containing dielectric layer 218 is provided along the upper semiconductor surface above the active regions for LV IGFETs 100 and 102 and thus at the respective lateral locations for their gate dielectric layers 40 and 60. See FIG. 12*m*. Portions of thin dielectric layer 218 later respectively constitute gate dielectric layers 40 and 60. The thickness of dielectric layer 218 substantially equals the thickness of gate dielectric layers 40 and 60, i.e., normally 2-8 nm, preferably 3-5 nm, typically 3.5 nm for 1.8-V operation.

Thin dielectric layer 218 is normally thermally grown. As with thick dielectric layer 218, the thermal growth of thin dielectric layer 218 is usually done in a wet oxidizing environment according to a thermal profile in which the maximum thermal-oxidation temperature is typically 700-900° C. so as to inhibit redistribution of the various dopants introduced into epitaxial layer 26P. Dielectric layer 218 may consist of substantially pure silicon oxide formed in a wet oxidizing environment of oxygen and hydrogen. Alternatively, nitrogen may be incorporated into layer 218 during the thermal growth by providing oxygen from a gas, such as nitric oxide or nitrous oxide, containing nitrogen in reactive form for preventing boron in p++ gate electrode 62 of p-channel LV IGFET 102 from diffusing into channel zone 52. Layer 218 then consists of silicon oxynitride.

The thickness of thick dielectric-layer remainder 214R increases slightly by thermal growth during the thermal growth of thin dielectric layer 218. Due to reduced oxygen penetration to the upper surfaces of the active regions for HV IGFET 104 and 106, the increase in the thickness of dielectric remainder 214R is less than the thickness of thin dielectric layer 218. At the end of the thermal growth of dielectric layer 218, the thickness of dielectric remainder 214R substantially equals the thickness of gate dielectric layers 120 and 140 of IGFETs 104 and 106, i.e., normally 8-16 nm, preferably 7-13 nm, typically 12 nm for 5.0-V operation. Portions of dielectric remainder 214R at the increased thickness later form gate dielectric layers 120 and 140.

A typical thermal schedule for growing thin dielectric layer 218 to a target thickness of approximately 4 nm and increasing the thickness of thick dielectric remainder 214R consists of a ramp-up from 700° C. to 750° C. at 15° C./min. in nitrogen with 1% oxygen, a stabilization at 750° C. for 10 min. in nitrogen with 1% oxygen, a thermal oxidation at 750° C. for 20-30 min., typically 25 min., in hydrogen and oxygen diluted 90% in argon, a stabilization at 750° C. for 10 min. in nitrogen, a ramp-up from 750° C. to 900° C. at 10° C./min. in argon, an anneal at 900° C. for 10-15 min., typically 10 min., in argon, and a ramp-down from 900° C. to 600° C. in argon. Based on suitable experimentation, other target thicknesses for dielectric layer 218 are achieved by adjusting certain portions of the thermal schedule, e.g., the length of the thermal oxidation at 750° C. For instance, reducing the duration of the 750° C. thermal oxidation by 10-15% leads to a target thin dielectric thickness of approximately 3.5 nm, the typical thickness value of gate dielectric layers 40 and 60 for operating IGFETs 100 and 102 at 1.8 V.

The anneal at 900° C. for growing thin dielectric layer 218 and increasing the thickness of thick dielectric remainder 218R can alternatively be done in nitrogen or nitrous oxide. The ramp-up to, and the ramp-down from, the 900° C. anneal are then typically done in nitrogen. The 900° C. anneal in argon, nitrogen, or nitrous oxide determines whether dielectric layer 218 consists of silicon oxide or silicon oxynitride. When the 900° C. anneal is done in argon or nitrogen, layer 218 consists substantially of silicon oxide. Layer 218 consists of silicon oxynitride when the 900° C. anneal is done in nitrous oxide. This occurs because nitrous oxide is much more reactive than argon and nitrogen and results in nitrogen being introduced into layer 218. The increased-thickness portions of dielectric remainder 214R are constituted the same as dielectric layer 218.

The 900° C. anneal can be replaced with an anneal at 1000\1C. The ramp-up rate, annealing time, and ramp-down rate for the 1000° C. anneal are typically respectively the same as for the 900° C. anneal.

Referring to FIG. 12*m*, a layer 220 of largely undoped (intrinsic) polysilicon is deposited on thick dielectric remainder 214R and thin dielectric layer 218 to a thickness of 200-300 nm, typically 250 nm. A photoresist mask 222 is formed on polysilicon layer 220. See FIG. 12*n*. An opening extends through mask 222 above the active region for each of HV IGFETs 104 and 106.

A p-type semiconductor dopant, referred to here as the p-type HV gate dopant, is introduced at a very heavy dosage into uncovered material 220D of polysilicon layer 220 to make uncovered polysilicon material 220D very heavily doped p-type. The p-type HV gate doping operation is normally performed by ion implantation as indicated in FIG. 12m. Portions of p++ polysilicon material 220D later become gate electrodes 122 and 142 of HV IGFETs 104 and 106. Item 220R indicates the remaining largely undoped material of polysilicon layer 220. Portions of polysilicon remainder 220R later become gate electrodes 42 and 62 of LV IGFETs 100 and 102. Photoresist 222 is removed after the p-type HV gate implantation is performed.

The dosage $DOSE_{PPOLY}$ of the p-type HV gate dopant is sufficiently high that the p-type polysilicon portions (of p++ polysilicon material 220D) which later become p++ gate electrodes 122 and 142 of HV IGFETs 104 and 106 remain very heavily doped p-type during subsequent doping operations. That is, neither of these two p-type polysilicon portions is fully counterdoped (converted to n-type conductivity) as a result of one or more subsequent n-type doping operations to which these polysilicon portions are subjected. As indicated below, the p-type polysilicon portion that becomes gate electrode 142 of IGFET 106 is not significantly subjected to n-type dopant during any later doping operation.

The p-type polysilicon portion that becomes gate electrode 122 of HV IGFET 104 is subjected to n-type doping during the formation of its source/drain regions 110. Main portions 110M of source/drain regions 110 are provided with a much greater dosage of n-type dopant than extensions 110E. When the p-type HV gate dopant is a fast-diffusing dopant, such as boron, introduced into uncovered polysilicon material 220D by ion implanting a suitable species of the fast-diffusing p-type dopant and when main source/drain portions 110M are very heavily doped n-type by ion implanting a suitable species of a relatively slow-diffusing n-type dopant such as arsenic or antimony, full counterdoping in the polysilicon portion that becomes gate electrode 122 is avoided by meeting the condition:

$$DOSEP_{POLY} > N_{NSDMAX} t_{POLY} \quad (5)$$

where $N_{NSDMAX}$ is the maximum net dopant concentration in n++ main source/drain portions 110M, and $t_{POLY}$ is the thickness of polysilicon layer 220 and thus largely the thickness of the polysilicon portion that becomes gate electrode 122.

Maximum net dopant concentration $N_{NSDMAX}$ for main source/drain portions 110M of HV IGFET 104 is normally close to the maximum solid solubility limit of n-type dopant in the silicon of main portions 110M. Inequality 5 can be readily satisfied because the fast diffusion of the p-type HV gate dopant into polysilicon material 220D leads to a relatively uniform vertical dopant profile in material 220D. In contrast, the relatively slow diffusion of the n-type dopant into the regions for main source/drain portions 110M produces an abrupt vertical dopant profile with a relatively high net dopant concentration at the upper semiconductor surface. The same arises with the relatively slow-diffusing n-type HV channel dopant, likewise preferably arsenic or antimony, typically arsenic, used in defining precursor channel zone 112P for IGFET 104.

Subject to meeting Inequality 5, the dosage of the p-type HV gate dopant is $1 \times 10^{16}$-$3 \times 10^{16}$ ions/cm$^2$, typically $2 \times 10^{16}$ ions/cm$^2$. The p-type HV gate dopant may consist of boron in elemental form or in the form of boron difluoride. For the typical case in which elemental boron constitutes the p-type HV gate dopant, the elemental boron is ion implanted at an energy of 25-45 keV, typically 35 keV.

When p-channel HV SCIGFET 106 is replaced with p-channel HV CJIGFET 184 or 190 having p channel zone 186 and n++ polysilicon gate electrode 188, photoresist mask 222 is replaced with a pair of photoresist masks. One of the replacement masks is utilized in introducing the p-type HV gate dopant into the portion of polysilicon layer 220 overlying the active region for n-channel HV CJIGFET 104 without introducing the p-type HV gate dopant into the portion of layer 220 overlying the active region for IGFET 184 or 190. The other replacement mask is, in a complementary manner, utilized in introducing an n-type semiconductor dopant, referred to here as the n-type HV gate dopant, into the portion of layer 220 overlying the active region for IGFET 184 or 190 without introducing the n-type HV gate dopant into the portion of layer 220 overlying the active region for IGFET 104. The doping operations involving the two replacement masks are discussed further below in connection with FIGS. 14a-14f.

Returning to FIG. 12, a patterning operation is performed on p++material 220D and remainder 220R of polysilicon layer 220 to define the lateral shapes for gate electrodes 42, 62, 122, and 142. In particular, a photoresist mask 224 is formed on polysilicon material 220D and polysilicon remainder 220R. See FIG. 12o. Mask 224 covers the portions of material 220D and remainder 220R at the intended locations for gate electrodes 42, 62, 122, and 142. The uncovered material of material 220D and remainder 220R is removed. The remaining portions 42P and 62P of polysilicon remainder 220R are respective largely undoped precursors to gate electrodes 42 and 62 of LV IGFETs 100 and 102. Remaining portions 122P and 142P of material 220D are respective p++ precursors to gate electrodes 122 and 142 of HV IGFETs 104 and 106.

Figure 13A:
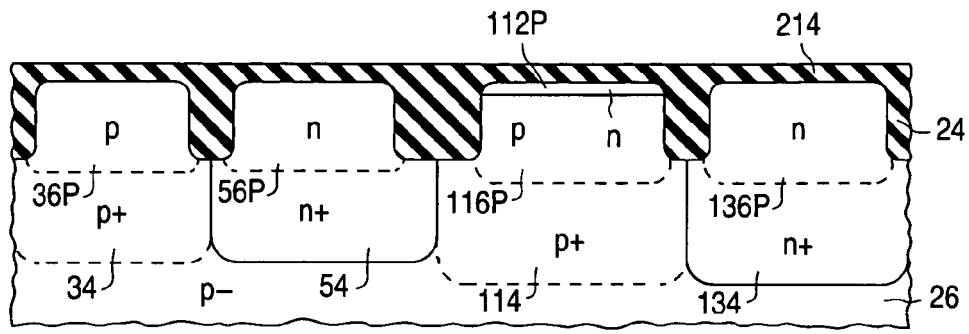
FIGS. 13$a$-13$f$ are cross-sectional side structural views of an alternative, in accordance with the invention, to the steps of FIGS. 12$k$-12$o$ for defining the shapes of the gate dielectric layers and gate electrodes starting with the structure of FIG. 12$k$ repeated as FIG. 13$a$.
Figure 13B:
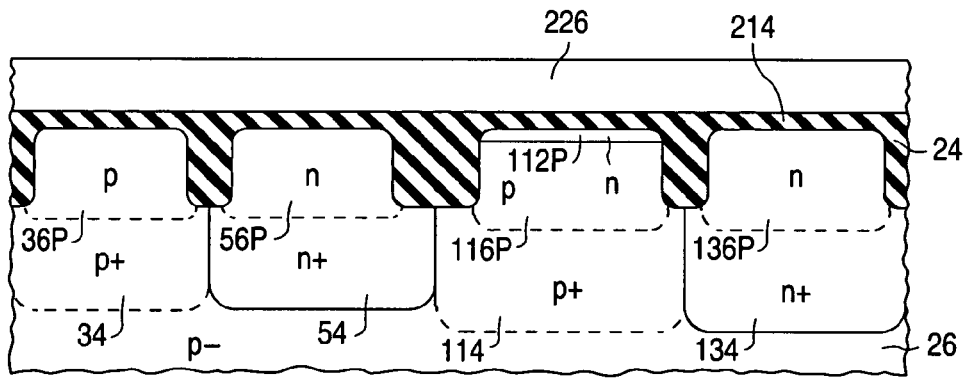

Switching temporarily to FIGS. 13a-13f (collectively "FIG. 13"), they illustrate an alternative procedure in accordance with the invention for defining the shapes of gate dielectric layers 40, 60, 120, and 140 and polysilicon gate electrodes 42, 62, 122, and 142 starting at the stage of FIG. 12k repeated here as FIG. 13a. In contrast to the procedure described above and illustrated in FIGS. 12k-12o for defining the gate-dielectric and gate-electrode shapes, the thickness of the sections of thick dielectric layer 214 at the lateral locations for gate dielectric layers 120 and 140 of HV IGFETs 104 and 106 does not increase significantly during processing in the alternative procedure of FIG. 13. The thickness of dielectric layer 214 as formed at the stage of FIG. 13a/12k in the alternative procedure of FIG. 13 is thus substantially equal to the thickness of gate dielectric layers 120 and 140, i.e., normally 6-16 nm, preferably 7-13 nm, typically 12 nm for 5.0-V operation.

Figure 13C:
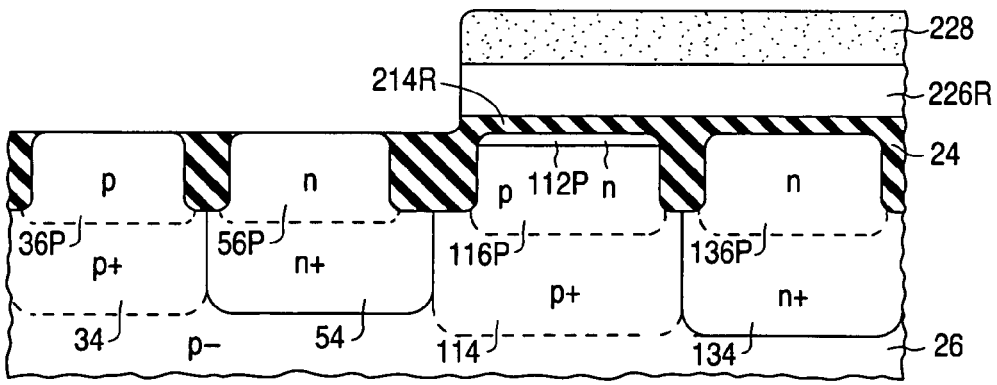

A first layer 226 of largely undoped polysilicon is deposited on thick dielectric layer 214 to a thickness of 200-300 nm, typically 250 nm. See FIG. 13b. Referring to FIG. 13c, a photoresist mask 228 is formed on first polysilicon layer 226. Mask 228 is of substantially the same lateral shape as photoresist mask 216 utilized to pattern dielectric layer 214 at the stage of FIG. 12l in the procedure of FIGS. 12k-12o. Mask 228 thus has an opening above the active region for each of LV IGFETs 100 and 102.

The uncovered material of first polysilicon layer 226 and the underlying material of thick dielectric layer 214 are removed as indicated in FIG. 13c. Item 226R is the remainder of polysilicon layer 226. Item 214R is again the remainder of dielectric layer 214. Portions of dielectric remainder 214R later form gate dielectric layers 120 and 140 of HV IGFETs 104 and 106.

Importantly, polysilicon remainder 226R covers dielectric remainder 214R during the removal of the material of thick dielectric layer 214 above the active regions for LV IGFETs 100 and 102. Consequently, dielectric remainder 214R is not significantly exposed to contaminants such as photoresist 228 or chemicals later used in removing photoresist 228. Since portions of dielectric remainder 214R later form gate dielectric layers 120 and 140 of HV IGFETs 104 and 106, the quality of gate dielectric layers 120 and 140 is improved. This leads to an improvement in the performance of IGFETs 104 and 106.

As in the procedure of FIGS. 12k-12o, a thin layer (again not shown) of silicon along the upper surface of the active region for each of LV IGFETs 100 and 102 is removed in the manner described above in connection with FIG. 12l. Additional silicon surface defects and/or surface contamination, such as contamination by photoresist 228, are removed in the course of removing the thin silicon layers. Removal of the thin silicon layers ensures complete removal of the gate dielectric material at the removal locations. The upper surfaces of the active regions for IGFETs 100 and 102 are thereby improved in preparation for creation of their gate dielectric layers 40 and 60. This again further reduces the 1/f noise in IGFETs 100 and 102. Photoresist 228 is removed after the thin silicon layers are removed.

Again as in the procedure of FIGS. 12k-12o, thin gate-dielectric-containing dielectric layer 218 is provided along the upper semiconductor surface above the active regions for LV IGFETs 100 and 102 and thus at the respective lateral locations for gate dielectric layers 40 and 60. See FIG. 13d. Thin dielectric layer 218 is of substantially the same thickness as described above and is formed in the same thermal growth manner. Hence, dielectric layer 218 may consist of largely pure silicon oxide or may consist of silicon oxynitride that includes nitrogen for preventing boron in p++ gate electrode 62 of IGFET 102 from diffusing into its channel zone 52.

During the formation of thin dielectric layer 218 in the process of FIG. 13, a barrier dielectric layer 230 forms along the exposed surface of first polysilicon remainder 220R, i.e., along its top surface and side edges. Barrier dielectric layer 230 is constituted substantially the same as thin layer 218. Because barrier layer 230 is created from the polysilicon of remainder 226R and because polysilicon oxidizes several times faster than monosilicon, barrier layer 230 is several times thicker than thin layer 218.

A second layer 232 of largely undoped polysilicon is deposited on thin dielectric layer 218 and barrier dielectric layer 230 as shown in FIG. 13d. The thickness of second polysilicon layer 232 is 200-300 nm, typically 250 nm. A photoresist mask 234 is formed on second polysilicon layer 232. See FIG. 13e. Mask 234 is of largely the same lateral shape as photoresist mask 222 utilized in ion implanting the p-type HV gate dopant at the stage of FIG. 12n in the procedure of FIGS. 12k-12o. Accordingly, mask 234 has an opening above the active region for each of HV IGFETs 104 and 106.

The uncovered material of second polysilicon layer 232 is removed as indicated in FIG. 13e. Item 232R is the remainder of polysilicon layer 232. Barrier dielectric layer 230 acts as a barrier (etch stop) to prevent first polysilicon remainder 226R from being attacked (and substantially removed) by the etchant utilized to remove the uncovered material of polysilicon layer 232. In the course of etching polysilicon layer 232, a parasitic polysilicon spacer may remain along the side edge of barrier layer 230. If formed, this polysilicon spacer can readily be removed, e.g., by extending the etch time for etching polysilicon layer 232 beyond the point at which the upper surface of barrier layer 230 is fully exposed. Accordingly, the polysilicon spacer is not shown in the drawings.

Barrier dielectric layer 230 is subsequently removed with etchant that does not significantly attack first polysilicon remainder 226R. Because barrier layer 230 covered the side edges of first polysilicon remainder 226R, polysilicon remainders 232R and 226R are laterally separated from each other by space above field insulation 24.

With photoresist mask 234 in place, the p-type HV gate dopant is introduced at a very heavy dosage into first polysilicon remainder 226R to make it very heavily doped p-type as shown in FIG. 13f. Portions of p++ polysilicon remainder 226R later become gate electrodes 122 and 142 of HV IGFETs 104 and 106. Photoresist 234 largely prevents the p-type HV gate dopant from entering second polysilicon remainder 232R, specifically the portions of polysilicon remainder 232R that later become gate electrodes 42 and 62 of LV IGFETs 100 and 102. Photoresist 234 is removed after performing the p-type HV gate implantation.

At this point, polysilicon remainders 226R and 232R are respectively shaped and doped largely the same as polysilicon remainder 220R and polysilicon material 220D in the procedure of FIGS. 12k-12o directly after the removal of photoresist mask 222 except that polysilicon remainders 226R and 232R are laterally separated from each other in the procedure of FIG. 13. However, the lateral separation between polysilicon remainders 226R and 232R occurs above field insulation 24 and is not significant insofar as gate electrodes 42, 62, 122, and 142 are created from polysilicon remainders 226R and 232R. Polysilicon remainders 226R and 232R are thus suitable for being patterned to define the lateral shapes of electrodes 42, 62, 122, and 142.

The patterning operation is initiated by forming photoresist mask 224 on polysilicon remainders 226R and 232R. Mask 224 covers the portions of second polysilicon remainder 232R at the intended locations for gate electrodes 42 and 62 and the portions of first polysilicon remainder 226R at the intended locations for gate electrodes 122 and 142. The uncovered material of polysilicon portions 226R and 232R is removed. The remaining largely undoped portions of second polysilicon remainder 232R are then precursor gate electrodes 42P and 62P of LV IGFETs 100 and 102. The remaining p++ portions of first polysilicon remainder 226R are precursor gate electrodes 122P and 142P of HV IGFETs 104 and 106. The structure processed according to the alternative of FIG. 13 now appears substantially as shown in FIG. 12o.

Regardless of which of the foregoing procedures is utilized to create thick dielectric remainder 214R, thin dielectric layer 218, and precursor gate electrodes 42P, 62P, 122P, and 142P, the portions of dielectric layer 218 below gate electrodes 42P and 62P respectively constitute dielectric layers 40 and 60 for LV IGFETs 100 and 102. See FIG. 12o. The portions of dielectric remainder 214R below gate electrodes 122P and 142P respectively constitute gate dielectric layers 120 and 140 for HV IGFETs 104 and 106. Surface-adjoining parts of precursor upper body-material portions 36P, 56P, 116P, and 136P situated generally below gate electrodes 42P, 62P, 122P, and 142P respectively constitute intended locations for channel zones 32, 52, 112, and 132 of respective IGFETs 100, 102, 104, and 106.

In the remainder of the process of FIG. 12, the complementary-IGFET structure at each processing stage is illustrated with a pair of FIGS. "12z.1" and "12z.2" where "z" is a letter varying from "p" to "x". Each FIG. 12z.1 illustrates the processing (if any) done to create LV IGFETs 100 and 102 while each FIG. 12z.2, illustrates the processing (if any) simultaneously done to create HV IGFETs 104 and 106. Each pair of FIGS. 12z.1 and 12z.2 is, for convenience, collectively referred to below as "FIG. 12z". For instance, FIGS. 12p.1 and 12p.2 are collectively referred to as "FIG. 12p".

A dielectric layer 236 of silicon oxide is thermally grown along the exposed surface of precursor polysilicon gate electrodes 42P, 62P, 122P, and 142P to seal them. See FIG. 12p. Seal-oxide layer 236 is typically 8 nm in thickness. During the polysilicon sealing step, the thickness of the portions of dielectric layers 214R and 218 not covered by gate electrodes 42P, 62P, 122P, and 142P increases slightly. This composite surface dielectric layer, which has segments at two different thicknesses, is indicated by reference symbol 238.

A photoresist mask 240 is formed on dielectric layers 236 and 238 as shown in FIG. 12p. An opening extends through mask 240 above the active region for p-channel LV IGFET 102. A pair of laterally separated heavily doped p-type precursor source/drain extensions 50EP for p-channel IGFET 102 are defined in n upper body-material portion 56P along the upper semiconductor surface by implanting ions of a species of a p-type semiconductor dopant, referred to here as the p-type LV source/drain extension dopant, at a heavy dosage through uncovered portions of surface dielectric layer 238 and into a pair of laterally separated surface-adjoining segments of body-material portion 56P. The material consisting of photoresist mask 240, field insulation 24, gate electrode 62P, and the portion of seal oxide 236 situated along electrode 62P forms a shield that largely blocks the p-type LV source/drain extension dopant from simultaneously passing through the upper semiconductor surface section directly underlying the shield.

The dosage of the p-type LV source/drain extension dopant is $3 \times 10^{13}$-$2 \times 10^{14}$ ions/cm$^2$, typically $6 \times 10^{13}$ ions/cm$^2$. The p-type source/drain extension dopant may consist of boron in the form of boron difluoride or in elemental form. For the typical case in which the p-type source/drain extension dopant consists of boron in the form of boron difluoride, the implantation energy is 5-20 keV, typically 15 keV.

With photoresist mask 240 in place, an n-type halo doping operation is performed by angled ion implantation to define a heavily doped n-type precursor halo region 58P for p-channel LV IGFET 102. See FIG. 12q. Ions of a species of the n-type halo dopant are implanted at a heavy dosage through uncovered portions of surface dielectric layer 238 and into a surface-adjoining segment of n upper body-material portion 36P at an average tilt angle of at least 15°, normally at least 25°, to a direction (perpendicular to the lower semiconductor surface and thus) generally perpendicular to the upper semiconductor surface.

For the long-channel version of p-channel LV IGFET 102, ions of the species of the n-type halo dopant are implanted through uncovered portions of surface dielectric layer 238 and into a pair of laterally separated surface-adjoining segments of n upper body-material portion 56P to define a pair of laterally separated heavily doped n-type precursor halo pocket portions. In either case, the material consisting of photoresist mask 240, field insulation 24, gate electrode 62P, and the portion of seal oxide 236 situated along electrode 62P forms a shield which largely blocks the n-type halo dopant from simultaneously passing through the upper semiconductor surface section directly underlying the shield.

The halo tilt angle is determined in a plane extending generally perpendicular to the upper semiconductor surface at a selected azimuthal (rotational) angle measured from a reference line in a plane extending generally parallel to the upper semiconductor surface. It is typically desirable that p-channel IGFET 102 be of generally symmetrical shape about a vertical line extending through the center of n channel zone 52 so that p-channel IGFET 102 performs largely the same regardless of which source/drain zone 50 acts as a source. Such a generally symmetrical shape is achieved by performing the n-type halo implantation at an even number $M_A$ of azimuthal angles at typical angular spacings of approximately $360°/M_A$. This is indicated in FIG. 12q by the pairs of crossing arrows. The arrows extending from upper right to lower left represent ions of one part of the species of n-type halo dopant moving generally parallel to a first impingement axis at one of the azimuthal angles. The arrows extending from upper left to lower right represent ions of another part of the species of the n-type halo dopant moving generally parallel to a second impingement axis at another of the azimuthal angles that differs by approximately 180° from the first-mentioned azimuthal angle.

When the reference line for measuring the azimuthal angles runs parallel to the channel length of p-channel IGFET 102 from a specified one of source/drain regions 50 to the other source/drain region 50, two of the $M_A$ azimuthal angles can be 0° and 180°. However, to alleviate ion channeling, one of these two azimuthal angles typically differs by a significant non-zero amount from 0° while the other azimuthal angle typically differs by approximately the same non-zero amount from 180°. For example, one of the two azimuthal angles can be 30-35° (or −35-−30°) while the other azimuthal angle is 210-215° (or 145-150°).

The tilt angles for the two azimuthal angles are usually close to each other, normally within 10° of each other, preferably within 5° of each other, and typically approximately equal to each other. Each tilt angle is typically 45°. Further information on the angle aspects of the n-type halo implantation is presented in U.S. Pat. No. 6,548,842 B1, cited above.

Due to the tilted implantation of the n-type halo dopant at two largely opposite azimuthal angles, ions of the n-type halo-dopant species penetrate below precursor gate electrode 62P of IGFET 102 into a pair of portions of the intended location for channel zone 32 along both transverse sides of gate electrode 62P. The ions that penetrate into the intended channel-zone location along one of the transverse sides of electrode 62P accumulate in one precursor halo pocket portion that extends below electrode 62P along that transverse gate-electrode side. The ions that penetrate into the intended channel-zone location along the other transverse side of electrode 62P accumulate in another precursor halo pocket portion that extends below electrode 62P along that other transverse gate-electrode side. IGFET 102 is of sufficiently small channel length that the two precursor halo pocket portions merge together below electrode 62P to define n+ precursor halo region 58P. The channel length in the long-channel version of IGFET 102 is sufficiently great that the two precursor halo pocket portions are spaced laterally apart from each other.

Substantially the same results occur in IGFET 102 and in its long-channel version when the number $M_A$ of azimuthal angles is an even number greater than 2. In that case, there are $M_A/2$ pairs of largely opposite azimuthal angles. The halo implantations a one of each of the pairs of azimuthal angles produce one of the precursor halo pocket portions. The halo implantations at the other of each of the pairs azimuthal angles produce the other precursor halo pocket portion.

The total dosage of the n-type halo dopant species is $8 \times 10^{12}$-$3 \times 10^{13}$ ions/cm$^2$, typically $1.6 \times 10^{13}$ ions/cm$^2$, regardless of the number $M_A$ of azimuthal angles. When $M_A$ is 2, half of the n-type halo dosage is preferably furnished at each of the two azimuthal angles. $M_A$ is often 4 whereby each consecutive pair of the four azimuthal angles differ by approximately 90°. One fourth of the n-type halo dosage is then preferably furnished at each azimuthal angle. The n-type halo dopant may consist of phosphorus or arsenic. For the typical case in which phosphorus constitutes the n-type halo dopant, the implantation energy is 125-175 keV, typically 150 keV. Photoresist 240 is removed after completing the n-type halo implantation.

A photoresist mask 242 is formed on dielectric layers 236 and 238 as depicted in FIG. 12r. An opening extends through mask 242 above the active region for n-channel LV IGFET 100. A pair of laterally separated heavily doped n-type precursor source/drain extensions 30EP for IGFET 100 are defined in p upper body-material portion 36P along the upper semiconductor surface by implanting ions of a species of an n-type semiconductor dopant, referred to here as n-type LV source/drain extension dopant, at a heavy dosage through uncovered portions of surface dielectric layer 238 and into a pair of laterally separated surface-adjoining segments of body-material portion 36P. The material consisting of photoresist mask 242, field insulation 24, gate electrode 42P, and the portion of seal oxide 236 situated along electrode 42P forms a shield that largely blocks the n-type source/drain extension dopant from simultaneously passing through the upper semiconductor surface section directly underlying the shield.

The dosage of the n-type LV source/drain extension dopant is $3\times10^{14}$-$1\times10^{15}$ ions/cm$^2$, typically $5\times10^{14}$ ions/cm$^2$. The n-type source/drain extension dopant may consist of arsenic or phosphorus. For the typical case in which arsenic constitutes the n-type source/drain extension dopant, the implantation energy is 5-30 keV, typically 20 keV.

With photoresist mask 242 in place, a p-type halo doping operation is performed by angled ion implantation to define a heavily doped p-type halo precursor region 38P for n-channel LV IGFET 100. See FIG. 12s. Ions of a species of the p-type halo dopant are implanted at a heavy dosage through uncovered portions of surface dielectric layer 238 and into a surface-adjoining segment of p upper body-material portion 36P at an average tilt angle of at least 15°, normally at least 25°, to a direction generally perpendicular to the upper semiconductor surface.

For the long-channel version of IGFET 100, ions of the species of the n-channel halo dopant are implanted through uncovered portions of surface dielectric layer 238 and into a pair of laterally separated surface-adjoining segments of p upper body-material portion 36P to define a pair of laterally separated heavily doped n-type precursor halo pocket portions. In both cases, the material consisting of photoresist mask 242, field insulation 24, precursor gate electrode 42P, and the portion of seal oxide 236 situated along electrode 42P forms a shield which largely blocks the p-type halo dopant from simultaneously passing through the upper semiconductor surface section directly underlying the shield.

The p-type angled halo implantation for n-channel IGFET 100 is performed at $M_A$ azimuthal angles in the same way as the n-type angled halo implantation for p-channel IGFET 102 where $M_A$ is again an even number. The tilt angles at each of the azimuthal angles for the p-type angled implantation are typically 40°.

Similar to what occurs in the n-type angled halo implantation for p-channel IGFET 102, the tilted implantation of the p-type halo dopant at two largely opposite azimuthal angles causes ions of the p-type halo-dopant species to penetrate below precursor gate electrode 42P of n-channel IGFET 100 into a pair of portions of the intended location of channel zone 32 along both transverse sides of gate electrode 42P. The ions passing along one of the transverse sides of gate electrode 42P accumulate in one precursor halo pocket portion that extends below electrode 42P along that transverse gate-electrode side. The ions passing along the other transverse side of electrode 42P accumulate in another precursor halo pocket portion that extends below electrode 42P along the other transverse gate-electrode side. The channel length of IGFET 100 is sufficiently small that these two precursor halo pocket portions merge together under gate electrode 42P to form p+ precursor halo region 38P. The long-channel version of IGFET 100 is of sufficiently great channel length that these two precursor halo pocket portions are spaced apart from each other. Also similar to what occurs in the n-type angled halo implantation for IGFET 102, substantially the same results arise when the number $M_A$ of azimuthal angles for the p-type angled halo implantation is an even number greater than 2.

The total dosage of the p-type halo dopant species is $8\times10^{12}$-$2\times10^{13}$ ions/cm$^2$, typically $1\times10^{13}$ ions/cm$^2$, regardless of the number $M_A$ of azimuthal angles. When $M_A$ is 2, half of the p-type halo dosage is preferably furnished at each of the two azimuthal angles. For the case in which $M_A$ is 4, one fourth of the p-type halo dosage is preferably furnished at each of the four azimuthal angles. The p-type halo dopant may consist of boron in the form of boron difluoride or in elemental form. For the typical case in which the p-type halo dopant consists of boron in the form of boron difluoride, the implantation energy is 50-100 keV, typically 75 keV. Photoresist 242 is removed after completing the p-type halo implantation.

A photoresist mask 244 is formed on dielectric layers 236 and 238 as shown in FIG. 12t. An opening extends through mask 244 above the active region for p-channel HV IGFET 106. A pair of heavily doped p-type precursor source/drain extensions 130EP for IGFET 106 are defined in n upper body-material portion 136P along the upper semiconductor surface by implanting of a species of a p-type semiconductor dopant, referred to here as the p-type HV source/drain extension dopant, at a heavy dosage through uncovered portions of surface dielectric layer 238 and into a pair of laterally separated surface-adjoining segments of body-material portion 136P. The material consisting of photoresist mask 244, field insulation 24, precursor gate electrode 142P, and the portion of seal oxide 236 along electrode 142P form a shield that largely blocks the p-type HV source/drain extension dopant from simultaneously passing through the upper semiconductor surface section directly underlying the shield.

The implantation of the p-type HV source/drain extension dopant for p-channel IGFET 106 is normally performed in the angled manner described above for the n-type halo dopant provided to p-channel IGFET 102. Although the number $M_A$ of azimuthal angles can be 2, four azimuthal angles are preferably used to improve uniformity. The tilt angles at each of the azimuthal angles for the p-type HV source/drain extension dopant are typically 40°. As a result of forming p+ source/drain extensions 130EP by angled implantation, precursor gate electrode 142P of IGFET 106 extends slightly over each extension 130EP.

The total dose of the p-type HV source/drain extension dopant is $1\times10^{13}$-$4\times10^{13}$ ions/cm$^2$, typically $2\times10^{13}$ ions/cm$^2$, regardless of the number $M_A$ of azimuthal angles. One fourth of the p-type HV source/drain extension dosage is preferably furnished at each azimuthal angle in the preferred case where $M_A$ is 4. The p-type HV source/drain extension dopant may consist of boron in the form of boron difluoride or in elemental form. For the typical case in which boron difluoride constitutes the p-type HV source/drain extension dopant, the implantation energy is 20-50 keV, typically 30 keV. Photoresist 244 is removed subsequent to the p-type HV source/drain extension implantation.

A photoresist mask 246 is formed on dielectric layers 236 and 238 as depicted in FIG. 12u. An opening extends through mask 246 above the active region for n-channel LV IGFET 104. A pair of heavily doped n-type precursor source/drain extensions 110EP for IGFET 104 are defined in p upper body-material portion 116P along the upper semiconductor surface by implanting ions of a species of an n-type semiconductor dopant, referred to here as the n-type HV source/drain extension dopant, at a heavy dosage through uncovered portions of surface dielectric layer 238 and into a pair of laterally separated surface-adjoining segments of body-material portion 116P. The material consisting of photoresist mask 246, field insulation 24, precursor gate electrode 122P, and the portion of seal oxide 236 along electrode 122P forms a shield that largely blocks the n-type HV source/drain extension dopant from passing through the upper semiconductor surface section directly below the shield.

The implantation of the n-type HV source/drain extension dopant for n-channel IGFET 104 is normally performed in the angled manner described above for the n-type halo dopant furnished to p-channel IGFET 102. Again, the number of $M_A$ of azimuthal angles is preferably 4 even though only two azimuthal angles can be used. The tilt angle at each of the azimuthal angles for the n-type HV source/drain extension dopant is typically 45°. Because n+ source/drain extensions 110EP are formed by angled halo implantation, precursor gate electrode 122P of IGFET 104 extends slightly over each extension 110EP.

The total dose of the n-type HV source/drain extension dopant is $1 \times 10^{13}$-$3 \times 10^{13}$ ions/cm², typically $2 \times 10^{13}$ ions/cm², regardless of the number $M_A$ of azimuthal angles. One fourth of the n-type HV source/drain extension dopant is preferably furnished at each azimuthal angle in the preferred case where $M_A$ is 4. The n-type HV source/drain extension dopant may consist of phosphorus or arsenic. For the typical case in which phosphorus constitutes the n-type HV source/drain extension dopant, the implantation energy is 40-80 keV, typically 60 keV. Photoresist 246 is removed subsequent to the n-type HV source/drain extension implantation.

For IGFET 102, the n-type halo implantation through photoresist mask 240 can be done prior to the p-type source/drain extension implantation through photoresist 240. For IGFET 100, the p-type halo implantation through photoresist mask 242 can be done prior to the n-type source/drain extension implantation through photoresist 242. Also, photoresist masks 240, 242, 244, and 246 can be formed on dielectric layers 236 and 238 in any order. In other words, the doping step(s) done with each of these four masks can be performed in any order with respect to the doping step(s) done with each other of these masks.

An extended-time low-temperature furnace anneal, referred to here as the source/drain extension anneal, may be performed at this point to remove defects caused by the heavy dosages of the source/drain extension implants. When performed, the source/drain extension anneal is done at 540-560° C., typically 550° C., for 60-120 min., typically 90 min., in a non-reactive environment or in a reactive oxygen-containing environment. When the source/drain extension anneal is done in a reactive oxygen-containing environment, the thicknesses of dielectric layers 236 and 238 increases slightly.

Next, gate sidewall spacer pairs 44, 64, 124, and 144 are provided respectively along the transverse sidewalls of precursor gate electrodes 42P, 62P, 122P, and 142P for respective IGFETs 100, 102, 104, and 106. See FIG. 12v.

In particular, a thin layer of tetraethyl orthosilicate ("TEOS") is deposited on top of the structure, typically to a thickness of 30 nm. A considerably thicker layer of silicon nitride is deposited on the TEOS layer, typically to a thickness of 100 nm. An anisotropic etch is performed generally perpendicular to the upper semiconductor surface to remove largely all the silicon nitride, except for portions situated on the TEOS layer to the sides of gate electrodes 42P, 62P, 122P, and 142P. Each gate sidewall spacer 44, 64, 124, or 144 thereby consists of a main silicon nitride portion situated on a TEOS footer which overlies portions of dielectric layers 236 and 238.

The portions of the TEOS layer not covered by the silicon nitride portions of gate sidewall spacers 44, 64, 124, or 144 are removed. The underlying portions of dielectric layers 236 and 238 are partially, but not totally, removed. Items 248 and 250 in FIG. 12v respectively indicate the respective remainders of dielectric layers 238 and 236 not covered by sidewall spacers 44, 64, 124, or 144.

A photoresist mask 252 is formed on dielectric layers 248 and 250 and on sidewalls spacers 64 and 144 as shown in FIG. 12w. An opening extends through mask 252 above the active region for each of n-channel IGFETs 100 and 104. A species of an n-type semiconductor dopant, referred to here as the n-type main source/drain dopant, is ion implanted at a very heavy dosage through uncovered portions of surface dielectric layer 248 to define n++ main source/drain portions 30M for IGFET 100 and n++ main source/drain portions 110M for IGFET 104. The n-type main source/drain dopant enters (a) a pair of laterally separated surface-adjoining segments of p precursor upper body-material portion 36P to define main source/drain portions 30M in portion 36P and (b) a pair of laterally separated surface-adjoining segments of p precursor upper body-material portion 116P to define main source/drain portions 110M in portion 116P.

The material consisting of photoresist mask 252, field insulation 24, precursor gate electrode 42P, and sidewall spacers 44 forms, for IGFET 100, a shield that largely blocks the n-type main source/drain dopant from passing through the upper semiconductor surface sections directly below the shield. The material consisting of mask 252, field insulation 24, precursor gate 122P, and sidewall spacers 124 similarly forms, for IGFET 104, a further shield that largely blocks the main source/drain dopant from passing through the upper semiconductor surface section directly below the further shield.

Subject to satisfying Inequality 5, the dosage of the n-type main source/drain dopant is $5 \times 10^{15}$-$1 \times 10^{16}$ ions/cm², typically $7 \times 10^{15}$ ions/cm². The n-type main source/drain dopant preferably consists of a slow-diffusing species such as arsenic or antimony. For the typical case in which arsenic constitutes the n-type main source/drain dopant, the implantation energy is 40-60 keV, typically 50 keV. Phosphorus can also be used as the n-type main source/drain dopant. Photoresist 252 is removed subsequent to the n-type main source/drain implantation.

Due to the presence of sidewall spacers 44, n++ main source/drain portions 30M for IGFET 100 respectively partially overlap n+ source/drain extensions 30EP. The presence of sidewall spacers 124 similarly results in n++ main source/drain portions 110M for IGFET 104 respectively partially overlapping n+ source/drain extensions 110EP. Main source/drain portions 30M and 110M are doped much heavier n-type than, and respectively extend deeper into upper body-material portions 36P and 116P than, precursor drain extensions 30EP and 110EP. Hence, the heavily doped n-type remainders of precursor extensions 30EP and 110EP respectively constitute n+ source/drain extensions 30E and 110E. The moderately doped p-type remainders of upper body-material portions 36P and 116P now respectively constitute p upper body-material portions 36 and 116. The p+ remainder of precursor halo region 38P now constitutes p+ halo region 38. The moderately doped n-type remainder of precursor channel zone 112P is now n channel zone 112.

Some p-type and n-type dopant was introduced into precursor gate electrode 42P of SCIGFET 100 during the p-type and n-type doping operations performed prior to the n-type main source/drain doping operations. However, the total amount of p-type dopant introduced into gate electrode 42P is insignificant compared to the amount of n-type dopant introduced into electrode 42P during the n-type main source/drain doping. Accordingly, precursor gate electrode 42P is now n++ gate electrode 42 of IGFET 100. Also, gate electrode 42 is of the same conductivity type, i.e., n-type, as source/drain zones 30.

Precursor gate electrode 122P of CJIGFET 104 received the very heavy dosage of the n-type main source/drain implantation. Some p-type and n-type dopant was also introduced into gate electrode 122P during the p-type and n-type doping operations conducted prior to the n-type main source/drain implantation but subsequent to the p-type HV gate implantation. The amount of n-type dopant introduced into electrode 122P during the doping operations performed between the p-type HV gate implantation and the n-type main source/drain implantation is insignificant compared to the amount of n-type dopant that electrode 122P received during the n-type main source/drain implantation. By satisfying Inequality 5, the amount of p-type dopant that electrode 122P received during the p-type HV gate implantation is considerably greater than the amount of all other n-type dopant, including the very heavy dosage of the n-type main source/drain implantation, received by electrode 122P. Accordingly, precursor electrode 122P remains very heavily doped p-type and is now p++ gate electrode 122 of IGFET 104. Importantly, gate electrode 122 is of opposite conductivity type to n-type source/drain regions 110 and n channel zone 112 as is typically desirable for a channel-junction IGFET.

A photoresist mask 254 is formed on dielectric layers 248 and 250 and on sidewall spacers 44 and 124 as depicted in FIG. 12x. An opening extends through mask 254 above the active region for each of p-channel IGFETs 102 and 106. A species of a p-type semiconductor dopant, referred to here as the p-type main source/drain dopant, is ion implanted at a very heavy dosage through uncovered portions of surface dielectric layer 248 to define p++ main source/drain portions for IGFET 102 and p++ main source/drain portions 130M for IGFET 106. The p-type main source/drain dopant enters (a) a pair of laterally separated surface-adjoining segments of n upper body-material portion 56P to define main source/drain portions 50M in portion 56P and (b) a pair of laterally separated surface-adjoining segments of p upper body-material portion 136P to define main source/drain portions 130M in portion 136P.

The material consisting of photoresist mask 254, field insulation 24, precursor gate electrode 62P, and sidewall spacers 64 forms, for IGFET 102, a shield that largely blocks the p-type main source/drain dopant from passing through the upper semiconductor surface section directly below the shield. The material consisting of mask 254, field insulation 24, precursor gate electrode 142P, and sidewall spacers 144 similarly forms, for IGFET 106, a further shield that largely blocks the p-type main source/drain dopant from passing through the upper semiconductor surface section directly below the further shield.

The dosage of the p-type main source/drain dopant is 2.5× $10^{15}$-1×$10^{16}$ ions/cm$^2$, typically 5×$10^{15}$ ions/cm$^2$. The p-type main source/drain dopant may consist of boron in the form of boron difluoride or in elemental form. For the typical case in which the p-type main source/drain dopant consists of boron in the form of boron difluoride, the implantation energy is 20-30 keV, typically 25 keV. Photoresist 254 is removed subsequent to the p-type main source/drain implantation.

Due to the presence of sidewall spacers 64, p++ main source/drain portions of IGFET 102 respectively partially overlap p+ source/drain extensions 50EP. The presence of sidewall spacers 144 similarly results in p++ main source/drain portions 130M of IGFET 106 respectively partially overlapping p+ source/drain extensions 130EP. Main source/drain portions 50M and 130M are doped much heavier p type than, and respectively extend deeper into upper body-material portions 56P and 136P than, precursor source/drain extensions 50EP and 130EP. Accordingly, the heavily doped p-type remainders of precursor extensions 50EP and 130EP now respectively constitute p+ source/drain extensions 50E and 130E. Similarly, the moderately doped n-type remainders of precursor upper body-material portions 56P and 136P now respectively constitute n upper body-material portions 56 and 136. The n+ remainder of precursor halo region 58P now constitutes n+ halo region 58.

Some n-type and p-type dopant was introduced into precursor gate electrode 62P of SCIGFET 102 during the n-type and p-type doping operations prior to the p-type main source/drain doping operation. However, the total amount of n-type dopant introduced into gate electrode 62P is insignificant compared to the amount of p-type dopant introduced into electrode 62P during the p-type main source/drain doping. Accordingly, gate electrode 62P is now p++ gate electrode 62 of IGFET 102. Also, gate electrode 62 is of the same conductivity type (p-type) as source/drain zones 50.

Precursor gate electrode 142P of SCIGFET 106 received only p-type dopant during the various doping operations. Very heavy dosages of p-type dopant were supplied to gate electrode 142P during the p-type HV gate implantation and the p-type main source/drain implantation. Accordingly, precursor electrode 142P is now p++ gate electrode 142 of IGFET 106. Additionally, p++ electrode 142P is of the same conductivity type (p-type) as source/drain regions 130.

The p-type main source/drain implantation can be performed before, rather than after, the n-type main source/drain implantation.

A capping layer (not shown) of dielectric material is formed on top of the structure. The capping dielectric layer typically consists of TEOS deposited by plasma-enhanced chemical vapor deposition to a typical thickness of 20 nm.

The semiconductor structure is now thermally annealed to repair lattice damage and activate the implanted source/drain and halo dopants. The anneal, referred to as the source/drain-halo anneal, is of such a nature that, at the end of the anneal, gate electrode 42 of IGFET 100 extends slightly over source/drain extensions 30E, and gate electrode 62 of IGFET 102 extends slightly over source/drain extensions 50E. Due to the use of angled ion implantation to define precursors 110EP and 130EP to source/drain extensions 110E and 130E, gate electrode 122 of IGFET 104 already extends slightly over extensions 110E, and gate electrode 142 of IGFET 106 likewise already extends slightly over extensions 130E.

The source/drain-halo anneal is typically an RTA at 1000-1100°, typically 1075° C., for 5-20 sec., preferably 10-15 sec., typically 12 sec. The RTA typically includes a ramp-up from 525° C. to the anneal temperature at 60-90° C./sec., typically 75° C./sec. The RTA also typically includes a ramp-down from the anneal temperature to 700° C. at −40-−60° C./sec., typically −50° C./sec. The RTA is preferably done in an non-reactive environment, typically nitrogen. Alternatively, the RTA can be done in a reactive oxygen-containing environment. In this case, silicon oxide grows along the upper silicon (both monosilicon and polysilicon) surfaces. The so-grown oxide can replace the capping dielectric layer.

The source/drain-halo anneal may include an extended-time furnace anneal performed before the source/drain-halo RTA at temperature considerably below the RTA annealing temperature. When performed, the furnace anneal is done at 540-560° C., typically 550° C., for 60-120 min., typically 90 min., in a non-reactive environment, or in a reactive oxygen-containing environment. The source/drain anneal is typically performed in an environment containing nitrogen and oxygen. When so done, the thicknesses of the dielectric layers along the upper silicon surfaces increase slightly. Although the above-mentioned source/drain and halo implantation steps define source/drain zones 30, 50, 110, and 130, channel zone 112, and halo regions 38 and 58, the source/drain-halo anneal consisting of the RTA and the optional furnace anneal completes the formation of these regions.

The thin layers of dielectric material, including dielectric layers 248 and 250, are removed along the upper semiconductor surface and along the top surfaces of gate electrodes 42, 62, 122, and 142. Field insulation 24 and spacers 44, 64, 124, and 144 remain substantially in place.

Metal silicide layers 46, 48, 66, 68, 126, 128, 146, and 148 are respectively formed along the upper surfaces of components 30M, 42, 50M, 62, 110M, 122, 130M, and 142. This typically entails depositing a thin layer of a suitable metal, typically cobalt, on the upper surface of the structure and then causing the metal to react with the underlying silicon to form silicide layers 46, 48, 66, 68, 126, 128, 146, and 148. The unreacted metal is subsequently removed. The metal silicide thickness is normally 25-35 nm, typically 30 nm. The metal silicide formation completes the basic fabrication of IGFETs 100, 102, 104, and 106. The resultant complementary-IGFET structure appears as shown in FIG. 3.

In subsequent process operations (not illustrated in the drawings), a layer of dielectric material is deposited on the upper surface of the structure of FIG. 3. Using a suitable photoresist mask, contact openings are etched through the dielectric material down to metal silicide layers 46, 48, 66, 68, 126, 128, 146, and 148. Alternatively, a self-aligned contact technique can be utilized to form contact openings through the dielectric material provided over the structure.

A layer of interconnect metal typically consisting principally of aluminum is deposited on the upper surface of the resulting structure. Using a suitable photoresist mask, the interconnect metal is patterned into a desired shape. The metallization process may include the formation of tungsten plugs. As desired, one or more further patterned metal interconnect layers can be provided over the structure.

Figure 14D:
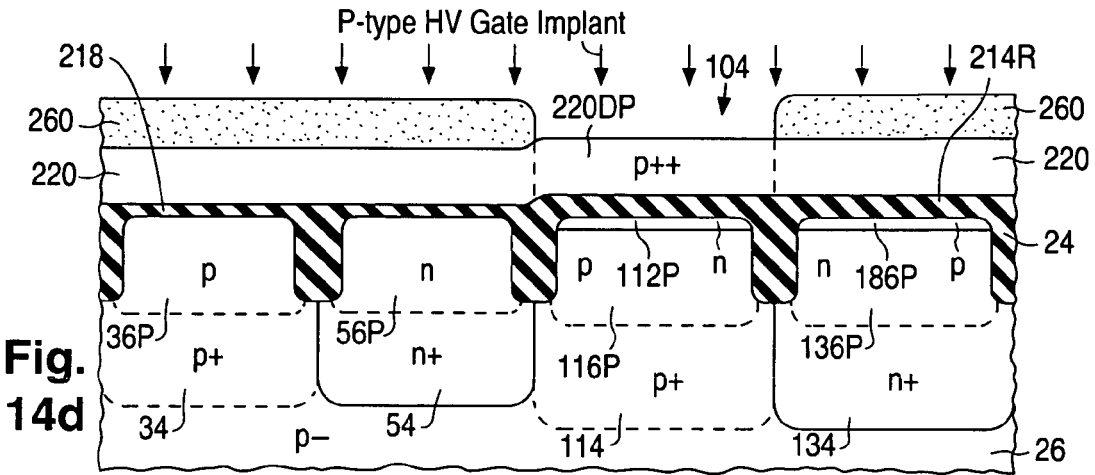
FIGS. 14$a$-14$f$ are cross-sectional side structural views of an alternative, in accordance with the invention, for replacing a high-voltage p-channel surface-channel IGFET with a high-voltage p-channel channel-junction IGFET starting from the structure of FIG. 12$e$ repeated as FIG. 14$a$.

FIGS. 14a-14f (collectively "FIG. 14") illustrate a procedure, starting at the stage of FIG. 12e repeated here as FIG. 14a, for modifying the process of FIG. 12 to replace p-channel HV surface-channel IGFET 106 with p-channel HV channel-junction IGFET 184. As an initial process modification, the n-type HV threshold-adjust dopant that was introduced into the intended location for channel zone 132 of IGFET 106 is not introduced into the intended channel zone location for IGFET 184.

Instead, using photoresist mask 208 as shown in FIG. 14b, the above-mentioned p-type HV channel dopant is introduced at a moderate dosage through the uncovered section of surface dielectric layer 202 into n upper body-material portion 136P to define a moderately doped p-type precursor 186P to p channel zone 186 of IGFET 184. The p-type HV channel dopant is normally introduced by ion implantation at a dosage of $8 \times 10^{12}$-$1.5 \times 10^{13}$ ions/cm$^2$, typically $1 \times 10^{13}$ ions/cm$^2$. The p-type HV channel dopant may consist of boron in elemental form or in the form of boron difluoride. For the typical case in which the p-type HV channel dopant consists of boron, the implantation energy is 5-15 keV, typically 10 keV.

The n-type HV well implantation, the n-type HV APT implantation, and the p-type HV channel implantation are all performed using photoresist mask 208 and, as indicated above, can be done in any order. Photoresist 208 is removed after these three implantations are completed.

Subsequent processing in the modification of FIG. 14 is the same as in the process of FIG. 12 up through the deposition of largely undoped polysilicon layer 220 at the stage of FIG. 12m. With precursor channel zone 186 now present, FIG. 14c illustrates how the structure appears at the stage equivalent to that of FIG. 12m.

A photoresist mask 260 is formed on polysilicon layer 220. See FIG. 14d. An opening extends through mask 260 above the active region for n-channel HV CJIGFET 104. Mask 260 covers the active region for p-channel HV CJIGFET 184 as well as the active regions for LV IGFETs 100 and 102.

The p-type HV gate dopant is introduced into uncovered portion 220DP of polysilicon layer 220 in the same way that the p-type HV gate dopant is introduced into uncovered portion 220D of layer 220 in the process of FIG. 12. Uncovered polysilicon portion 220DP, which overlies the active region for IGFET 104, thereby becomes very heavily doped p-type as indicated in FIG. 14d. Part of p++ polysilicon portion 220D later becomes p++ gate electrode 122 for IGFET 104. Inequality 5 is again preferably met to avoid full counterdoping later in precursor gate electrode 122P. Since photoresist 260 covers the active region for IGFET 184, the portion of polysilicon layer 220 overlying the active region for IGFET 184 remains largely undoped. Photoresist 260 is removed after performing the p-type HV gate implantation.

Figure 14E:
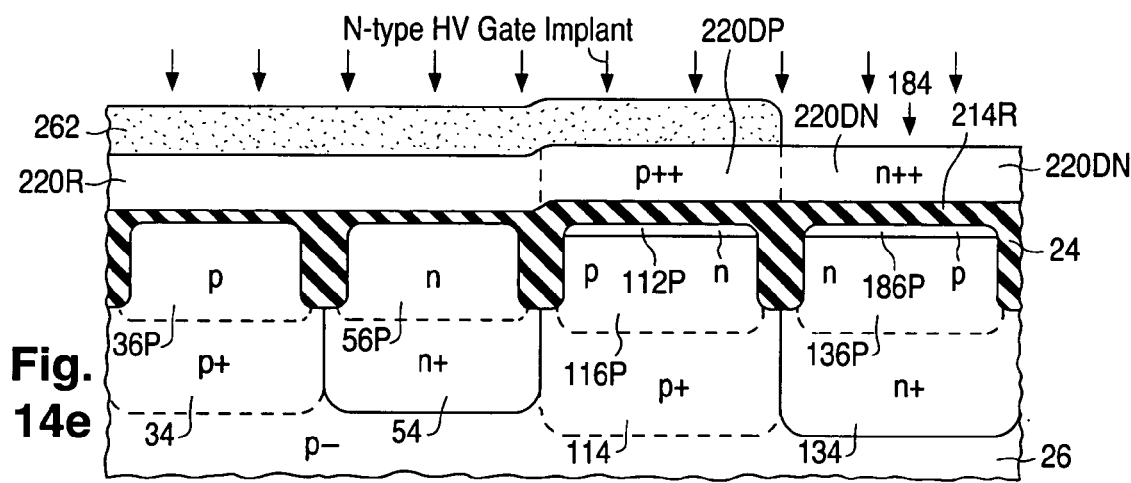

A photoresist mask 262 is formed on polysilicon layer 220 as depicted in FIG. 14e. An opening extends through mask 260 above the active region for p-channel HV CJIGFET 184. Mask 262 covers the active region for n-channel HV CJIGFET 104 as well as the active regions for LV IGFETs 100 and 102. The above-mentioned n-type HV gate dopant is introduced at a very heavy dosage into uncovered portion 220DN of polysilicon layer 220 to make uncovered portion 220DN very heavily doped n-type. The n-type HV gate doping operation is normally performed by ion implantation. Part of n++ polysilicon portion 220DN later becomes n++ gate electrode 188 for IGFET 184. Photoresist 262 is removed after performing the n-type HV gate implantation.

The dosage $DOSE_{NPOLY}$ of the n-type HV gate dopant is sufficiently high that the n-type polysilicon portion (of n++ polysilicon portion 220DN) which later becomes gate electrode 188 of IGFET 184 remains very heavily n-type doped during subsequent doping operations. In particular, the n-type polysilicon portion which later becomes gate electrode 188 is not fully counterdoped (converted to p-type conductivity) during the p-type doping operations which are utilized to form source/drain zones 130 of IGFET 184 (and source/drain zones 50 of IGFET 102) and to which that n-type polysilicon portion is subjected.

Main portions 130M of source/drain zones 130 of IGFET 184 are provided with a much greater dosage of n-type dopant than extensions 130E. Accordingly, full counterdoping in the n-type polysilicon portion which later becomes gate electrode 188 is avoided by meeting the condition:

$$DOSE_{NPOLY} > N_{PSDMAX} t_{POLY} \qquad (6)$$

where $N_{PSDMAX}$ is the maximum net dopant concentration in main source/drain portions 130M.

Subject to meeting Inequality 6, the dosage of the n-type HV gate dopant is $1 \times 10^{16}$-$3 \times 10^{16}$ ions/cm$^2$, typically $2 \times 10^{16}$ ions/cm$^2$. The n-type HV gate dopant preferably consists of a relatively fast-diffusing species such as phosphorus. In that case, the implantation energy is 20-40 keV, typically 30 keV. Arsenic may also be used as the n-type HV gate dopant.

The n-type HV gate implantation can be performed before, rather than after, the p-type HV gate implantation. In either case, item 220R indicates the remaining undoped material of polysilicon layer 220 after both the p-type and n-type HV gate implantations are completed.

Figure 14F:
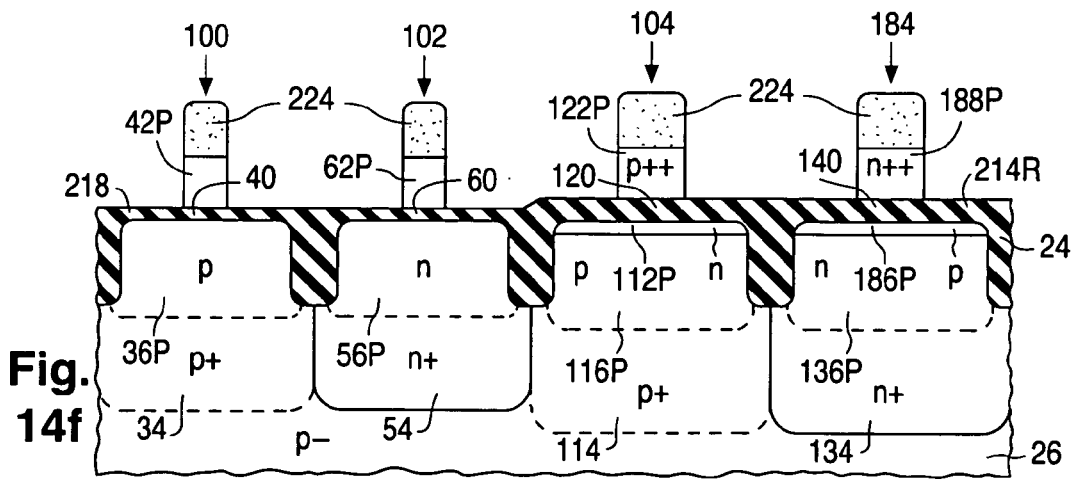

Further processing in the modification of FIG. 14 is conducted the same as described above for the process of FIG. 12 starting with the gate-electrode patterning step of FIG. 12o. FIG. 14f illustrates how the complementary-IGFET structure processed according to the modification of FIG. 14 appears at the stage equivalent to that of FIG. 12o. Remaining portions 42P and 62P of undoped polysilicon remainder 220R are again respective precursors to gate electrodes 42 and 62 of IGFETs 100 and 102. Item 122P, now the remaining portion of p++polysilicon portion 220DP, is the p++ precursor to gate electrode 122 of IGFET 104.

Remaining portion 188P of n++ polysilicon portion 220DN is an n++ precursor to gate electrode 188 of CJIGFET 184. After completion of the p-type main source/drain implantation at a stage equivalent to that of FIG. 12x, precursor electrode 188P is n++ gate electrode 188 of IGFET 184, and the moderately doped p-type remainder of precursor channel zone 186P is p channel zone 186 of IGFET 184. Importantly, n++ gate electrode 188 is of opposite conductivity type to source/drain zones 130 and channel zone 186 as is typically desirable for a channel-junction IGFET. The source/drain-halo anneal subsequent to the n-type and p-type main source/drain implantations complete the formations of n upper body-material portion 136 and p channel zone 186.

Photoresist masks 260 and 262 in the process modification of FIG. 14 essentially replace photoresist mask 222 in the process of FIG. 12. When the gate-dielectric and polysilicon gate-electrode materials are handled according to the alternative procedure of FIG. 13, photoresist mask 234 in the procedure of FIG. 13 is similarly replaced with a pair of photoresist masks (not shown) for enabling p-channel HV surface-channel IGFET 106 to be replaced with p-channel HV channel-junction IGFET 184.

Analogous to photoresist mask 260 in the alternative of FIG. 14, one of these two photoresist masks has an opening above the active region for CJIGFET 104, thereby exposing the portion of second polysilicon layer 232 above the active region for IGFET 104. Using this mask, the uncovered portion of polysilicon layer 232 is removed. With barrier dielectric layer 230 largely intact, the p-type HV gate implantation is then performed to introduce the p-type HV gate dopant through the resultant uncovered portion of barrier layer 230 and into the underlying portion of polysilicon remainder 220R at a very heavy dosage. This p++ portion of polysilicon remainder 226R overlies the active region of IGFET 104. Part of the p++ portion of polysilicon remainder 226R later constitutes precursor gate electrode 122P. The first photoresist is removed.

The second photoresist mask is analogous to photoresist mask 262 in the alternative of FIG. 14 and has an opening above the active region for CJIGFET 184. The portion of second polysilicon layer 232 above the active region for IGFET 184 is thus exposed. Using the second mask, the further uncovered portion of polysilicon layer 232 is removed. With barrier layer 230 still largely intact, the n-type HV gate implantation is subsequently performed to introduce the n-type HV gate dopant through the further resultant uncovered portion of barrier layer 230 and into the underlying portion of first polysilicon remainder 226R at a very heavy dosage. This further n++ portion of polysilicon remainder 226R overlies the active region for IGFET 184. Part of the n++ portion of polysilicon remainder 226R later constitutes precursor gate electrode 188P. The second photoresist is removed after which barrier layer 230 is removed.

The operations performed with either photoresist mask can be done first. The first-formed mask lies only on second polysilicon layer 232. Because part of polysilicon layer 232 is removed during the operations done with the first-formed mask so as to temporarily expose the underlying portion of barrier dielectric layer 230, the second-formed mask lies on the remainder of polysilicon layer 232 and the temporarily exposed part of barrier layer 230.

Variations

While the invention has been described with reference to particular embodiments, this description is solely for the purpose of illustration and is not to be construed as limiting the scope of the invention claimed below. For example, the p-type device body material of n-channel HV CJIGFET 104 may be extended downward in certain implementations of IGFET 104 to include a heavily doped (p-type) deep well portion analogous to n+ deep well portion 182 of p-channel HV IGFET 180 or 190. P+ well portion 114 then constitutes a shallow well portion for each so-modified version of IGFET 104. The p+ shallow and deep well portions form a composite p+ well portion. The p+ deep well ensures that the modified version of IGFET 104 is pn-junction isolated from n-type wells.

A p-type semiconductor dopant, referred to here as the p-type HV deep well dopant, is ion implanted at a heavy dosage into the semiconductor body to define the p+ deep well portion for each modified version of IGFET 104. If each implementation of IGFET 104 is to be modified to include a p+ deep well portion, the ion implantation is performed at the stage of FIG. 12f when photoresist mask 202 is present. The p-type HV deep well dopant passes through the uncovered section of screen oxide and into epitaxial layer 26P. In variations where each of one or more, but not all, implementations of IGFET 104, is to be modified to have a p+ deep well, the ion implantation is performed through a separate photoresist mask (not shown) provided over screen oxide 202 and having an opening above each location where an implementation of IGFET 104 is to be so modified.

The p-type HV deep well dopant causes the net dopant concentration in the p-type body material for each so-modified version of IGFET 104 to reach, in the p+ deep well, an additional local subsurface maximum below the location of the further (shallow well) subsurface maximum in the net dopant concentration of that p-type body material. The depth of the additional (deep well) local subsurface maximum in the net dopant concentration for the p-type body material of the modified version of IGFET 104 is typically roughly the same as the depth of the additional (deep well) local subsurface maximum in the net dopant concentration for the n-type body material of IGFET 180 or 190, i.e., normally 0.6-1.0 μm below the upper semiconductor surface, typically 0.8 μm below the upper semiconductor surface when the channel length is defined according to lithographic design rules whose minimum printable feature size is 0.25 μm or less, e.g., 0.18 μm.

Using high energy ion-implantation equipment, the p+ deep well portion of the modified version of n-channel HV CJIGFET 104 can be extended even deeper below the upper semiconductor and, in particular, to a depth sufficient to ensure that the modified version of IGFET 104 substantially avoids latchup. N+ deep well portion 182 of p-channel HV IGFET 180 or 190 can be modified in the same way so as to substantially ensure that latchup does not occur in the so-modified version of IGFET 180 or 190. The depths of the additional (deep well) local subsurface maximum in the net dopant concentration of the device body material for the modified version of IGFET 104, 180, or 190 is then typically greater than 1.0 μm, the top end of the normal depth range for ensuring pn-junction isolation.

N-channel LV SCIGFET 100 or 160 can be modified to have an n-type deep well that meets and extends around the bottom of p+ well portion 34 so as to separate p+ well 34 from underlying p− material 26. N-channel HV CJIGFET 104 can similarly be modified to have an n-type deep well that meets and extends around the bottom of p+ well portion 114 so as to separate p+ well 114 from p− material 26. When the p-type body material of IGFET 104 has been extended downward to include a p+ deep well portion, the n-type deep well for the modified version of IGFET 104 meets and extends around the bottom of the p+ deep well in such a manner that the composite p+ well (formed with the p+ shallow and deep well portions) is separated from p− material 26.

By separating p− material 26 from the lowest p+ well portions of the modified versions of n-channel IGFETs 100, 160, and 104, these n-type deep wells electrically isolate p-material 26 from the p-type device body material of the modified versions of IGFETS 100, 160, and 104. Consequently, the p-type body material for each so-modified version of IGFET 100, 160, or 104 can be electrically controlled independently of p− material 26.

The n-type deep well for the modified version of LV IGFET 100 or 160 is defined by ion implanting a species of an n-type semiconductor dopant, referred to here as the n-type LV opposite-conductivity-type deep well dopant, at the stage of FIG. 12d when photoresist mask 206 is present. The n-type LV opposite-conductivity-type deep well dopant passes through the uncovered portion of screen oxide 202 and into epitaxial layer 26P. The n-type deep well for the modified version of HV IGFET 104 is similarly defined by ion implanting a species of an n-type semiconductor dopant, referred to here as the n-type HV opposite-conductivity-type deep well dopant, at the stage of FIG. 12f when photoresist mask 210 is present. The n-type HV opposite-conductivity-type deep well dopant passes through the uncovered portion of oxide 202 and into layer 26P.

Thick dielectric layer 214R and thin dielectric layer 218, whether created according to the steps of FIGS. 12k-12m or the steps of FIGS. 13a-13d, together form a multiple-thickness gate-dielectric-containing dielectric layer (214R/218) whose thickness is (a) comparatively low at the lateral locations for gate dielectric layers 40 and 60 of LV IGFETs 100 and 102 and their respective LV variations 160 and 162 and (b) comparatively high at the lateral locations for gate dielectric layers 120 and 140 of HV IGFETs 104 and 106 and HV variations 180, 184, and 190 of IGFET 106. Instead of creating this multiple-thickness dielectric layer according to the dual dielectric-growth procedure of FIGS. 12k-12m or the dual dielectric-growth procedure of FIGS. 13a-13d, the multiple-thickness dielectric layer can be created by substantially a single dielectric-growth procedure in which the thermal growth of the multiple-thickness dielectric layer is suitably retarded at the locations for gate dielectric layers 40 and 60 or/and suitably enhanced at the locations for dielectric layers 120 and 140.

For instance, the thermal oxidation of a layer of silicon is retarded when the layer is initially provided with nitrogen. With this in mind, a thermal-oxidation-retarding impurity such as nitrogen can be selectively introduced to a relatively small average depth into precursor upper body-material portions 36P and 56P for respective LV IGFETs 100 (or 160) and 102 (or 162) at the stage of FIG. 12j using a suitable photoresist mask (not shown) having openings above the active regions for IGFETs 100 and 102. The thermal-oxidation-retarding impurity is then present in a thin surface layer of each upper body-material portion 36P or 56P. The introduction of the thermal-oxidation-retarding impurity can be performed by diffusing the impurity from a suitable impurity source or by shallow ion implantation typically accompanied by a thermal anneal in a non-oxidizing environment to appropriately distribute the impurity. The conditions of impurity introduction are controlled in such a way as to substantially avoid having the thermal-oxidation-retarding impurity spread in a manner that later impairs IGFET operation.

The photoresist mask for the thermal-oxidation-retarding impurity is removed. A thermal oxidation is subsequently performed to grow the multiple-thickness gate-dielectric-containing dielectric layer. Due to the presence of the thermal-oxidation-retarding impurity in the thin surface layers of upper body-material portions 36P and 56P, the growth of the multiple-thickness dielectric layer is retarded along the upper surfaces of body-material portions 36P and 56P for LV IGFETs 100 and 102. Consequently, the multiple-thickness dielectric layer is thicker at the locations for gate dielectric layers 120 and 140 of HV IGFETs 104 and 106 than at the locations for dielectric layers 40 and 60 of IGFETs 100 and 102.

Alternatively or/and additionally, a thermal-oxidation-enhancing impurity can be selectively introduced to a relatively small average depth into precursor upper body-material portions 116P and 136P for respective HV IGFETs 104 and 106 (or 180, 184, and 190) at the stage of FIG. 12j using a suitable photoresist mask (not shown) having openings above the active regions for IGFETs 104 and 106 so that the thermal-oxidation-enhancing impurity is present in a thin surface layer of each upper body-material portion 116P or 136P. Similar to how the thermal-oxidation-retarding impurity is introduced, the introduction of the thermal-oxidation-enhancing impurity can be performed by diffusing the impurity from a suitable dopant source or by shallow ion implantation typically accompanied by a thermal anneal in a non-oxidizing environment to appropriately distribute the impurity. The conditions for introducing the thermal-oxidation-enhancing impurity are controlled in such a way as to substantially avoid having the impurity spread in a manner that later impairs IGFET operation.

The photoresist mask for the thermal-oxidation-enhancing impurity is removed. If the thermal-oxidation-retarding impurity is also introduced into thin surface layers of upper body-material portions 36P and 56P for respective LV IGFETs 100 and 102, introduction of the thermal oxidation retarding impurity can be performed before or after introduction of the thermal-oxidation-enhancing impurity. Regardless of whether the thermal-oxidation-retarding impurity is, or is not, introduced into body-material portions 36P and 56P, a thermal oxidation is performed to grow the multiple-thickness gate-dielectric-containing dielectric layer. Due at least to the presence of the thermal-oxidation-enhancing impurity in the thin surface layers of upper body-material portions 116P and 136P, the growth of the multiple-thickness dielectric layer is enhanced along the upper surfaces of body-material portions 116P and 136P for HV IGFETs 104 and 106. Hence, the multiple-thickness dielectric layer is again thicker at the locations for dielectric layers 120 and 140 of IGFETs 104 and 106 than at the locations for dielectric layers 40 and 60 of IGFETs 100 and 102.

The thermal-oxidation-enhancing impurity can be oxygen or another non-dopant impurity that enhances the oxidation of semiconductor material such as monosilicon. In the case of oxygen, introduction of oxygen into upper body-material portions 116P and 136P of respective IGFETs 104 and 106 simply makes more oxygen available for reaction with silicon near the upper surfaces of body-material portions 116P and 136P to form the silicon oxide later patterned into gate dielectric layers 120 and 140.

With the multiple-thickness dielectric layer (214R/218) having been formed by using a thermal-oxidation-retarding impurity or/and a thermal-oxidation-enhancing impurity in the preceding manner, polysilicon layer 220 is deposited on the multiple-thickness dielectric layer in the manner generally shown in FIG. 12*m*. Reference symbols 214R and 218 in FIG. 12*m* can now respectively represent the thin and thick portions of the multiple-thickness dielectric layer. The remainder of the complementary-IGFET fabrication process proceeds as described above in connection with FIGS. 12*n*-12*x*.

Photoresist mask 216 is utilized in the dual dielectric-growth procedure of FIGS. 12*k*-12*m* to form the composite gate-dielectric-containing dielectric layer consisting of (a) dielectric remainder 214R at a (comparatively) small thickness and (b) dielectric layer 218 at a (comparatively) large thickness. One photoresist mask, which can be substantially the same as mask 216, is employed in creating the multiple-thickness dielectric layer according to the single dielectric-growth procedure that uses the thermal-oxidation-retarding impurity. One photoresist mask is similarly utilized in forming the multiple-thickness dielectric layer according to the single dielectric-growth procedure that uses the thermal-oxidation-enhancing impurity. Hence, employing either the thermal-oxidation-retarding impurity or the thermal-oxidation-enhancing impurity in creating the multiple-thickness dielectric layer does not require any more photoresist masking than is needed to form multiple-thickness dielectric layer 214R/218 according to the procedure of FIGS. 12*k*-12*m*.

Notably, no photoresist mask is formed on the multiple-thickness dielectric layer when it is created using a thermal-oxidation-retarding impurity or/and a thermal-oxidation-enhancing impurity in the foregoing manner. Similar to what occurs in the procedure of FIG. 13, the multiple-thickness dielectric layer is thus not significantly exposed to contaminants such as photoresist or chemicals used in removing photoresist. Since gate dielectric layers 120 and 140 of HV IGFETs 104 and 106 are created from the thicker material of the multiple-thickness dielectric layer, the quality of dielectric layers 120 and 140 is improved.

All of IGFETs 100, 102, 104, 106, 160, 162, 180, 184, and 190 and the long-channel versions of IGFETs 100 and 102 are largely symmetrical devices. However, when one of the source/drain zones of an IGFET serves permanently as the source while the other source/drain zone serves permanently as the drain, a source/drain extension zone in an IGFET of the invention may only be provided as part of the drain so that the IGFET is an asymmetrical device. If an IGFET is a low-voltage device that receives a halo implantation, a halo pocket portion may be provided only along the source.

The present semiconductor structure may include like-polarity IGFETs whose channel lengths extend approximately perpendicular to each other. In that case, performing each of the angled halo ion implantations at four azimuthal angles helps assure that all of the LV IGFETs appropriately receive n-type or p-type halo dopant. The same applies to the angled ion implantations of the source/drain extension dopants for the HV IGFETs.

The source/drain zones of both the LV and HV IGFETs can be provided with vertically "graded" junction characteristics. That is, in moving upward from the pn junction between a source/drain zone and the adjoining body material, the net dopant concentration in a vertical cross section through the source/drain zone rises less sharply, on the average, to the maximum value of the net dopant concentration in that vertical cross section than what would occur if the semiconductor dopant which defines the source/drain zone across that vertical cross section were ion implanted at largely a single energy. The graded-junction characteristic reduces the junction capacitance, thereby leading to an increase in the IGFET switching speed.

The graded-junction characteristic is achieved by providing each source/drain zone 30, 50, 110, or 130 with a lower portion which underlies, is vertically continuous with, and is more lightly doped than main source/drain portion 30M, 50M, 110M, or 130M but is still heavily doped. The lower heavily doped n-type source/drain portions for n-channel IGFETs 100 and 104 are created using photoresist mask 252 (see FIG. 12*w*) by ion implanting a species of an n-type semiconductor dopant, referred to here as the n-type lower source/drain dopant, through the uncovered portions of surface dielectric layer 248 into p upper-body material portions 36 and 116 (or 36P and 136P). The n-type lower source/drain dopant is ion implanted to a greater average depth (below the upper semiconductor surface) than, but at a lower dosage than, the n-type main source/drain dopant.

The lower heavily doped p-type source/drain portions for p-channel IGFETs 102 and 106 are similarly created using photoresist mask 254 (see FIG. 12*x*) by ion implanting a species of a p-type semiconductor dopant, referred to here as the p-type lower source/drain dopant, through the uncovered portions of surface dielectric layer 248 into n upper body-material portions 56 and 136 (or 56P and 136P). The p-type lower source/drain dopant is ion implanted to a greater average depth than, but at a lower dosage than, the p-type main source/drain dopant. The portions of the n-type and p-type dopants underlying main source/drain portions 30M, 50M, 110M, and 130M constitute the lower source/drain portions to achieve the graded-junction characteristic.

The term "polysilicon" as used above in describing the principal constituent of gate electrodes 42, 62, 122, and 142 means conventional polysilicon, a form of non-monocrystalline silicon semiconductor material in which atoms of silicon are organized in single-crystal grains consisting of multiple atoms having significant long-range order. Layer 216 from which gate electrodes 42, 62, 122, and 142 are created in the process of FIG. 12 can sometimes be deposited as amorphous polysilicon, a form of non-monocrystalline silicon semiconductor material in which the silicon atoms have short-range, near-atomic order. The amorphous polysilicon converts to conventional polysilicon during the heat treatments that occur during the process of FIG. 12 subsequent to the deposition of layer 216. The same applies to layers 226 and 232 from which gate electrodes 42, 62, 122, and 142 are created in the alternative of FIG. 13. Semiconductor materials, such as germanium or a silicon-germanium alloy, can replace silicon in the semiconductor body or/and in gate electrodes 42, 62, 122, and 142.

Composite gate electrodes 42/48, 62/68, 122/128, and 142/148 can be respectively replaced with gate electrodes consisting substantially fully of metal silicide, e.g., cobalt silicide or nickel silicide, except for dopant provided in the silicide gate electrodes to control their work functions. The dopant is typically introduced by ion implantation.

The mobilities of electrons and holes can be increased by replacing p– material 26P with a lightly doped p-type strained monosilicon layer formed on a relaxed p-type silicon-germanium layer provided on a monosilicon semiconductor substrate. Various modifications and applications may thus be made by those skilled in the art without departing from the true scope of the invention as defined in the appended claims.

We claim:

1. A method comprising:
   selectively introducing channel-zone-defining n-type semiconductor dopant into a semiconductor body to define an n-type region that includes a surface-adjoining n-type channel zone for a normally off n-channel channel-junction insulated-gate field-effect transistor ("CJIGFET");
   subsequently providing the semiconductor body with gate dielectric material having parts that respectively substantially constitute (a) a gate dielectric layer for an n-channel surface-channel insulated-gate field-effect transistor ("SCIGFET") and (b) a gate dielectric layer for the n-channel CJIGFET along its channel zone;
   defining (a) a gate electrode for the n-channel SCIGFET over its gate dielectric layer and (b) a gate electrode for the n-channel CJIGFET over its gate dielectric layer such that each gate dielectric layer extends from the overlying gate electrode to the semiconductor body along largely all lateral area of that gate electrode; and
   selectively introducing (a) source/drain-defining n-type semiconductor dopant into p-type material of the semiconductor body to define, for the n-channel SCIGFET, a pair of laterally separated surface-adjoining n-type source/drain zones between which a surface-adjoining p-type channel zone extends along the gate dielectric layer for the n-channel SCIGFET such that its gate dielectric layer overlies its channel zone, partially overlies its source/drain zones, and is separated from its source/drain and channel zones by at least its gate dielectric layer and (b) source/drain-defining n-type semiconductor dopant into the semiconductor body to define, for the n-channel CJIGFET, a pair of laterally separated surface-adjoining n-type source/drain zones between which the n-type channel zone for the n-channel CJIGFET extends such that its gate electrode overlies its channel zone, partially overlies its source/drain zones, and is separated from its source/drain and channel zones by at least its gate dielectric layer and such that the channel zone of the n-channel CJIGFET is more lightly doped than its source/drain zones.

2. A method as in claim 1 wherein:
   the gate electrode of the n-channel SCIGFET comprises n-type semiconductor material; and
   the gate electrode of the n-channel CJIGFET comprises p-type semiconductor material.

3. A method as in claim 2 wherein the gate electrode of the n-channel CJIGFET is made p-type prior to defining its source/drain zones.

4. A method as in claim 1 wherein the gate dielectric layer of the n-channel CJIGFET is materially thicker than the gate dielectric layer of the n-channel SCIGFET.

5. A method as in claim 1 wherein the channel-zone-defining and source/drain-defining n-type dopants comprise arsenic.

6. A method as in claim 1 wherein part of the gate dielectric material constitutes a gate dielectric layer for a p-channel SCIGFET, the method further including:
   defining a gate electrode for the p-channel SCIGFET over its dielectric layer; and
   selectively introducing source/drain-defining p-type semiconductor dopant into n-type material of the semiconductor body to define, for the p-channel SCIGFET, a pair of laterally separated surface-adjoining p-type source/drain zones between which a surface-adjoining n-type channel zone extends along the gate dielectric layer for the p-channel SCIGFET such that its gate electrode overlies its channel zone, partially overlies its source/drain zones, and is separated from its source/drain zones by at least its gate dielectric layer.

7. A method as in claim 6 wherein:
   the gate electrode of the n-channel SCIGFET comprises n-type semiconductor material; and
   the gate electrodes of the p-channel SCIGFET and the n-channel CJIGFET comprise p-type semiconductor material.

8. A method as in claim 7 wherein the gate electrode of the n-channel CJIGFET is made p type prior to defining its source/drain zones.

9. A method as in claim 6 wherein the channel-zone-defining and source/drain-defining n-type dopants comprise arsenic.

10. A method as in claim 6 wherein the gate dielectric layer of the n-channel CJIGFET is materially thicker than the gate dielectric layers of the two SCIGFETs.

11. A method as in claim 10 wherein the gate-dielectric-material-providing act comprises:
    forming a first dielectric layer along the semiconductor body at least along the lateral locations for the three gate dielectric layers;
    removing largely all the material of the first dielectric layer generally along the lateral locations for the gate dielectric layers of the two SCIGFETs; and
    forming a second dielectric layer along the semiconductor body at least along the lateral locations for the gate dielectric layers of the two SCIGFETs such that (a) the gate dielectric layers of the two SCIGFETs respectively comprise a pair of laterally separated portions of the second dielectric layer and (b) the gate dielectric layer of the n-channel CJIGFET comprises a portion of remaining material of the first dielectric layer.

12. A method as in claim 11 wherein the first dielectric layer is materially thicker than the second dielectric layer.

13. A method as in claim 11 wherein the acts of forming the first and second dielectric layers comprise reacting oxygen with material of the semiconductor body such that each gate dielectric layer comprises semiconductor material and oxygen.

14. A method as in claim 13 wherein the act of forming the first dielectric layer further includes reacting nitrogen with material of the semiconductor body such that the gate dielectric layers of the two SCIGFETs further include nitrogen.

15. A method as in claim 11 further including before forming the first dielectric layer:

thermally oxidizing material of the semiconductor body along at least the lateral locations for the three gate dielectric layers to form a sacrificial dielectric layer; and substantially removing the sacrificial dielectric layer.

16. A method as in claim 15 further including, between forming the sacrificial dielectric layer and forming the first dielectric layer, removing a layer of material of the semiconductor body along at least the lateral location of the gate dielectric layer for each SCIGFET.

17. A method as in claim 11 wherein the gate-electrode-defining acts comprise:
    depositing, subsequent to forming the second dielectric layer, a semiconductor layer over the second dielectric layer and the remaining material of the first dielectric layer; and
    patterning the semiconductor layer and doping it selectively with n-type and p-type semiconductor dopants to define the three gate electrodes such that (a) the gate electrode of the n-channel SCIGFET comprises n-type material of the semiconductor layer and (b) the gate electrodes of the p-channel SCIGFET and the n-channel CJIGFET comprise p-type material of the semiconductor layer.

18. A method as in claim 10 wherein the gate-dielectric-material-providing and gate-electrode-defining acts comprise:
    forming a first dielectric layer along the semiconductor body at least along the lateral locations for the three gate dielectric layers;
    depositing a first semiconductor layer over the first dielectric layer;
    removing largely all the material of the first semiconductor layer and the first dielectric layer generally along the lateral locations for the gate dielectric layers of the two SCIGFETs;
    forming a second dielectric layer along the semiconductor body at least along the lateral locations for the gate dielectric layers of the two SCIGFETs such that (a) the gate dielectric layers of the two SCIGFETs respectively comprise a pair of laterally separated portions of the second dielectric layer and (b) the gate dielectric layer of the n-channel CJIGFET comprises a portion of remaining material of the first dielectric layer;
    depositing a second semiconductor layer over at least the second dielectric layer; and
    patterning the two semiconductor layers and doping them selectively with n-type and p-type semiconductor dopants to define the three gate electrodes such that (a) the gate electrode of the n-channel SCIGFET comprises n-type material of the second semiconductor layer, (b) the gate electrode of the p-channel SCIGFET comprises p-type material of the second semiconductor layer, and (c) the gate electrode of the n-channel CJIGFET comprises p-type material of the first semiconductor layer.

19. A method as in claim 18 wherein the first dielectric layer is materially thicker than the second dielectric layer.

20. A method as in claim 18 wherein the acts of forming the first and second dielectric layers comprise reacting oxygen with material of the semiconductor body such that each gate dielectric layer comprises semiconductor material and oxygen.

21. A method as in claim 20 wherein the act of forming the first dielectric layer further includes reacting nitrogen with material of the semiconductor body such that the gate dielectric layers of the two SCIGFETs further include nitrogen.

22. A method as in claim 18 wherein:
    the second dielectric-layer-forming act includes forming a barrier dielectric layer along the remaining material of the first dielectric layer along at least the lateral location for the gate dielectric layer of the n-channel CJIGFET; and
    the patterning and doping act includes removing material of the second semiconductor layer overlying the remainder of the first semiconductor layer using the barrier dielectric layer to substantially prevent the remaining material of the first semiconductor layer from being removed.

23. A method as in claim 18 further including before forming the first dielectric layer:
    thermally oxidizing material of the semiconductor body along at least the lateral locations for the three gate dielectric layers to form a sacrificial dielectric layer; and substantially removing the sacrificial dielectric layer.

24. A method as in claim 23 further including, between forming the sacrificial dielectric layer and forming the first dielectric layer, removing a layer of material of the semiconductor body along at least the lateral location of the gate dielectric layer for each SCIGFET.

25. A method as in claim 6 wherein the channel zone of each SCIGFET has a location for a channel surface depletion region which extends into that channel zone during operation of that SCIGFET, the method further including prior to defining lateral shapes for the gate electrodes of the two SCIGFETs:
    introducing primary p-type semiconductor dopant into the semiconductor body such that the primary p-type dopant reaches a maximum concentration below the location for the channel surface depletion region of the n-type SCIGFET but no more than 0.4 µm deep into the semiconductor body; and
    selectively introducing primary n-type semiconductor dopant into the semiconductor body such that the primary n-type dopant reaches a maximum concentration below the location for the channel surface depletion region of the p-type SCIGFET but no more than 0.4 µm deep into the semiconductor body.

26. A method as in claim 25 further including prior to defining the lateral shapes for the gate electrodes of the two SCIGFETs:
    selectively introducing a pair of additional p-type semiconductor dopants into the semiconductor body such that the additional p-type dopants respectively reach maximum concentrations at vertically separated locations deeper into the semiconductor body than where the primary p-type dopant reaches its maximum concentration; and
    selectively introducing a pair of additional n-type semiconductor dopants into the semiconductor body such that the additional n-type dopants respectively reach maximum concentrations at vertically separated locations deeper into the semiconductor body than where the primary n-type dopant reaches its maximum concentration.

27. A method as in claim 6 further including, prior to defining a lateral shape for the gate electrode of the n-channel CJIGFET, introducing primary p-type semiconductor dopant into the semiconductor body such that the primary p-type dopant reaches a maximum concentration below the channel zone of the n-channel CJIGFET but no more than 0.6 µm deep into the semiconductor body.

28. A method as in claim 27 further including, prior to defining the lateral shape for the gate electrode of the n-channel CJIGFET, introducing a pair of additional p-type semiconductor dopants into the semiconductor body such that the additional p-type dopants respectively reach maximum concentrations at vertically separated locations deeper into the semiconductor body than where the primary p-type dopant reaches its maximum concentration.

29. A method as in claim 6 wherein, subsequent to defining the gate electrodes for the two SCIGFETs, the semiconductor body has a major surface along which the channel zones for the two SCIGFETs extend, the method including further including subsequent to defining lateral shapes for the gate electrodes of the two SCIGFETs:
introducing further p-type semiconductor dopant into at least the location for the p-type channel zone of the n-channel SCIGFET such that the further p-type dopant reaches a local minimum surface concentration along the semiconductor body's major surface at a location between the n-channel SCIGFET's source/drain zones; and
introducing further n-type semiconductor dopant into at least the location for the n-type channel zone of the p-channel SCIGFET such that the further n-type dopant reaches a local minimum surface concentration along the semiconductor body's major surface at a location between the p-channel SCIGFET's source/drain zones.

30. A method as in claim 29 wherein the act of introducing each further dopant comprises implanting ions of a species of that dopant at a tilt angle of at least 15° relative to a direction generally perpendicular to the semiconductor body's major surface.

31. A method as in claim 6 wherein part of the gate dielectric material constitutes a gate dielectric layer for a normally off p-channel further insulated-gate field-effect transistor ("IGFET"), the method further including:
defining a gate electrode for the p-channel further IGFET over its gate dielectric layer; and
selectively introducing source/drain-defining p-type semiconductor dopant into n-type material of the semiconductor body to form, for the p-channel further IGFET, a pair of laterally separated surface-adjoining p-type source/drain zones between which a surface-adjoining channel zone extends along the gate dielectric layer for the p-channel further IGFET such that its gate electrode overlies its channel zone, partially overlies its source/drain zones, and is separated from its source/drain and channel zones by at least its gate dielectric layer.

32. A method as in claim 31 wherein the acts of defining the gate electrodes comprise:
substantially simultaneously depositing material for the gate electrodes of the n-channel CJIGFET and the p-channel further IGFET in a first operation; and
substantially simultaneously depositing material for the gate electrodes of the two SCIGFETS in a second operation separate from the first operation.

33. A method as in claim 31 wherein the n-channel CJIGFET and the p-channel further IGFET are each formed at greater channel length than each SCIGFET.

34. A method as in claim 31 wherein the channel zone of the p-channel further IGFET is n-type such that the p-channel further IGFET is formed as a surface-channel IGFET.

35. A method as in claim 34 wherein:
the gate electrode of the n-channel SCIGFET comprises n-type semiconductor material; and
the gate electrodes of the p-channel SCIGFET, the n-channel CJIGFET, and the p-channel further IGFET comprise p-type semiconductor material.

36. A method as in claim 31 further including selectively introducing channel-zone-defining p-type semiconductor dopant into the semiconductor body to define a p-type region that includes a p-type channel zone for the p-channel further IGFET such that (a) the channel zone of the p-channel further IGFET is more lightly doped than its source/drain zones and (b) the p-channel further IGFET is formed as a channel-junction IGFET.

37. A method as in claim 36 wherein:
the gate electrodes of the n-channel SCIGFET and the p-channel further IGFET comprise n-type semiconductor material; and
the gate electrodes of the p-channel SCIGFET and the n-channel CJIGFET comprise p-type semiconductor material.

38. A method as in claim 36 wherein the gate electrodes of the n-channel CJIGFET and the p-channel further IGFET are respectively made p-type and n-type prior to forming their source/drain zones.

39. A method comprising:
selectively introducing channel-zone-defining n-type semiconductor dopant into a semiconductor body to define an n-type region that includes a surface-adjoining n-type channel zone for a normally off n-channel channel-junction insulated-gate field-effect transistor ("CJIGFET");
providing the semiconductor body with gate dielectric material having parts that respectively substantially constitute (a) a gate dielectric layer for an n-channel surface-channel insulated-gate field-effect transistor ("SCIGFET") and (b) a gate dielectric layer for the n-channel CJIGFET along its channel zone such that the gate dielectric layer of the n-channel CJIGFET is materially thicker than the gate dielectric layer of the n-channel SCIGFET;
defining (a) a gate electrode for the n-channel SCIGFET over its gate dielectric layer and (b) a gate electrode for the n-channel CJIGFET over its gate dielectric layer; and
selectively introducing (a) source/drain-defining n-type semiconductor dopant into p-type material of the semiconductor body to define, for the n-channel SCIGFET, a pair of laterally separated surface-adjoining n-type source/drain zones between which a surface-adjoining p-type channel zone extends along the gate dielectric layer for the n-channel SCIGFET such that its gate dielectric layer overlies its channel zone, partially overlies its source/drain zones, and is separated from its source/drain and channel zones by at least its gate dielectric layer and (b) source/drain-defining n-type semiconductor dopant into the semiconductor body to define, for the n-channel CJIGFET, a pair of laterally separated surface-adjoining n-type source/drain zones between which the n-type channel zone for the n-channel CJIGFET extends such that its gate electrode overlies its channel zone, partially overlies its source/drain zones, and is separated from its source/drain and channel zones by at least its gate dielectric layer and such that the channel zone of the n-channel CJIGFET is more lightly doped than its source/drain zones.

40. A method as in claim 39 wherein:
the gate electrode of the n-channel SCIGFET comprises n-type semiconductor material; and
the gate electrode of the n-channel CJIGFET comprises p-type semiconductor material.

41. A method as in claim 39 further including operating the n-channel CJIGFET across a materially greater voltage range than the n-channel SCIGFET.

42. A method as in claim 39 wherein part of the gate dielectric material constitutes a gate dielectric layer for a p-channel SCIGFET, the method further including:
- defining a gate electrode for the p-channel SCIGFET over its dielectric layer; and
- selectively introducing source/drain-defining p-type semiconductor dopant into n-type material of the semiconductor body to define, for the p-channel SCIGFET, a pair of laterally separated surface-adjoining p-type source/drain zones between which a surface-adjoining n-type channel zone extends along the gate dielectric layer for the p-channel SCIGFET such that its gate electrode overlies its channel zone, partially overlies its source/drain zones, and is separated from its source/drain zones by at least its gate dielectric layer.

43. A method as in claim 42 wherein:
- the gate electrode of the n-channel SCIGFET comprises n-type semiconductor material; and
- the gate electrodes of the p-channel SCIGFET and the n-channel CJIGFET comprise p-type semiconductor material.

44. A method as in claim 42 wherein the gate dielectric layer of the n-channel CJIGFET is also materially thicker than the gate dielectric layer of the p-channel SCIGFET.

45. A method as in claim 44 wherein the gate dielectric layers of the two SCIGFETs are of approximately equal thickness.

46. A method as in claim 44 further including operating the n-channel CJIGFET across a materially greater voltage range than the two SCIGFETs.

47. A method as in claim 42 wherein part of the gate dielectric material constitutes a gate dielectric layer for a normally off p-channel further insulated-gate field-effect transistor ("IGFET"), the method further including:
- defining a gate electrode for the p-channel further IGFET over its gate dielectric layer; and
- selectively introducing source/drain-defining p-type semiconductor dopant into n-type material of the semiconductor body to form, for the p-channel further IGFET, a pair of laterally separated surface-adjoining p-type source/drain zones between which a surface-adjoining channel zone extends along the gate dielectric layer for the p-channel further IGFET such that its gate electrode overlies its channel zone, partially overlies its source/drain zones, and is separated from its source/drain and channel zones by at least its gate dielectric layer.

48. A method as in claim 47 wherein the channel zone of the p-channel further IGFET is n-type such that the p-channel further IGFET is formed as a surface-channel IGFET.

49. A method as in claim 48 wherein:
- the gate electrode of the n-channel SCIGFET comprises n-type semiconductor material; and
- the gate electrodes of the p-channel SCIGFET, the n-channel CJIGFET, and the p-channel further IGFET comprise p-type semiconductor material.

50. A method as in claim 47 further including selectively introducing channel-zone-defining p-type semiconductor dopant into the semiconductor body to define a p-type region that includes a p-type channel zone for the p-channel further IGFET such that (a) the channel zone of the p-channel further IGFET is more lightly doped than its source/drain zones and (b) the p-channel further IGFET is formed as a channel-junction IGFET.

51. A method as in claim 50 wherein:
- the gate electrodes of the n-channel SCIGFET and the p-channel further IGFET comprise n-type semiconductor material; and
- the gate electrodes of the p-channel SCIGFET and the n-channel CJIGFET comprise p-type semiconductor material.

52. A method as in claim 47 wherein:
- the gate dielectric layer of the n-channel CJIGFET is also materially thicker than the gate dielectric layer of the p-channel SCIGFET; and
- the gate dielectric layer of the further p-channel IGFET is materially thicker than the gate dielectric layers of the two SCIGFETs.

53. A method as in claim 52 wherein:
- the gate dielectric layers of the two SCIGFETs are of approximately equal thickness; and
- the gate dielectric layers of the n-channel CJIGFET and the p-channel further IGFET are of approximately equal thickness.

54. A method as in claim 52 further including operating the n-channel CJIGFET and the p-channel further IGFET across a materially greater voltage range than the two SCIGFETs.

55. A method as in claim 39 wherein each gate dielectric layer extends from the overlying gate electrode to the semiconductor body along largely all lateral area of that gate electrode.

56. A method as in claim 39 wherein the gate electrode of the n-channel CJIGFET is made p-type prior to defining its source/drain zones.

57. A method as in claim 4 wherein the gate-dielectric-material-providing act comprises:
- forming a first dielectric layer along the semiconductor body at least along the lateral locations for the two gate dielectric layers;
- removing largely all the material of the first dielectric layer generally along the lateral location for the gate dielectric layer of the n-channel SCIGFET; and
- forming a second dielectric layer along the semiconductor body at least along the lateral location for the gate dielectric layer of the n-channel SCIGFET such that (a) the gate dielectric layers of the n-channel SCIGFET comprises a portion of the second dielectric layer and (b) the gate dielectric layer of the n-channel CJIGFET comprises a portion of remaining material of the first dielectric layer.

58. A method as in claim 57 wherein the first dielectric layer is materially thicker than the second dielectric layer.

59. A method as in claim 57 wherein the gate-electrode-defining acts comprise:
- depositing, subsequent to forming the second dielectric layer, a semiconductor layer over the second dielectric layer and the remaining material of the first dielectric layer; and
- patterning the semiconductor layer and doping it selectively with n-type and p-type semiconductor dopants to define the two gate electrodes such that (a) the gate electrode of the n-channel SCIGFET comprises n-type material of the semiconductor layer and (b) the gate electrode of the n-channel CJIGFET comprises p-type material of the semiconductor layer.

60. A method as in claim 4 wherein the gate-dielectric-material-providing and gate-electrode-defining acts comprise:
- forming a first dielectric layer along the semiconductor body at least along the lateral locations for the two gate dielectric layers;
- depositing a first semiconductor layer over the first dielectric layer;

removing largely all the material of the first semiconductor layer and the first dielectric layer generally along the lateral location for the gate dielectric layer of the n-channel SCIGFET;

forming a second dielectric layer along the semiconductor body at least along the lateral location for the gate dielectric layer of the n-channel SCIGFET such that (a) the gate dielectric layer of the n-channel SCIGFET comprises a portion of the second dielectric layer and (b) the gate dielectric layer of the n-channel CJIGFET comprises a portion of remaining material of the first dielectric layer;

depositing a second semiconductor layer over at least the second dielectric layer; and patterning the two semiconductor layers and doping them selectively with n-type and p-type semiconductor dopants to define the two gate electrodes such that (a) the gate electrode of the n-channel SCIGFET comprises n-type material of the second semiconductor layer and (b) the gate electrode of the n-channel CJIGFET comprises p-type material of the first semiconductor layer.

61. A method as in claim 60 wherein the first dielectric layer is materially thicker than the second dielectric layer.

62. A method as in claim 4 further including operating the n-channel CJIGFET across a materially greater voltage range than the n-channel SCIGFET.

63. A method as in claim 6 wherein the gate-dielectric-material-providing and gate-electrode-defining acts are performed such that the gate dielectric layer of the p-channel SCIGFET extends from its gate electrode to the semiconductor body along largely all lateral area of that gate electrode.

64. A method as in claim 10 further including operating the n-channel CJIGFET across a materially greater voltage range than the two SCIGFETs.

65. A method as in claim 31 wherein the gate-dielectric-material-providing and gate-electrode-defining acts are performed such that the gate dielectric layer of each of the p-channel SCIGFET and the p-channel further IGFET extends from its gate electrode to the semiconductor body along largely all lateral area of that gate electrode.

66. A method as in claim 31 further including operating the n-channel CJIGFET and the p-channel further IGFET across a materially greater voltage range than the two SCIGFETs.

* * * * *